United States Patent
Little

(10) Patent No.: US 10,651,606 B2
(45) Date of Patent: May 12, 2020

(54) RECEPTACLE CONNECTOR EQUIPPED WITH CABLE INSTEAD OF MOUNTING TO PCB

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Terrance F. Little, Fullerton, CA (US)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/240,800

(22) Filed: Jan. 7, 2019

(65) Prior Publication Data

US 2019/0181593 A1     Jun. 13, 2019

Related U.S. Application Data

(63) Continuation-in-part of application No. 16/186,487, filed on Nov. 10, 2018.
(Continued)

(51) Int. Cl.
| | |
|---|---|
| H01R 13/648 | (2006.01) |
| H01R 13/6587 | (2011.01) |
| H01R 13/6471 | (2011.01) |
| H05K 1/02 | (2006.01) |
| H01R 13/6593 | (2011.01) |
| H01R 13/6585 | (2011.01) |

(52) U.S. Cl.
CPC ..... *H01R 13/6587* (2013.01); *H01R 13/6471* (2013.01); *H01R 13/6593* (2013.01); *H05K 1/0243* (2013.01); *H01R 13/6585* (2013.01); *H05K 2201/10189* (2013.01); *H05K 2201/10356* (2013.01)

(58) Field of Classification Search
CPC ........... H01R 13/6587; H01R 13/6593; H01R 13/6471; H01R 13/6585; H05K 1/0243; H05K 2201/10189; H05K 2201/10356
USPC ...................... 439/676, 607.07, 607.35, 660
See application file for complete search history.

(56) References Cited

U.S. PATENT DOCUMENTS

| | | | |
|---|---|---|---|
| 7,744,416 B2 | 6/2010 | Hon Hai | |
| 8,845,364 B2 | 9/2014 | Molex | |

(Continued)

*Primary Examiner* — Abdullah A Riyami
*Assistant Examiner* — Nelson R. Burgos-Guntin
(74) *Attorney, Agent, or Firm* — Wei Te Chung; Ming Chieh Chang

(57) ABSTRACT

A QSFP-DD receptacle connector received within a cage includes an insulative housing and a contact module assembly received within the housing. The contact module includes a plurality of horizontal wafers stacked with one another, and each wafer includes an insulator and a plurality of contacts integrally formed therein wherein each contact has a front contact sections extending forwardly into a mating cavity formed in the housing, and a rear connecting section connected to a cable rather than to the printed circuit board. The receptacle connector associated with a cable is attached to a chassis. The cage optionally forms therein two mating spaces respectively receiving two receptacle connectors with the associated cables extending rearwardly.

20 Claims, 58 Drawing Sheets

Related U.S. Application Data

(60) Provisional application No. 62/614,366, filed on Jan. 6, 2018, provisional application No. 62/584,751, filed on Nov. 11, 2017.

(56) References Cited

U.S. PATENT DOCUMENTS

| | | | |
|---|---|---|---|
| 9,011,177 B2 | 4/2015 | Molex | |
| 9,531,130 B1 * | 12/2016 | Phillips | H01R 13/6471 |
| 9,553,381 B2 | 1/2017 | Molex | |
| 9,590,366 B1 | 3/2017 | Tyco | |
| 9,705,258 B2 | 7/2017 | Te | |
| 10,084,262 B2 * | 9/2018 | Kelly | H01R 24/60 |
| 2009/0130913 A1 * | 5/2009 | Yi | H01R 12/725 |
| | | | 439/676 |
| 2012/0034820 A1 * | 2/2012 | Lang | H01R 13/65802 |
| | | | 439/660 |
| 2013/0065454 A1 * | 3/2013 | Milbrand, Jr. | H01R 12/724 |
| | | | 439/676 |
| 2013/0171885 A1 * | 7/2013 | Zhang | H01R 13/6471 |
| | | | 439/676 |
| 2016/0013596 A1 * | 1/2016 | Regnier | H01R 13/6594 |
| | | | 439/607.35 |
| 2016/0043508 A1 * | 2/2016 | Helster | H01R 13/6467 |
| | | | 439/607.07 |
| 2016/0218455 A1 | 7/2016 | Samtec | |
| 2017/0077643 A1 | 3/2017 | Samtec | |
| 2018/0006416 A1 | 1/2018 | Molex | |
| 2018/0034175 A1 | 2/2018 | Molex | |
| 2019/0181593 A1 * | 6/2019 | Little | H01R 13/6587 |
| 2019/0293884 A1 * | 9/2019 | Little | G02B 6/43 |

* cited by examiner

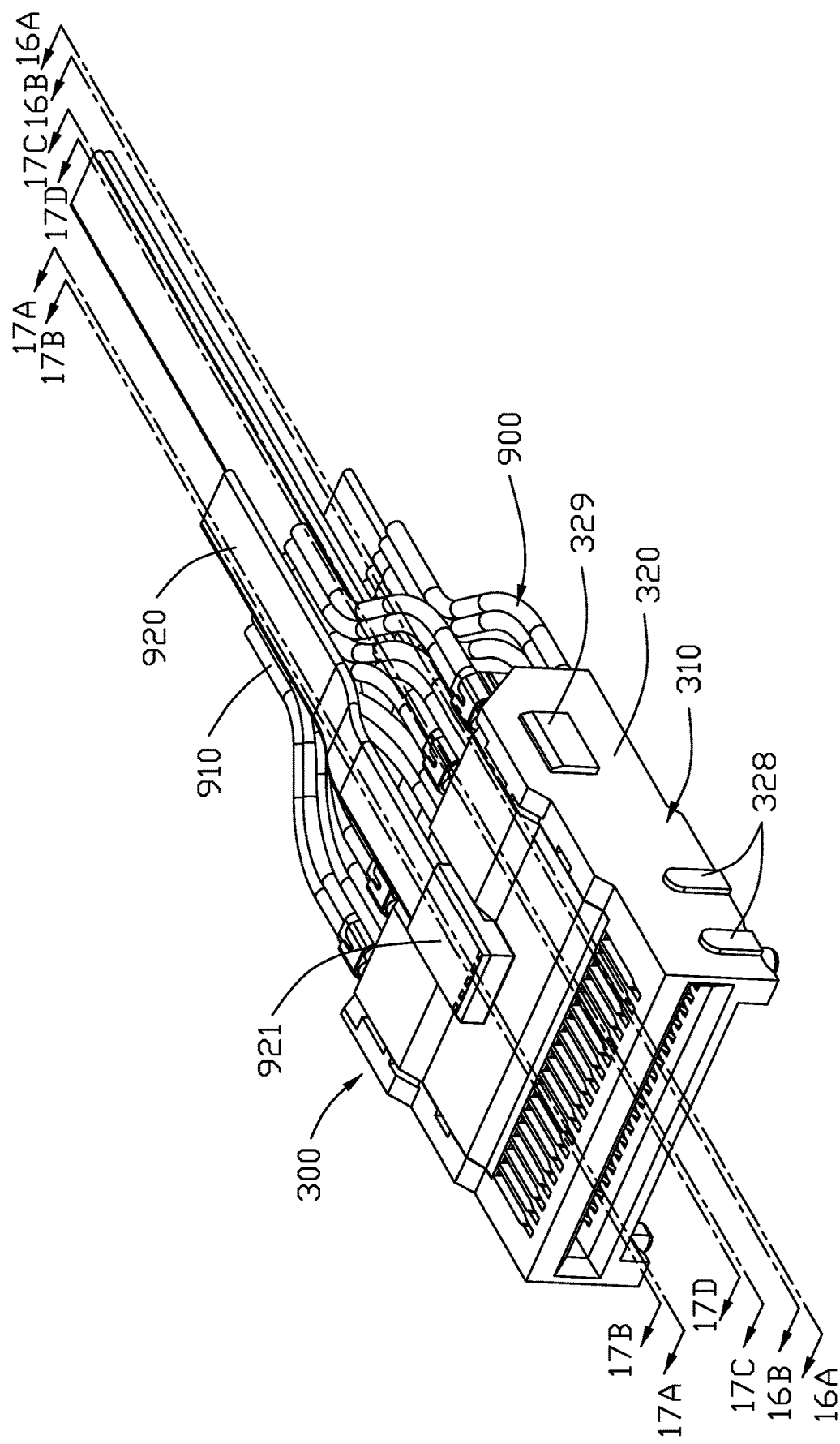

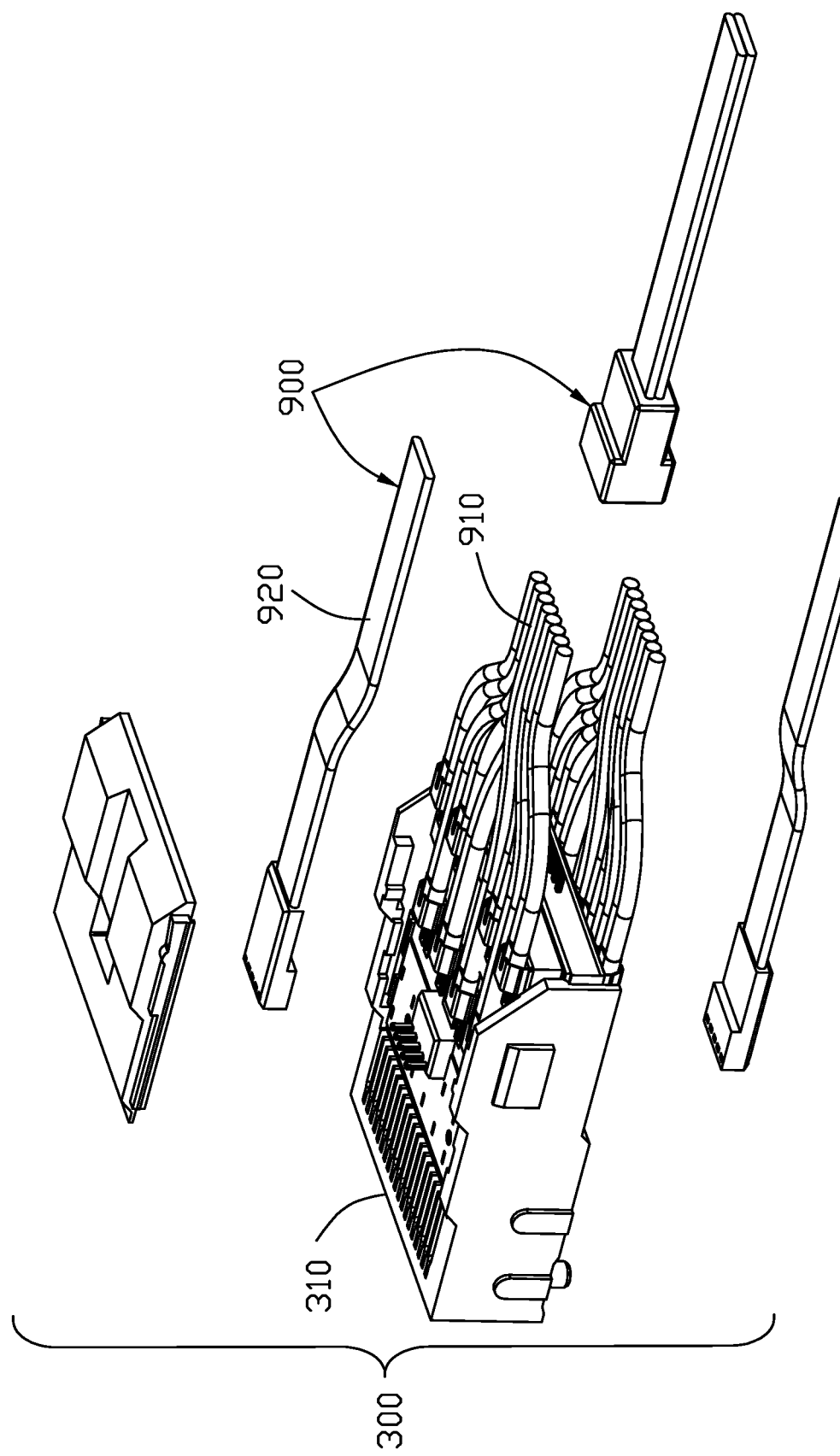

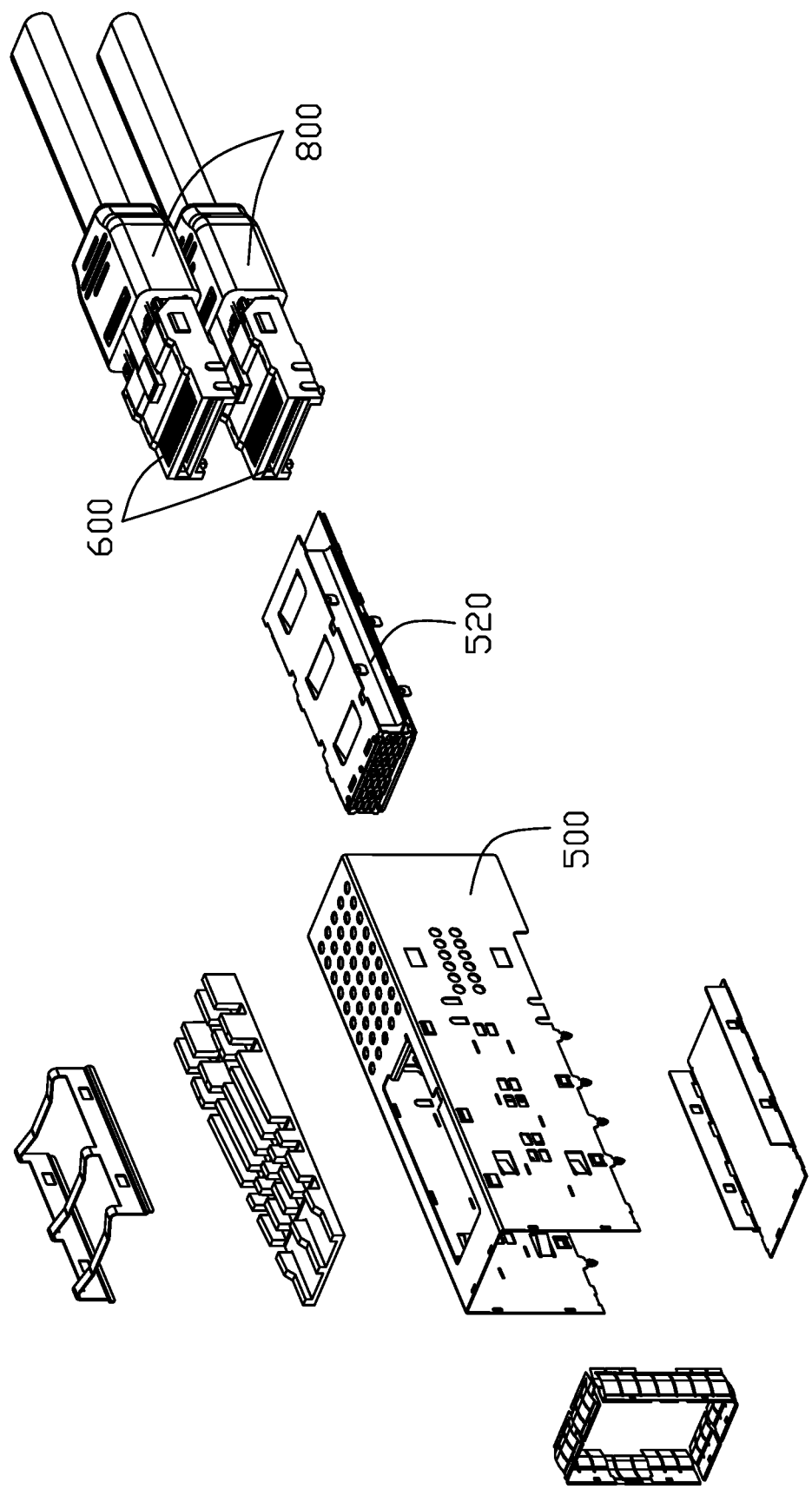

US 10,651,606 B2

RECEPTACLE CONNECTOR EQUIPPED WITH CABLE INSTEAD OF MOUNTING TO PCB

BACKGROUND OF THE INVENTION

1. Field of the Invention

The present invention relates to an electrical connector assembly, especially to the electrical connection with the external pluggable module via a dual-sided receptacle connector or a directly attached receptacle connector linked to an adaptor cable assembly by following the spirit of the previous designs of which the provisional applications have corresponding Ser. Nos. 62/367,098 filed on Jul. 26, 2016, 62/399,272 filed on Sep. 23, 2016, 62/412,841 filed on Oct. 26, 2016, 62/425,627 filed on Nov. 23, 2016, 62/449,133 filed on Jan. 23, 2017, 62/509,141 filed on May 21, 2017, 62/522,113 filed on Jun. 20, 2017, 62/533,131 filed on Jul. 17, 2017, and 62/584,751 filed on Nov. 11, 2017.

2. Description of Related Art

The traditional design used for connecting two subsystems is mad through a QSFP (Quad Small Form-factor Pluggable) receptacle connector located in a cage and mounted upon a printed circuit board. Anyhow, several disadvantages exist for the traditional design. Firstly, most receptacle connectors are of the horizontal right angle type, making it difficult to fine tune for signal integrity. Secondly, most of them are of surface mounting type with the problems of coplanarity of the tails of all seventy-six contacts. Thirdly, for the stack type receptacle connectors, there are one hundred fifty-two contacts with the corresponding through holes. The manufacturing of such densely arranged through holes in the printed circuit board is another challenge. Fourthly, in the stacked receptacle connectors, the heat dissipation for the lower level receptacle connector is another problem because the contacts of both the upper level connector and those of the lower level connector are required to extend downwardly toward the printed circuit board on which the lower level connector is mounted, and the cooling air essentially has less capability of passing therethrough along the front-to-back direction.

Therefore, a new arrangement for the QSFP connection with relatively easy manufacturability and superior heat dissipation effect is desired.

SUMMARY OF THE INVENTION

To achieve the above-mentioned object, a QSFP-DD receptacle connector received within a cage, includes an insulative housing and a contact module assembly received within the housing. The contact module includes a plurality of horizontal wafers stacked with one another, and each wafer includes an insulator and a plurality of contacts integrally formed therein wherein each contact has a front contact sections extending forwardly into a mating cavity formed in the housing, and a rear connecting section connected to a cable rather than to the printed circuit board. The receptacle connector associated with a cable, is attached to a metallic cage which is attached to a rail in a chassis. The cage optionally forms therein two mating spaces respectively receiving two receptacle connectors with the associated cables extending rearwardly.

The contact module includes an upper subassembly and a lower subassembly stacked with each other in a mirror image arrangement oppositely. Each of the upper subassembly and the lower subassembly includes a front wafer and a rear wafer stacked together. Each of the front wafer and the rear wafer includes an insulator and a plurality of contacts integrally formed therein. A grounding plate is associated with the corresponding wafer for electrically integrally connecting all the grounding contacts thereof. The contacts include a plurality of low speed signal contacts at a center region, a plurality of differential pair signal contacts and a plurality of grounding contacts alternately arrange with each other by two sides of said low speed signal contacts in a transverse direction. All grounding contacts unitarily extend from a common grounding bar on which the outer braiding of each differential pair wires regulated and associated with a common grounding bracket is attached. The contacting section of the differential pair signal contacts of the front wafer are located in front of those of the rear wafer and both are aligned with each other in the front-to-back direction. The connecting sections of the differential pair signal contacts of the front wafer are located in front of those of the rear wafer while arranged in an offset manner in the transverse direction for allowing the corresponding differential pair wires connected with the connecting sections of the differential pair signal contacts of the front wafer to extend through the space between the two neighboring differential pair signal contacts without interference.

Other objects, advantages and novel features of the invention will become more apparent from the following detailed description when taken in conjunction with the accompanying drawings.

BRIEF DESCRIPTION OF THE DRAWINGS

FIG. 7(A) is a perspective view of the receptacle connector with the associated wires of the cable of FIG. 4(A) wherein the outer insulator of the cable is removed;

FIG. 9(A) is a further exploded perspective view of the receptacle connector with the associated wires of the cable of FIG. 7(A) wherein the low speed signal wires are separated from the receptacle connector;

FIG. 30(A) is an exploded perspective view of the dual-port electrical system associated with the two cables of FIG. 26(A)

Figure 1A:
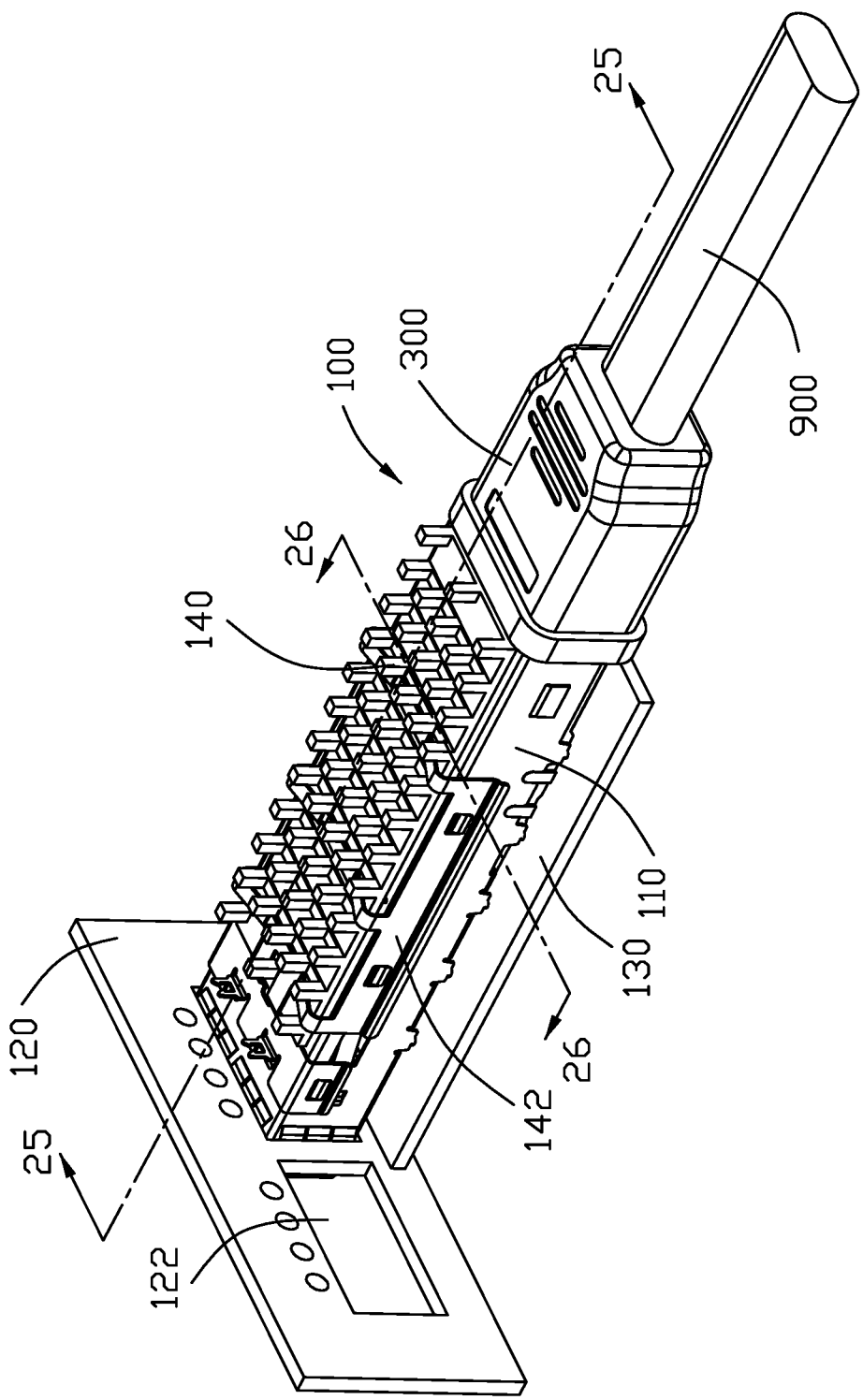
FIG. 1(A) is a perspective view of an electrical system according to the invention.
Figure 1B:
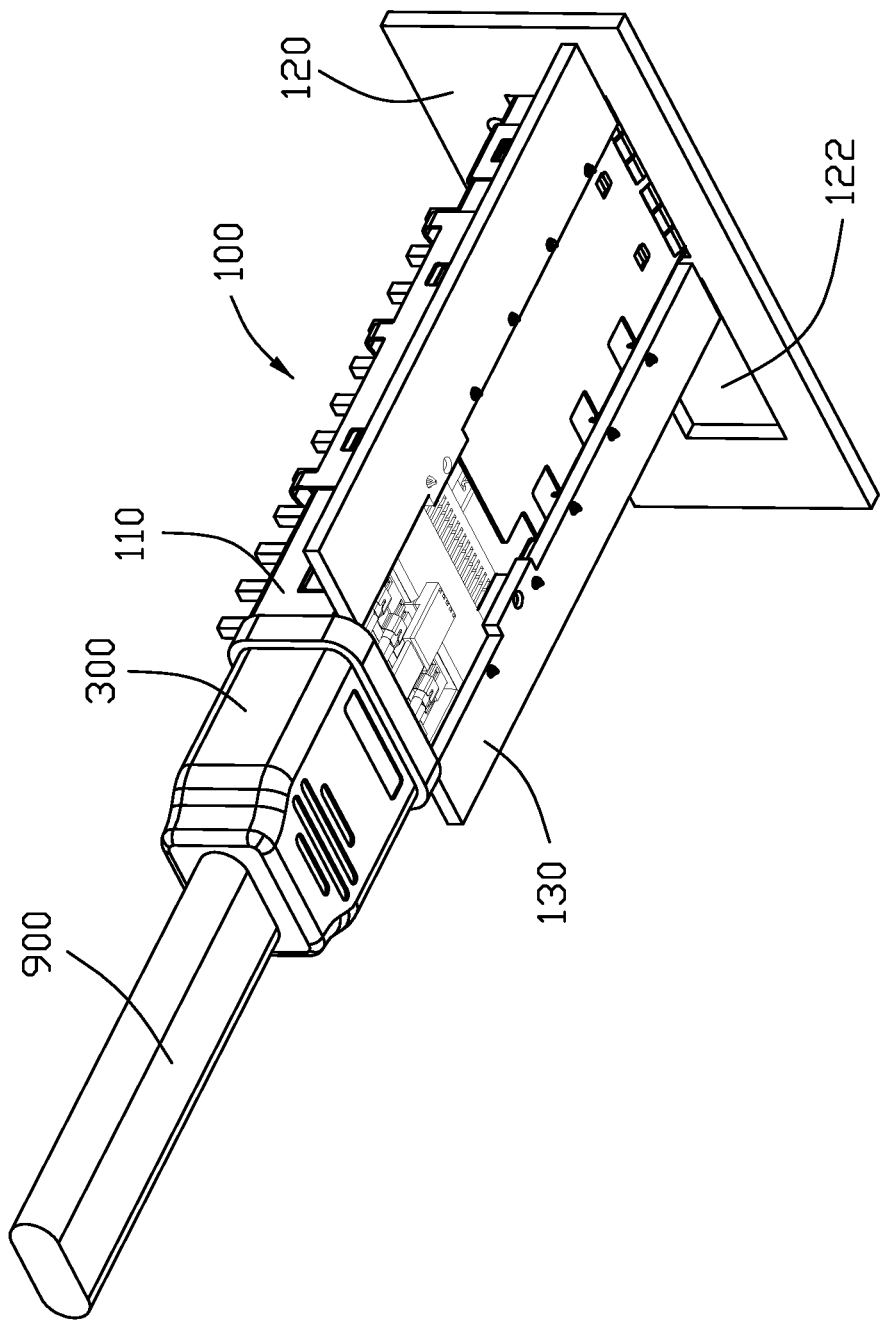
FIG. 1(B) is another perspective view of an electrical system of FIG. 1(A)
Figure 2A:
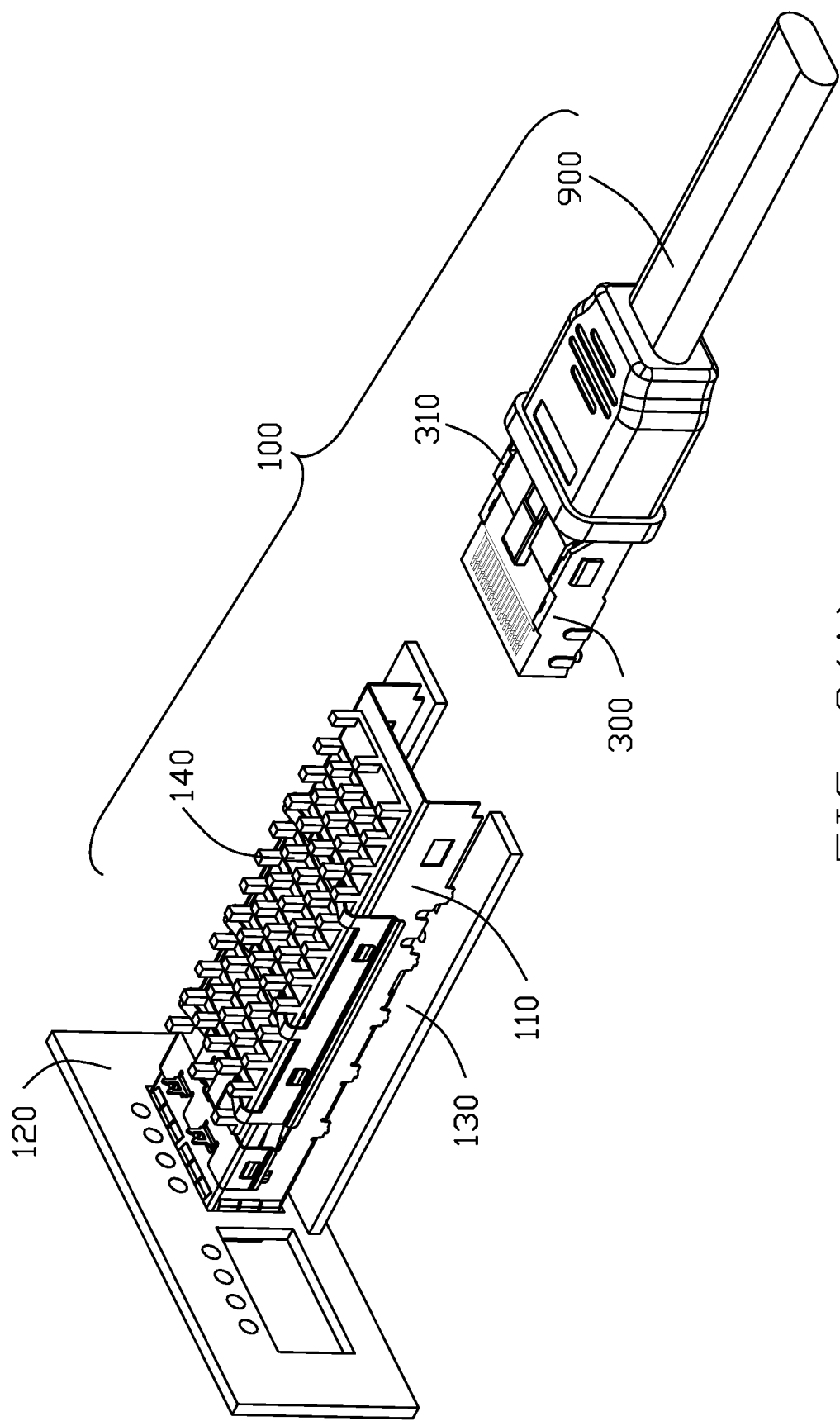
FIG. 2(A) is an exploded perspective view of the electrical system of FIG. 1(A)
Figure 2B:
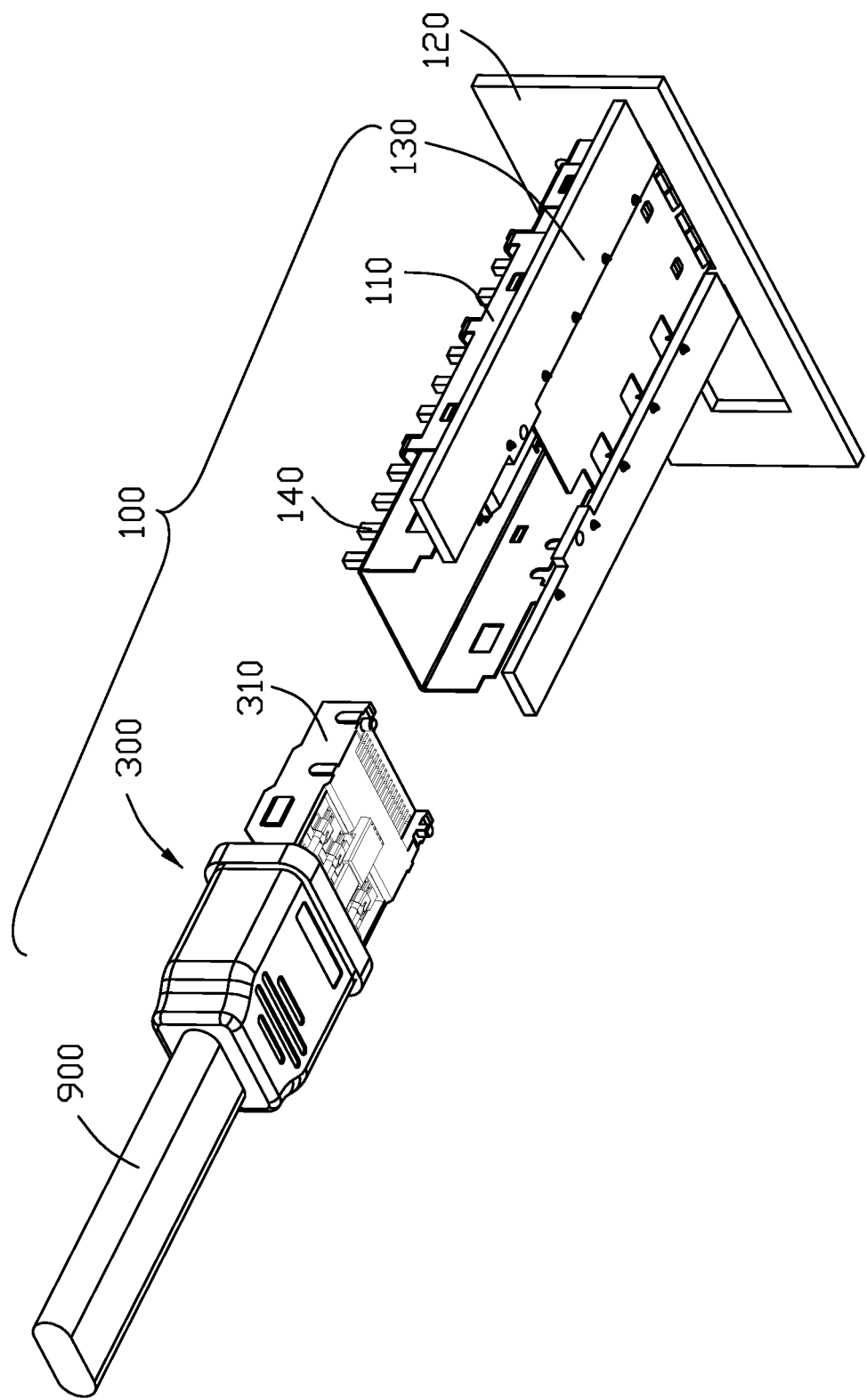
FIG. 2(B) is an exploded perspective view of the electrical system of FIG. 1(B)
Figure 3:
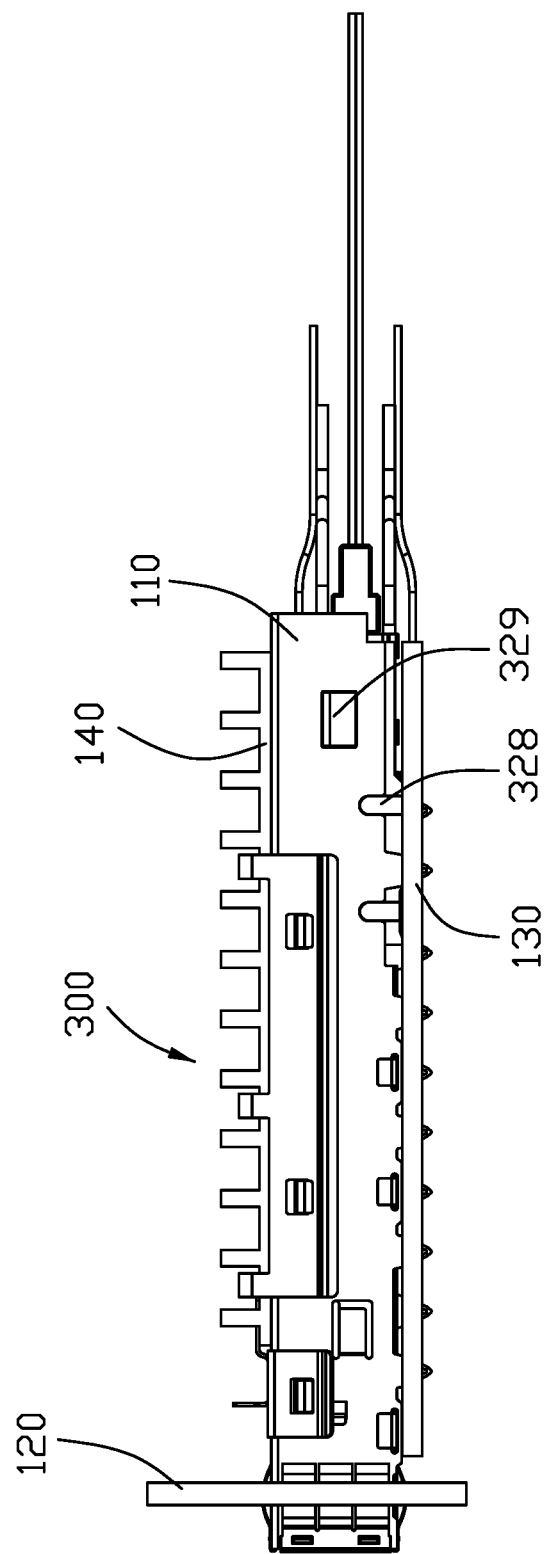
FIG. 3 is a side view of a receptacle connector assembly of the electrical system of FIG. 1(A)
Figure 4:
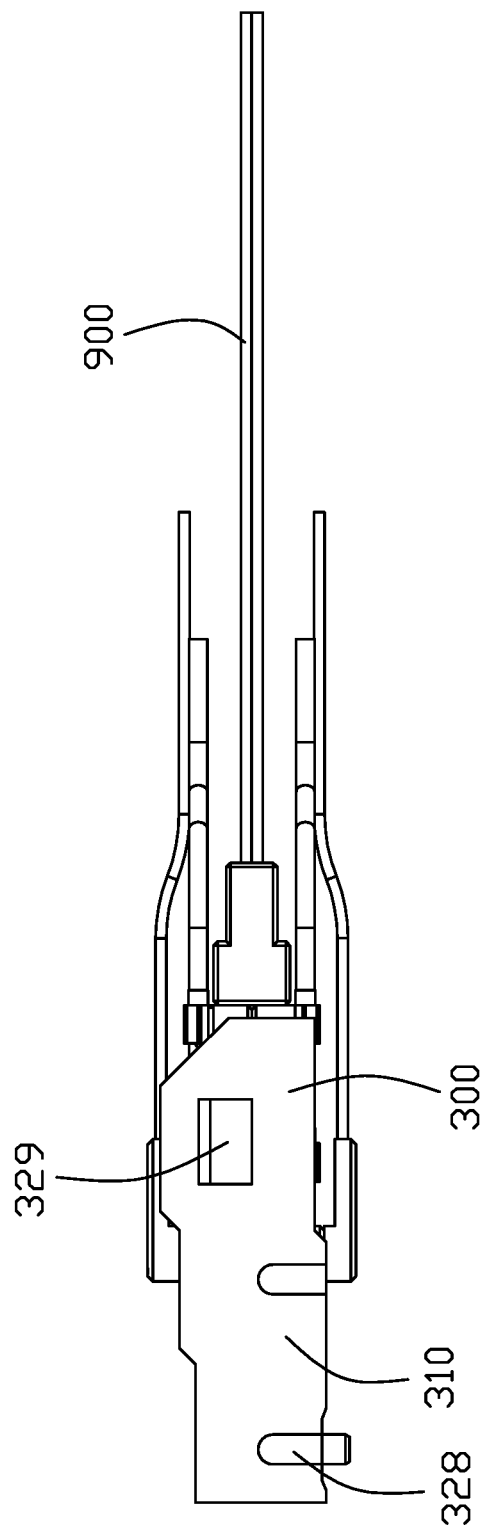
FIG. 4 is a side view of the receptacle connector assembly of the electrical system of FIG. 3 without the cage.
Figure 5:
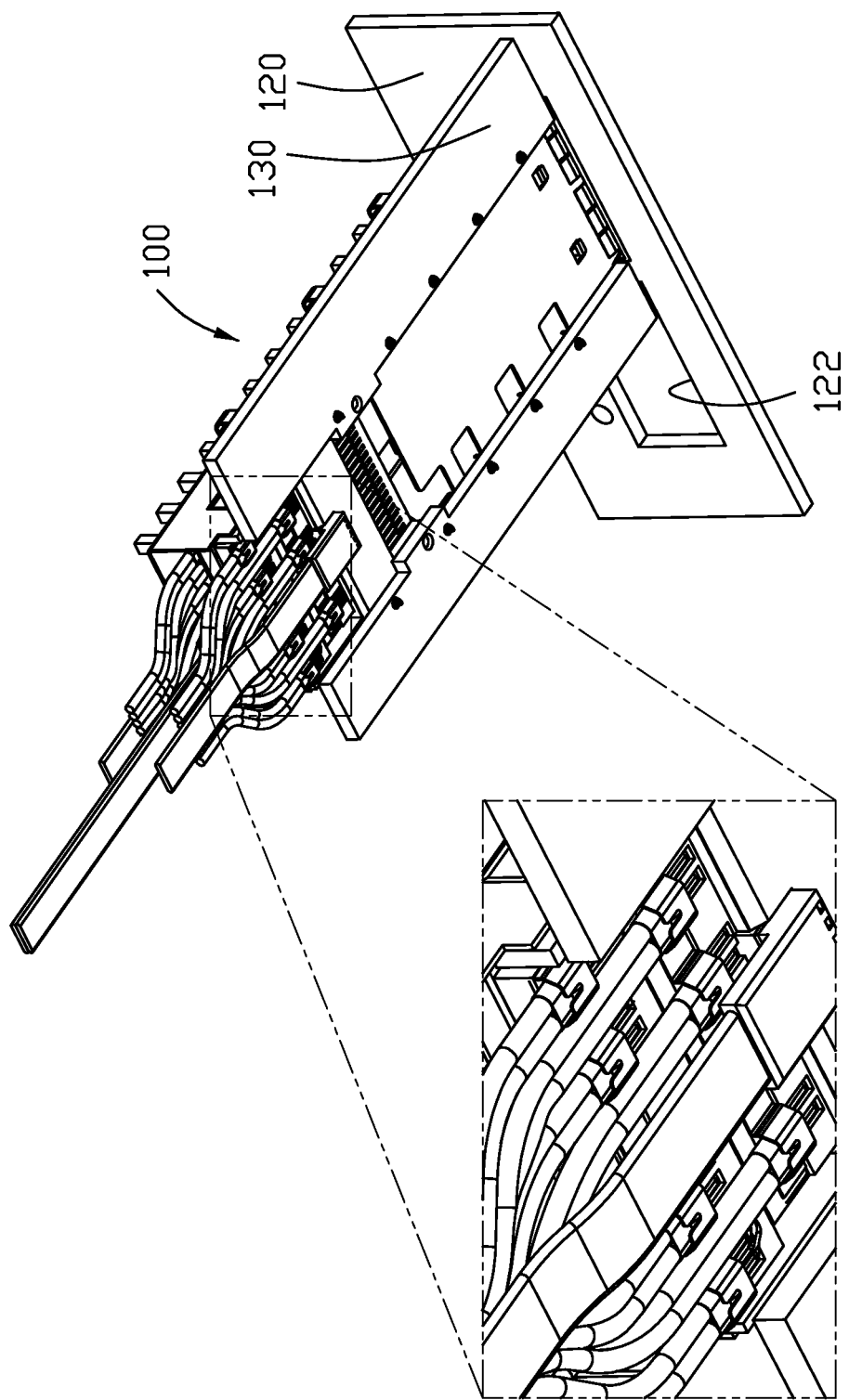
FIG. 5 is a perspective view of the electrical system of FIG. 1(B) with removal of a portion of a cable to show how the receptacle connector assembly is disposed in the metallic cage.
Figure 6A:
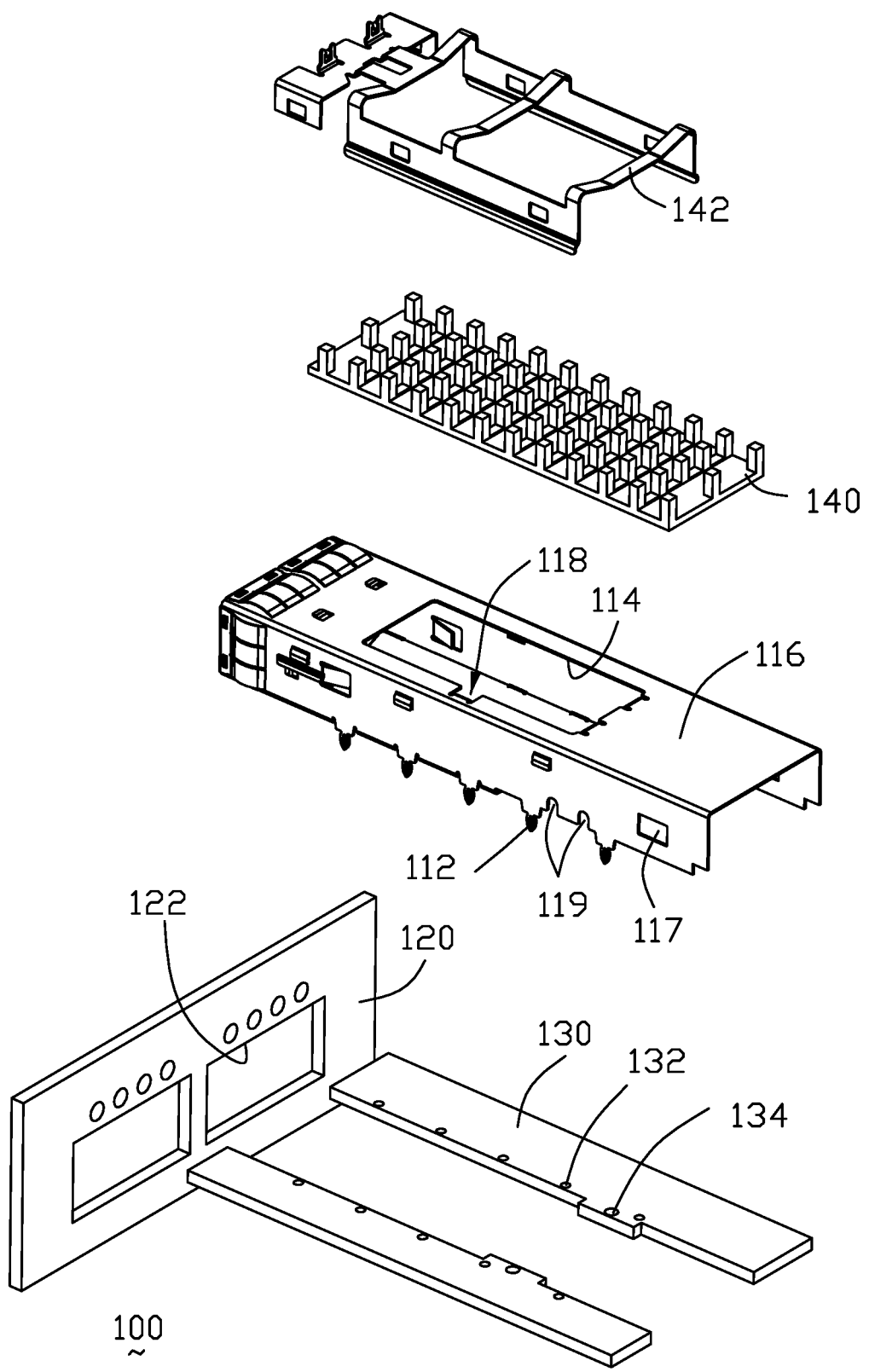
FIG. 6(A) is an exploded perspective view of the chassis and the metallic cage of the electrical system of FIG. 1(A)
Figure 6B:
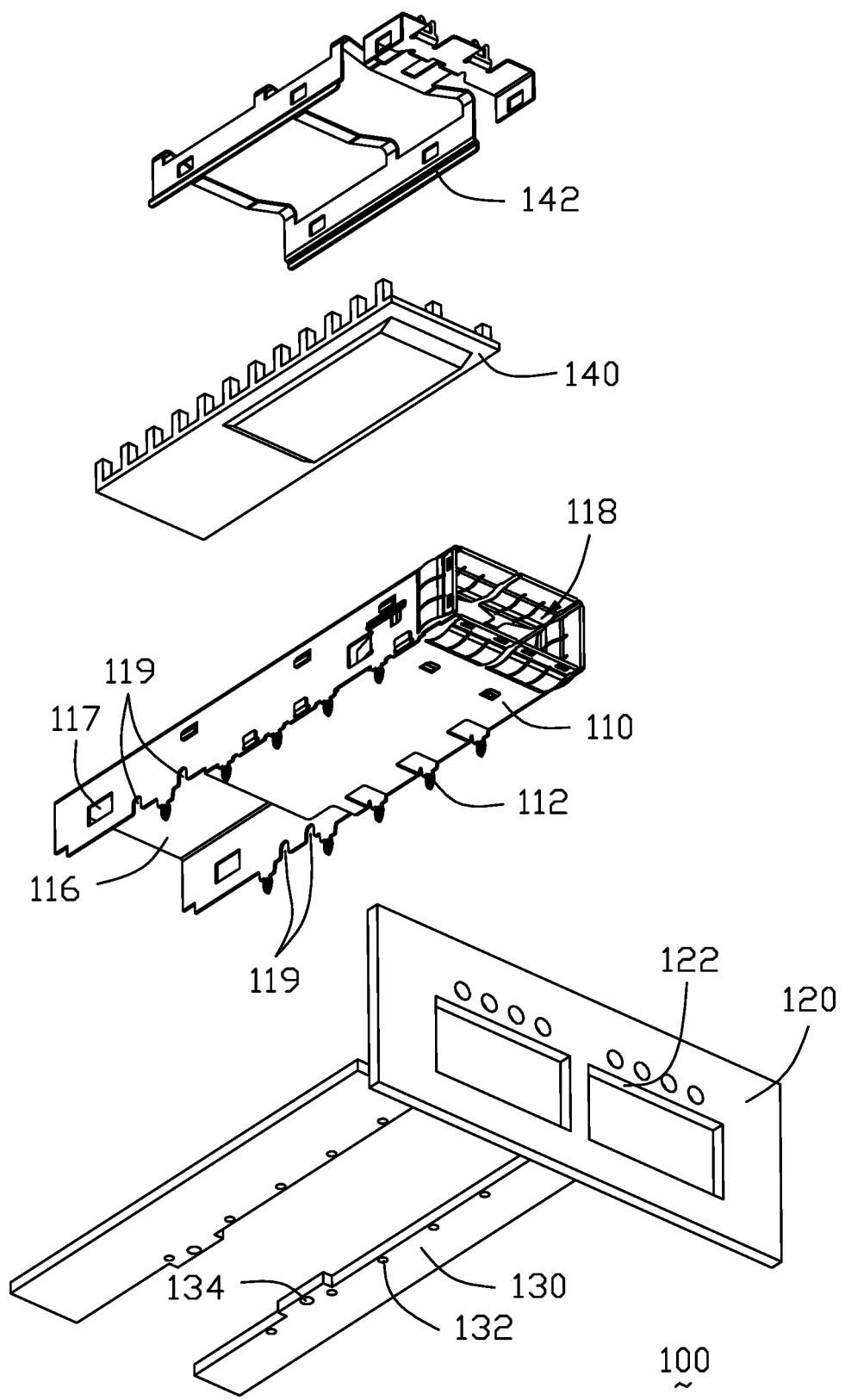
FIG. 6(B) is another exploded perspective view of the chassis and the metallic cage of the electrical system of FIG. 6(A)
Figure 7B:
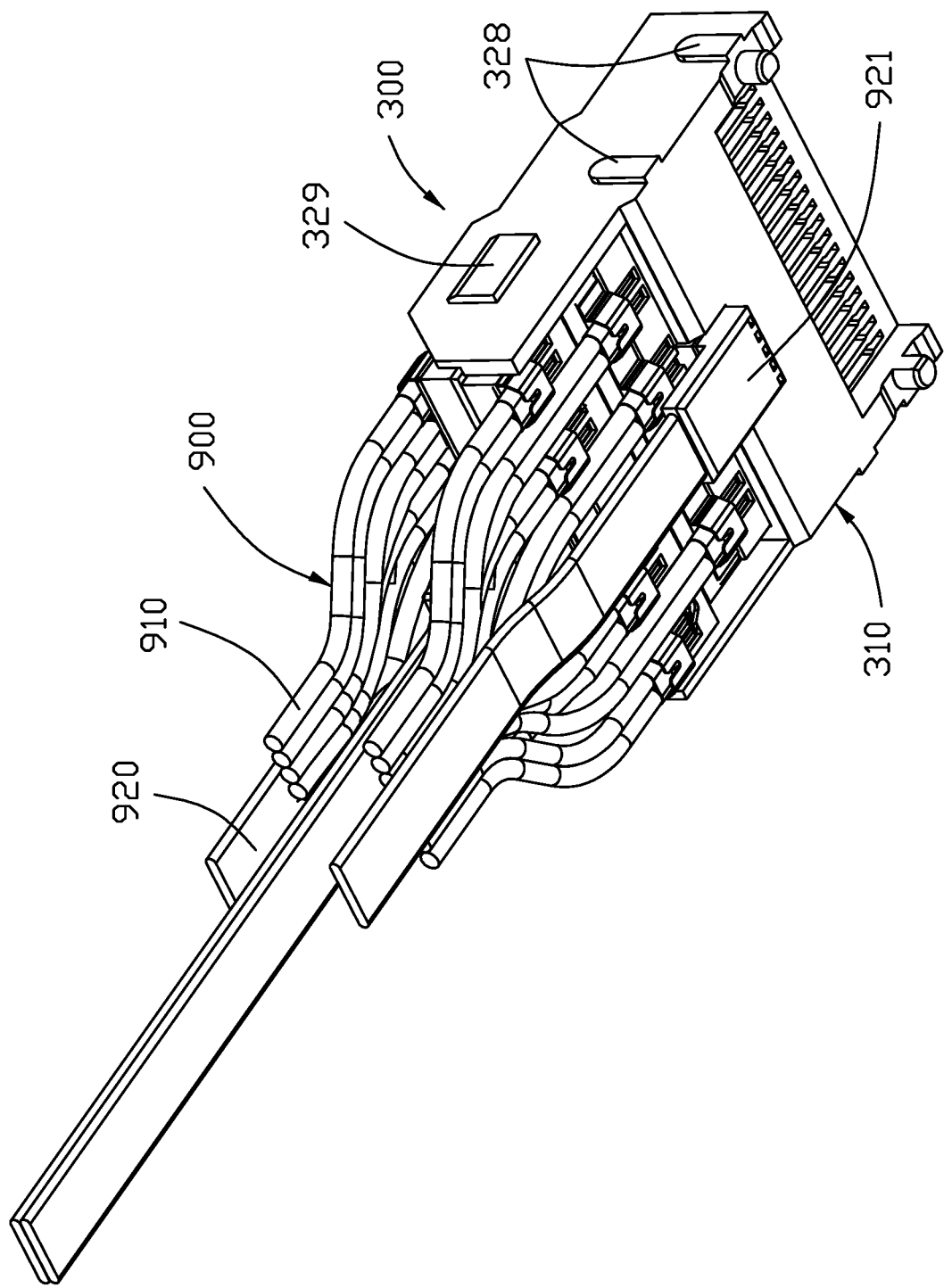
FIG. 7(B) is another perspective view of the receptacle connector with the associated wires of the cable of FIG. 7(A)
Figure 8:
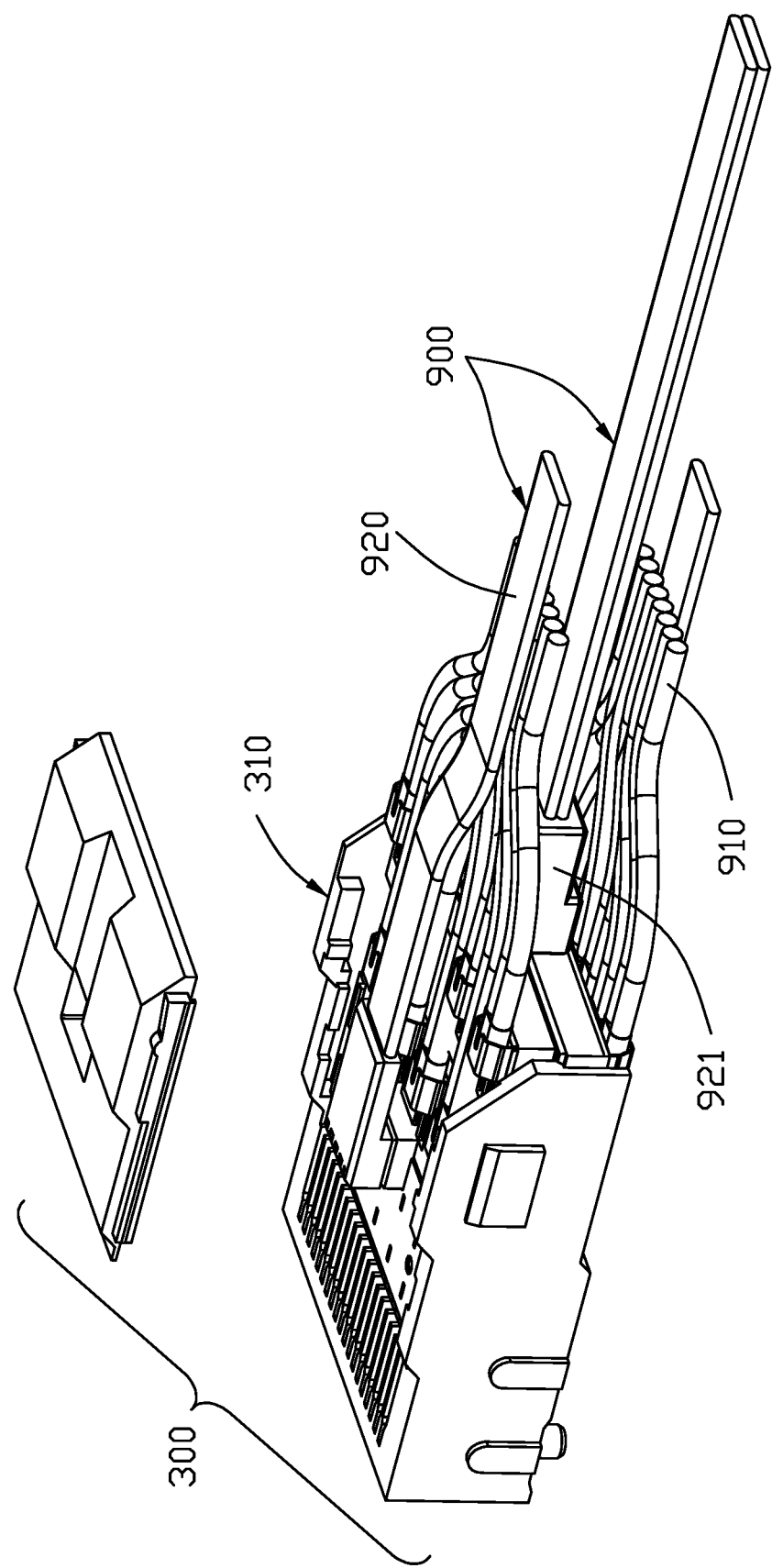
FIG. 8 is an exploded perspective view of the receptacle connector with the associated wires of the cable of FIG. 7(A)
Figure 9B:
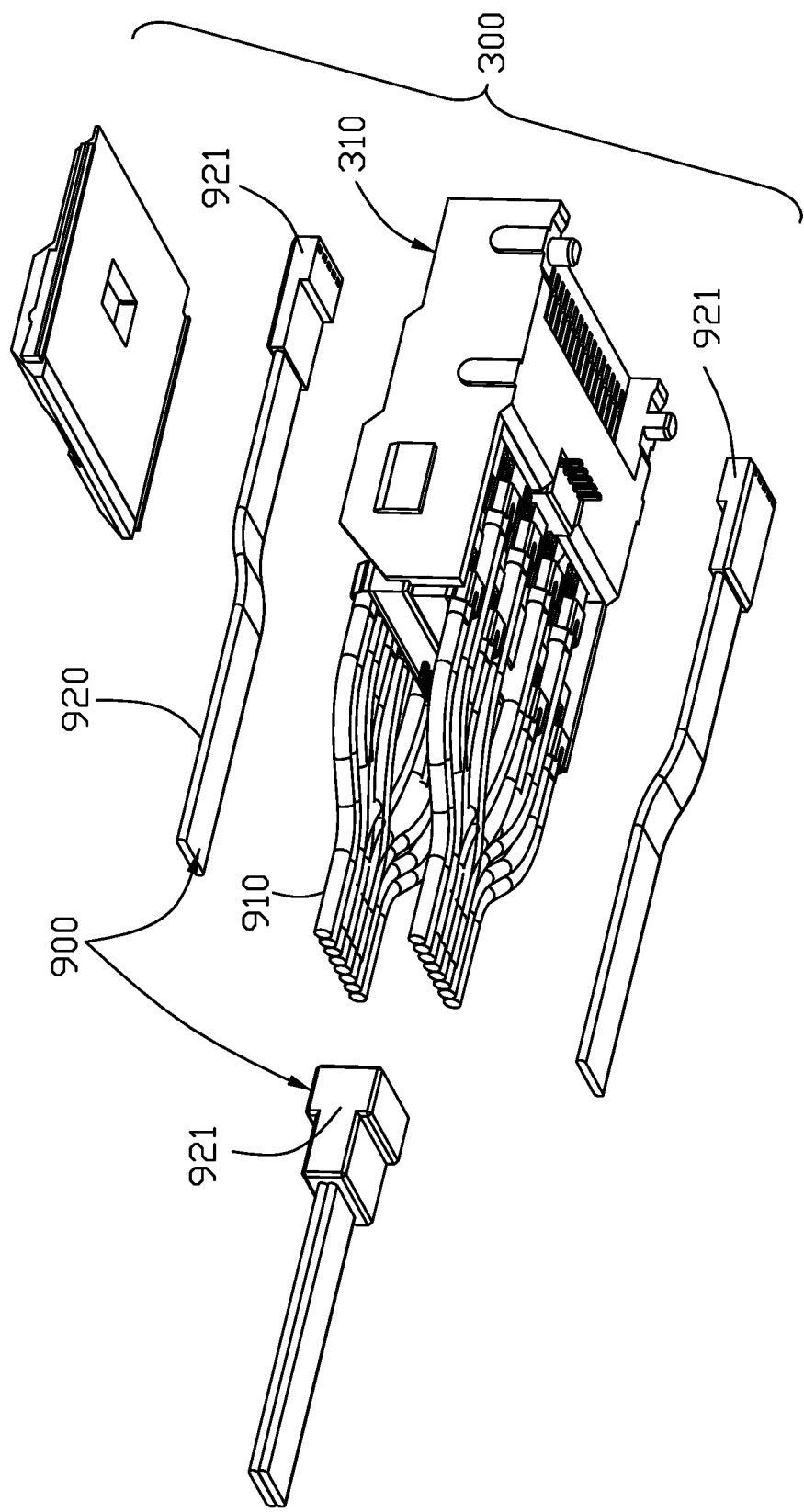
FIG. 9(B) is another exploded perspective view of the receptacle connector with the associated wires of the cable of FIG. 9(A) wherein the low speed signal wires are separated from the receptacle connector.
Figure 10A:
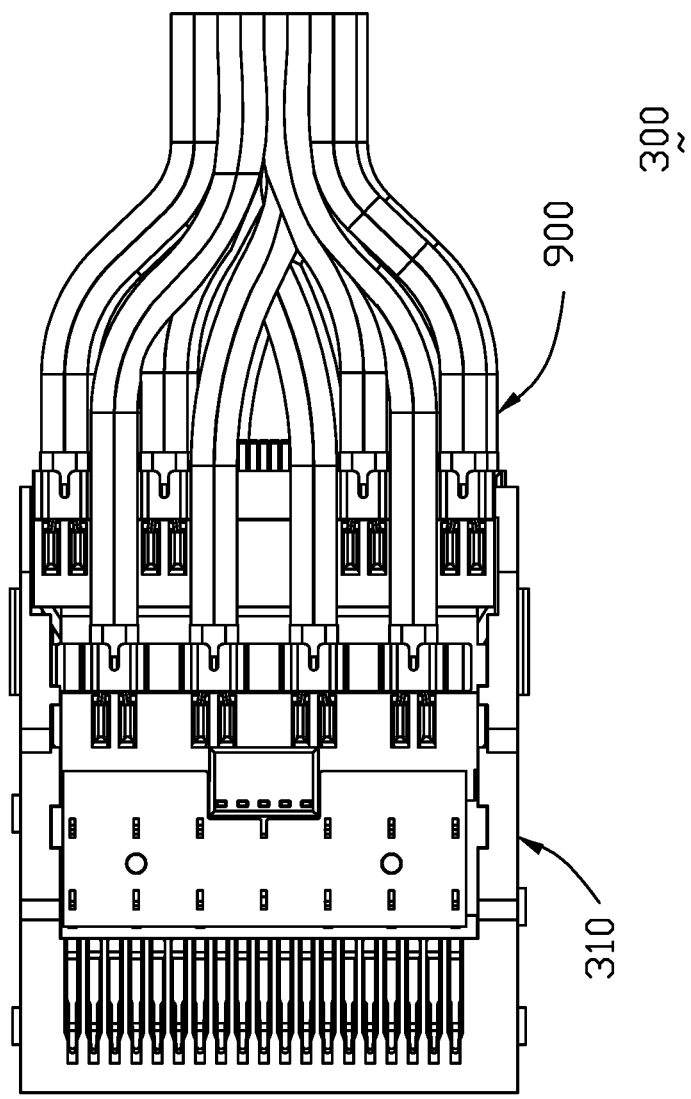
FIG. 10(A) is a top view of the receptacle connector with the associated wires of FIG. 9(A) excluding the low speed signal wires.
Figure 10B:
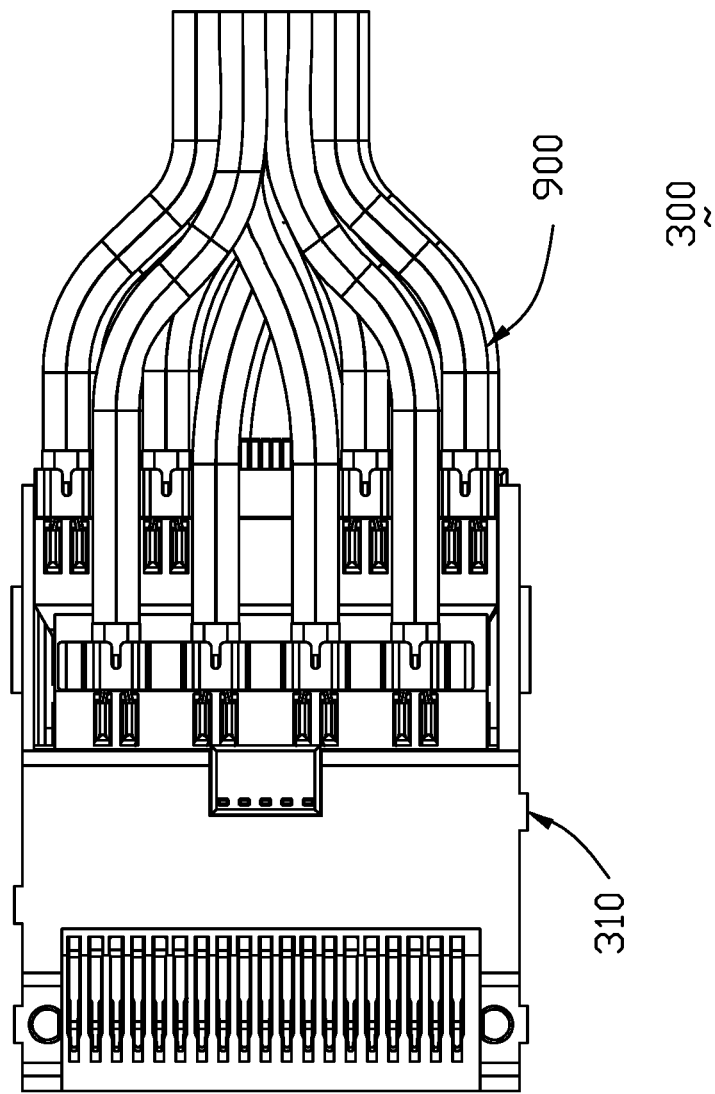
FIG. 10(B) is a bottom view of the receptacle connector with the associated wires of FIG. 10(A) excluding the low speed signal wires.

DETAILED DESCRIPTION OF THE
PREFERRED EMBODIMENT

Reference will now be made in detail to the preferred embodiment of the present invention. Referring to FIGS. 1(A) to 6(B), an electrical system 100 includes a metallic cage or cage 110 located behind an opening 122 of a panel 120 and secured to a chassis 130 via the mounting lugs 112 through corresponding holes 132. The metallic cage 110 includes an opening 114 in the corresponding top wall 116. A heat sink 140 is attached upon the top wall 116 by a clip 142 so as to contact the QSFP plug module (not shown) which is received in the receiving space 118 of the cage 110 under the top wall 116. The chassis 130 further forms through holes 134 for receiving the corresponding mounting posts of a receptacle connector assembly 300 illustrated later.

Further referring to FIG. 7(A)-25, a receptacle connector assembly 300 is received within a rear portion of the receiving space 118. The receptacle connector assembly 300 includes a receptacle connector 310 and the associated cables 900. The connector 310 includes an insulative housing 320 forming a receiving cavity 322 to receive a contact module 330. A plurality of passageways 324 are formed in the housing 320 for receiving the corresponding contacts (illustrated later). A pair of mounting posts 326 are formed on the bottom surface for mounting into the corresponding holes 134 of the chassis 130. A plurality of ribs 328 are engaged within the corresponding notches 119 in the cage 110. Through the ribs 328 engaged within the notches 119 of the cage 110, the rectangular blocks 329 on two opposite sides engaged within the rectangular opening 117 in the side walls of the cage 110, and the posts 326 within the holes 134 of the chassis 130, the electrical connector 310 can be securely retained in the cage 110.

The housing 320 further forms a receiving slot 321 in a front face to communicate with the receiving cavity 322 for receiving the QSFP plug module (not shown) inserted into. The contact module 330 includes an upper subassembly 340 and a lower subassembly 360 stacked together in the vertical direction. The upper subassembly 340 and the lower subassembly 360 are essentially similar to each other in a mirror image, i.e., a symmetrical arrangement. A cap 390 is assembled upon the housing 320 to shield and secure the contact module 330 in the vertical direction. Notably, the cap 390 may be configured to be assembled to the housing 320 horizontally or downwardly corresponding to the structure of the housing 320.

Referring to FIG. 18(A)-20(C), the upper subassembly 340 includes a front/outer wafer 342 and a rear/inner wafer 352 wherein the front/outer wafer 342 includes an upper front/outer insulator 344 and a plurality of upper front/outer contacts 346 integrally formed within the upper front/outer insulator 344, and the rear/inner wafer 352 includes an upper rear/inner insulator 354 and a plurality of upper rear/inner contacts 356 integrally formed within the upper rear/inner insulator 354. An outer grounding plate 341 and an inner grounding plate 351 are respectively located on two opposite top and bottom surfaces of the front/outer insulator 344 and upper rear/inner insulator 354. The front/outer contacts 346 include the low speed signal contacts 3461 at the center region for transmitting low speed signal, and the high speed differential pair signal contact 3462 for transmitting high speed different signal, and the grounding contacts 3463 alternately arranged with each other on two side regions in the transverse direction for transmitting grounding signal. Wherein the tails/connecting sections 34611 of the low speed signal contacts 3461 extends vertically outwardly while the tails/connecting sections 34621 of the high speed differential pair signal contacts 3462 extend horizontally for surface mounting and the tails/connecting sections 34631 of the grounding contacts 3463 are as well. Notably, all connecting sections 34631 of the grounding contacts 3463 are joined with a common grounding bar 34632 which will be welded or soldered with a corresponding common grounding bracket (illustrated later).

Correspondingly, the rear/inner contacts 356 include the low speed signal contacts 3561 at the center region and the high speed differential pair signal contact 3562 and the grounding contacts 3563 alternately arranged with each other on two side regions in the transverse direction wherein the tails/connecting sections 35611 of the low speed signal contacts 3561 extends horizontally outwardly while the tails/connecting sections 35621 of the high speed differential pair signal contacts 3562 extend horizontally for surface mounting and the tails/connecting sections 35631 of the grounding contacts 3563 are as well. Notably, all connecting sections 35631 of the grounding contacts 3563 are joined with a common grounding bar 35632 which will be welded or soldered with a corresponding common grounding bracket (illustrated later).

Understandably, the contacting sections 347 of all the front/outer contacts 346 are arranged in a front row in the transverse direction, and the contacting sections 357 of all the rear/inner contacts 356 are arranged in a rear row in the transverse direction behind said front row. Notably, the outer grounding plate 341 located upon the top surface of the front/outer insulator 344, forms a plurality of downwardly extending spring fingers 3411 connecting the corresponding grounding contacts 3463 of the front/outer contacts 346, and the inner grounding plate 351 located between the front/outer insulator 344 and the rear/inner insulator 354, forms a plurality of downwardly extending spring fingers 3511 connecting the corresponding grounding contacts 3563 of the rear/inner contacts 356, and a plurality of upwardly extending spring fingers 3512 connecting the corresponding grounding contacts 3463 of the front/outer contacts 346.

Figure 11A:
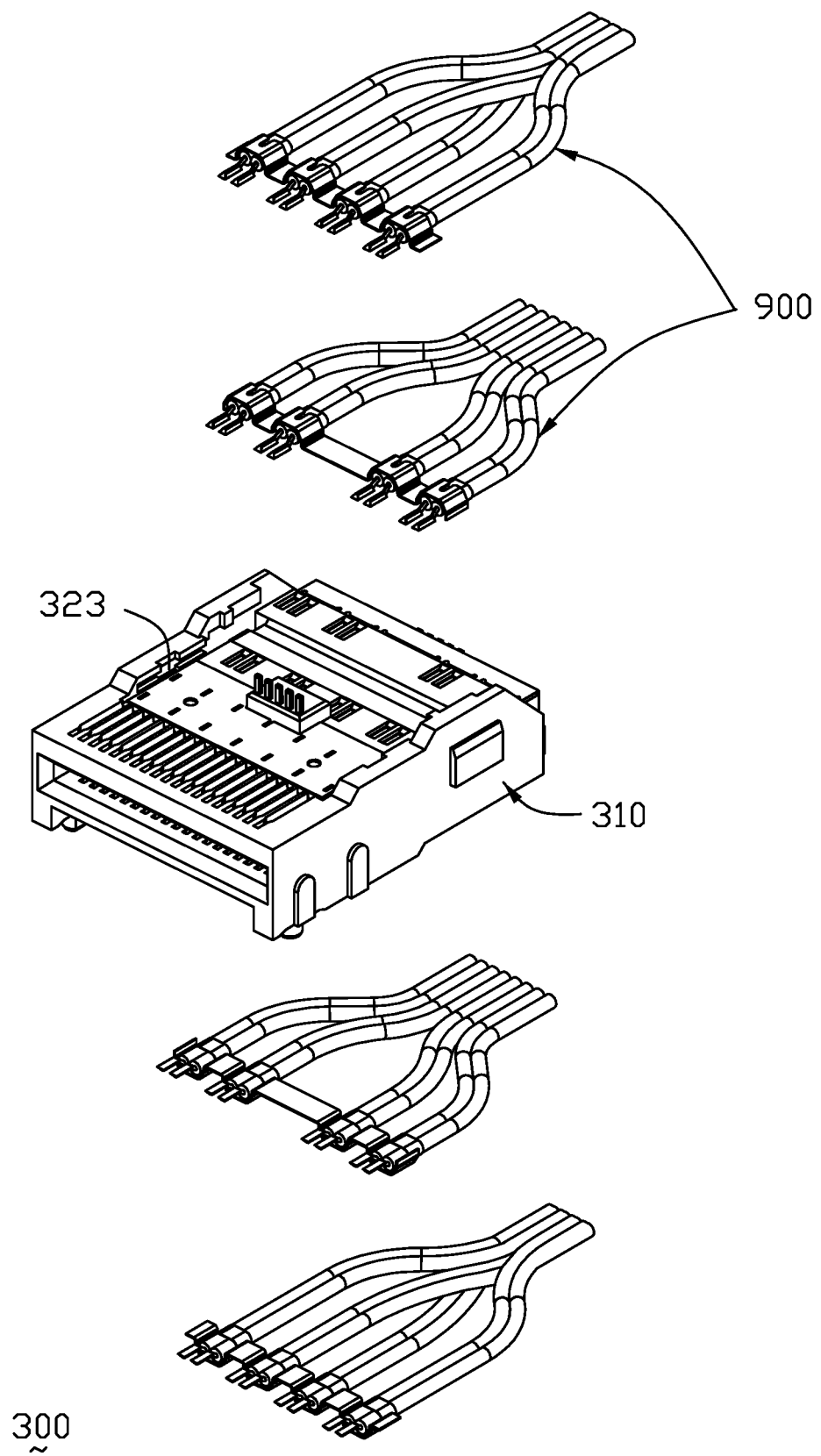
FIG. 11 (A) is an exploded perspective view of the receptacle connector with the associated wires of FIG. 9(A) wherein the wires are separated from the receptacle connector.
FIG. 11(B) is another exploded perspective view of the receptacle connector with the associated wires of FIG. 11(A) wherein the wires are separated from the receptacle connector.
FIG. 11(C) is another exploded perspective view of the receptacle connector with the associated wires of FIG. 11(A) wherein the wires are separated from the receptacle connector.
Figure 11B:
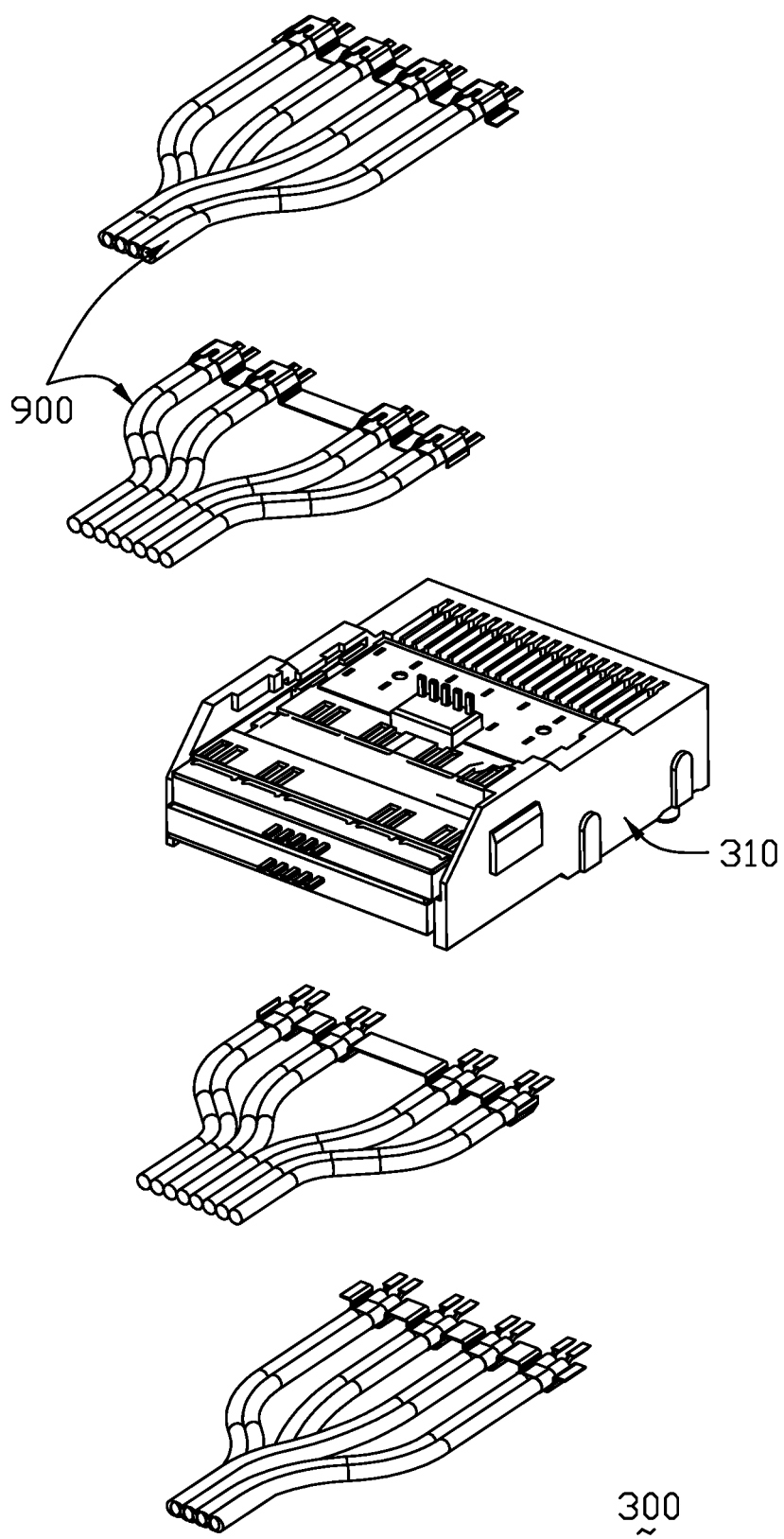
Figure 11C:
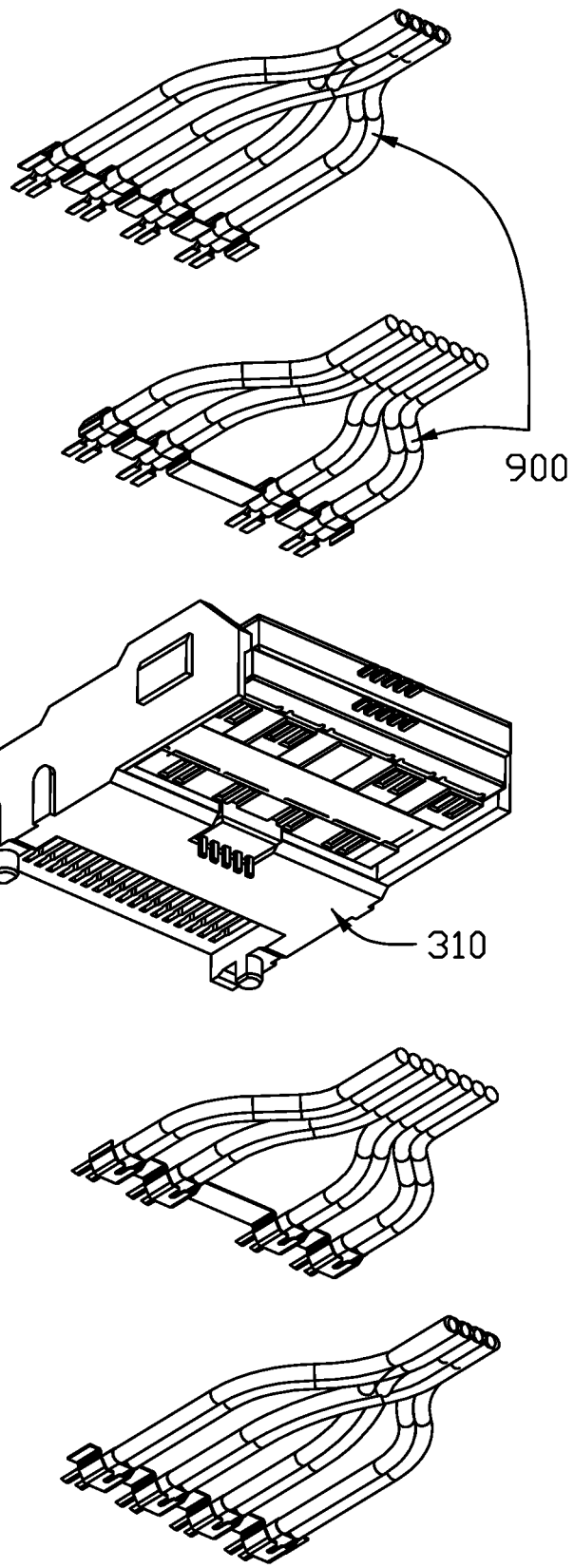
Figure 12A:
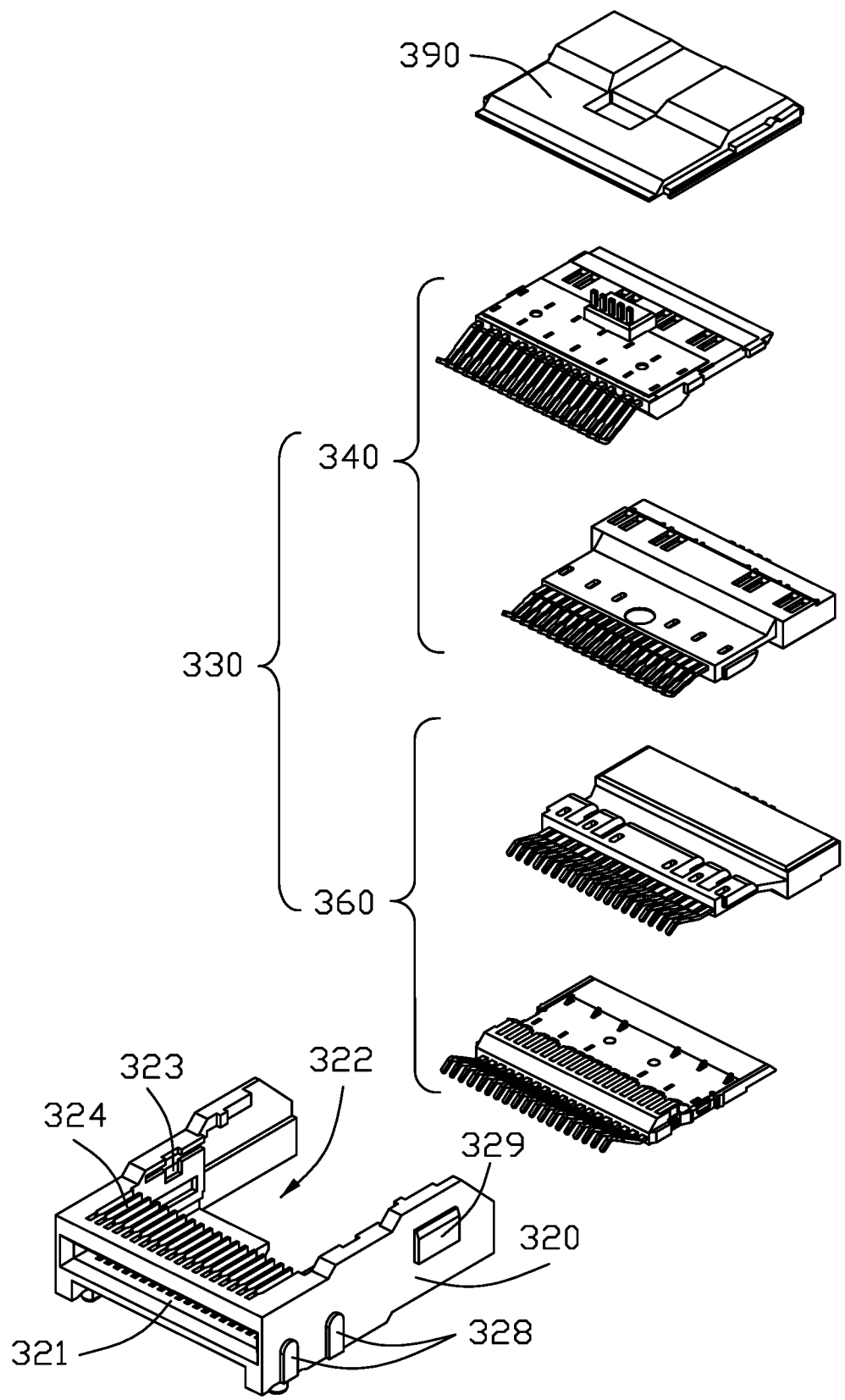
FIG. 12(A) is a further exploded perspective view of the receptacle connector of FIG. 11(A)
Figure 12B:
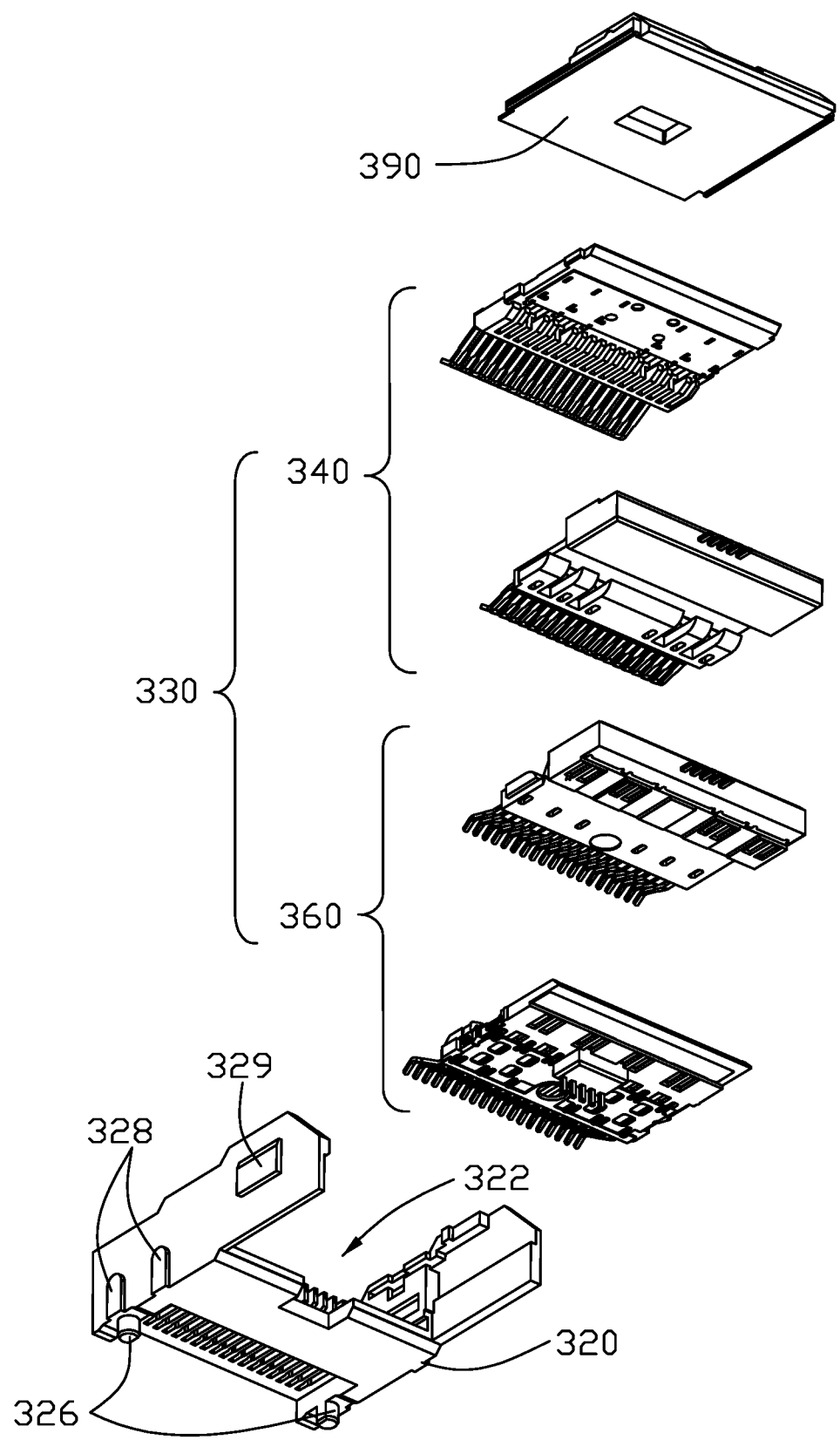
FIG. 12(B) is another exploded perspective view of the receptacle connector of FIG. 12(A)
Figure 13A:
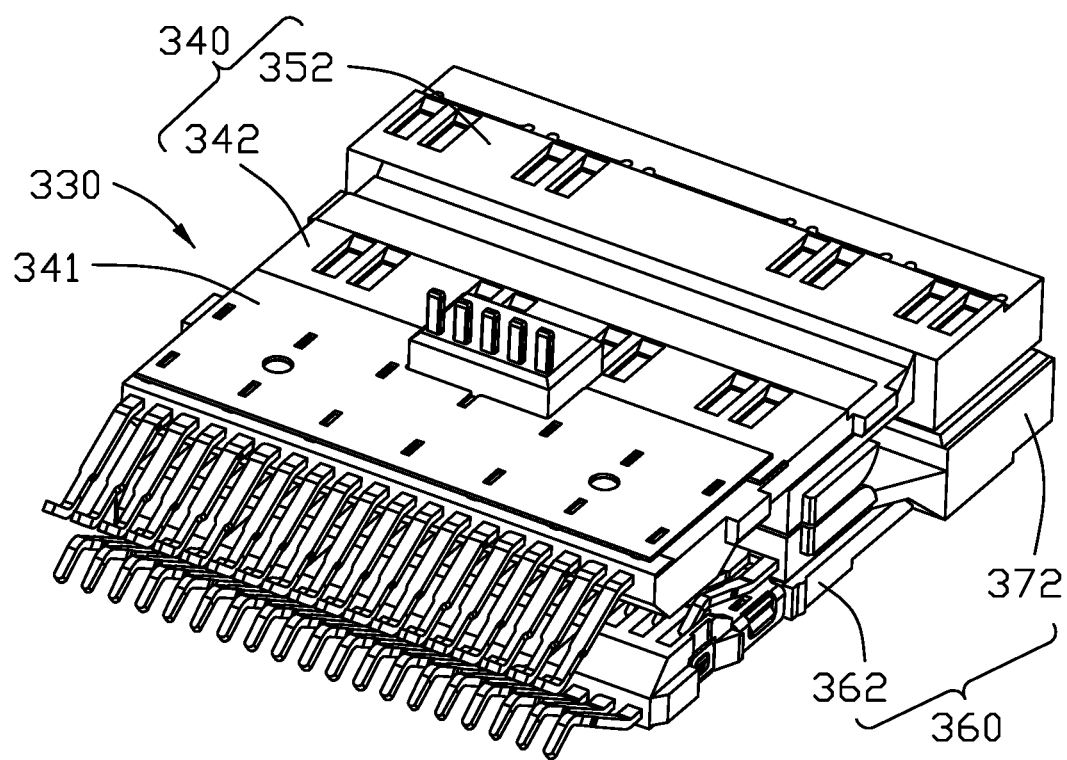
FIG. 13(A) is an assembled perspective view of the contact module of the receptacle connector of FIG. 12(A)
Figure 13B:
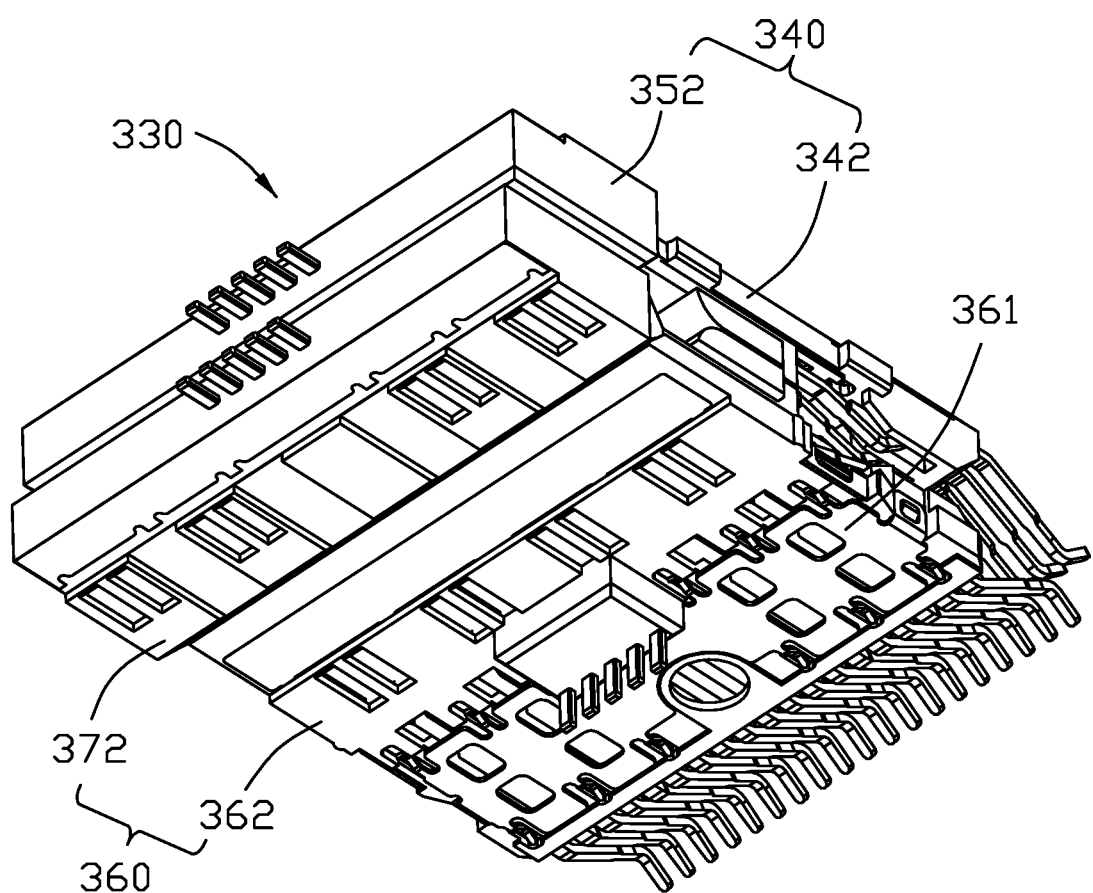
FIG. 13(B) is another assembly perspective view of the contact module of the receptacle connector of FIG. 12(A)
Figure 13C:
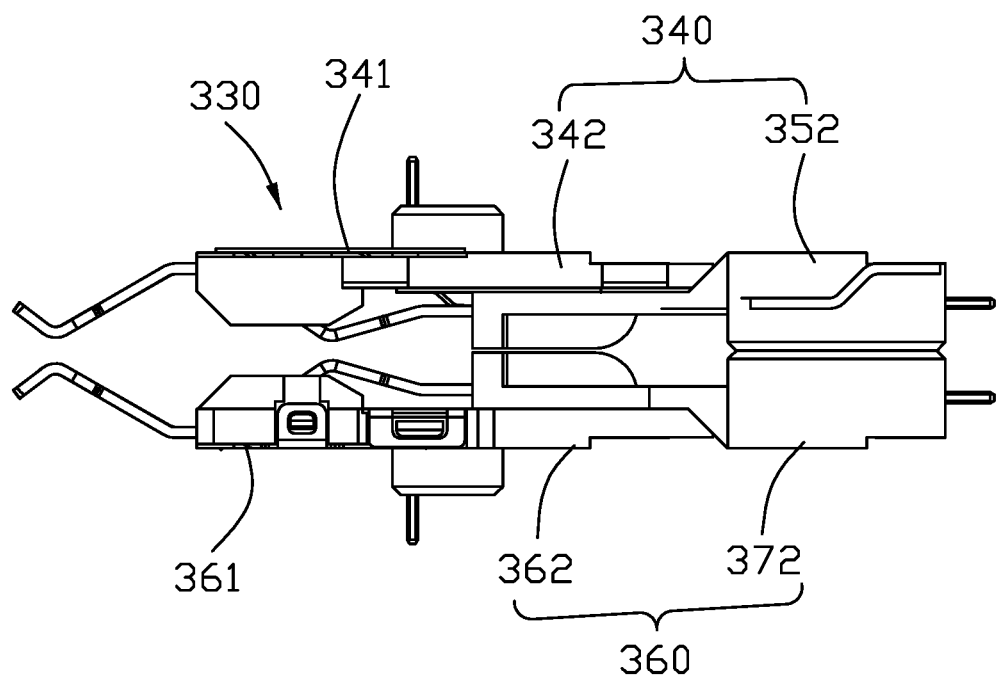
FIG. 13(C) is a side view of the contact module of the receptacle connector of FIG. 12 (A)
Figure 14A:
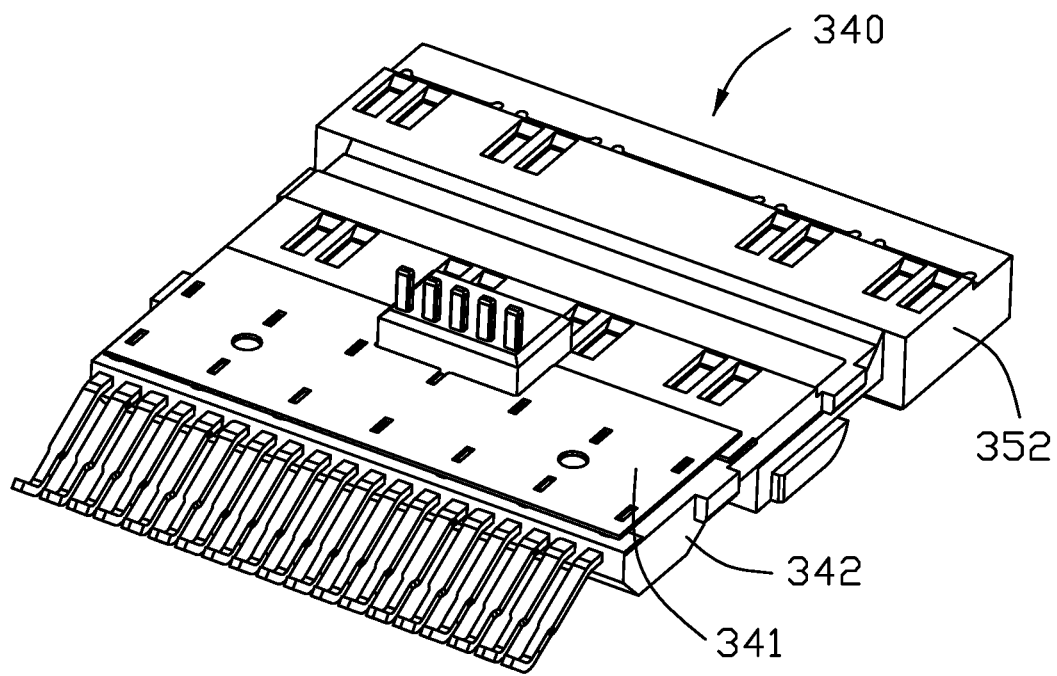
FIG. 14(A) is an exploded perspective view of the contact module of the receptacle connector of FIG. 13(A) to show the upper subassembly and the lower subassembly, respectively.
Figure 14A:
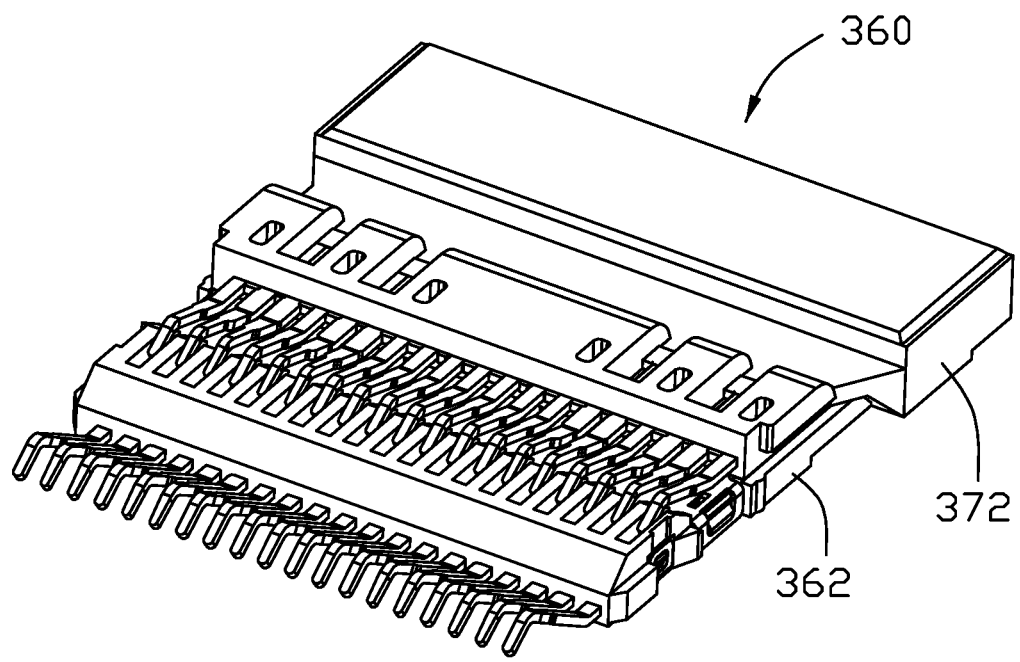
Figure 14B:
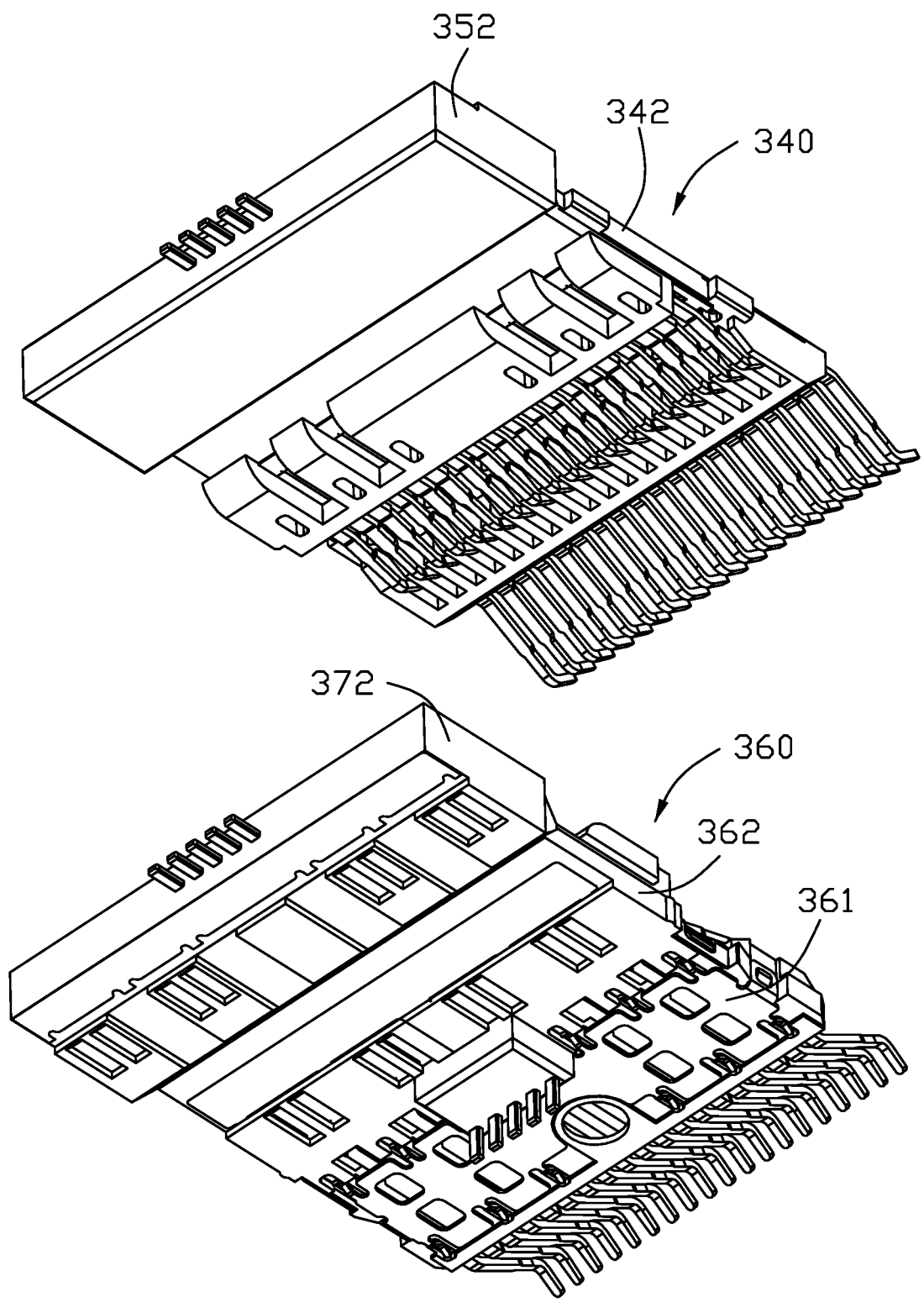
FIG. 14(B) is another exploded perspective view of the contact module of the receptacle connector of FIG. 13(B) to show the upper subassembly and the lower subassembly, respectively.
Figure 14C:
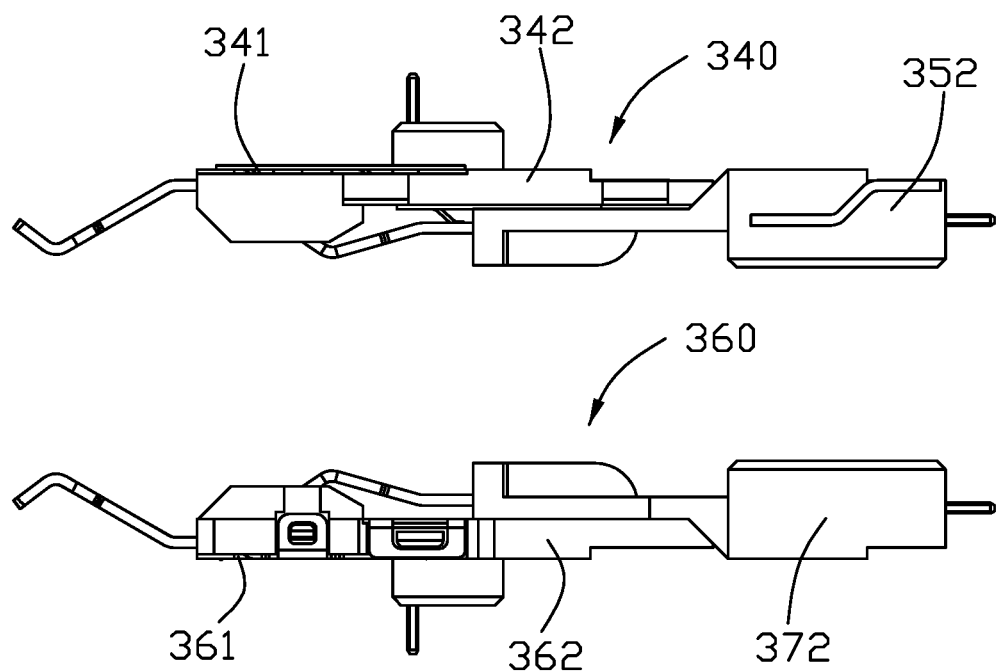
FIG. 14(C) is a side view of the contact module of the receptacle connector of FIG. 13(A)
Figure 15A:
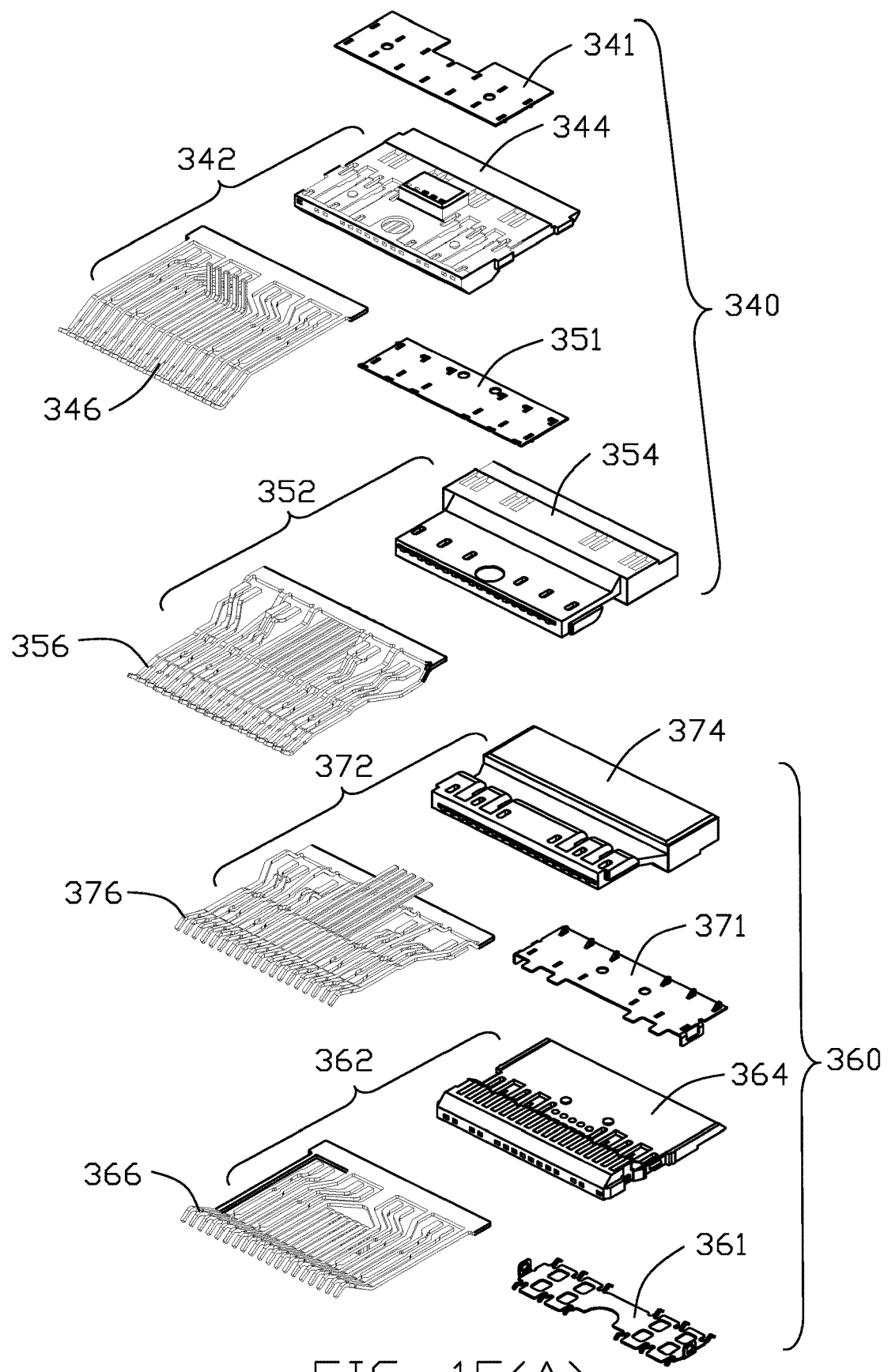
FIG. 15(A) is a further exploded perspective view of the contact module of the receptacle connector of FIG. 14(A)
Figure 15B:
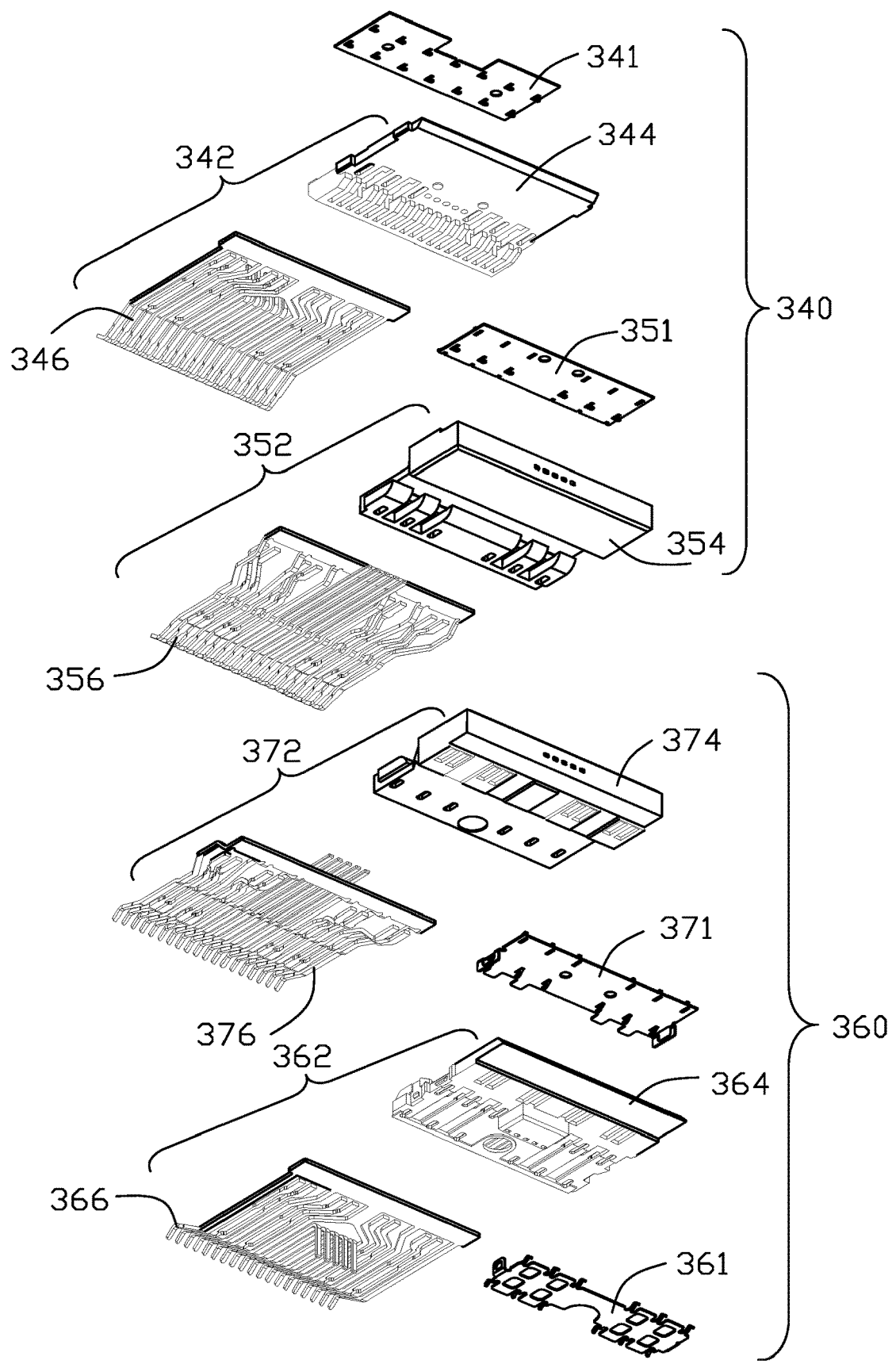
FIG. 15(B) is another exploded perspective view of the contact module of the receptacle connector of FIG. 14(B)
Figure 16A:
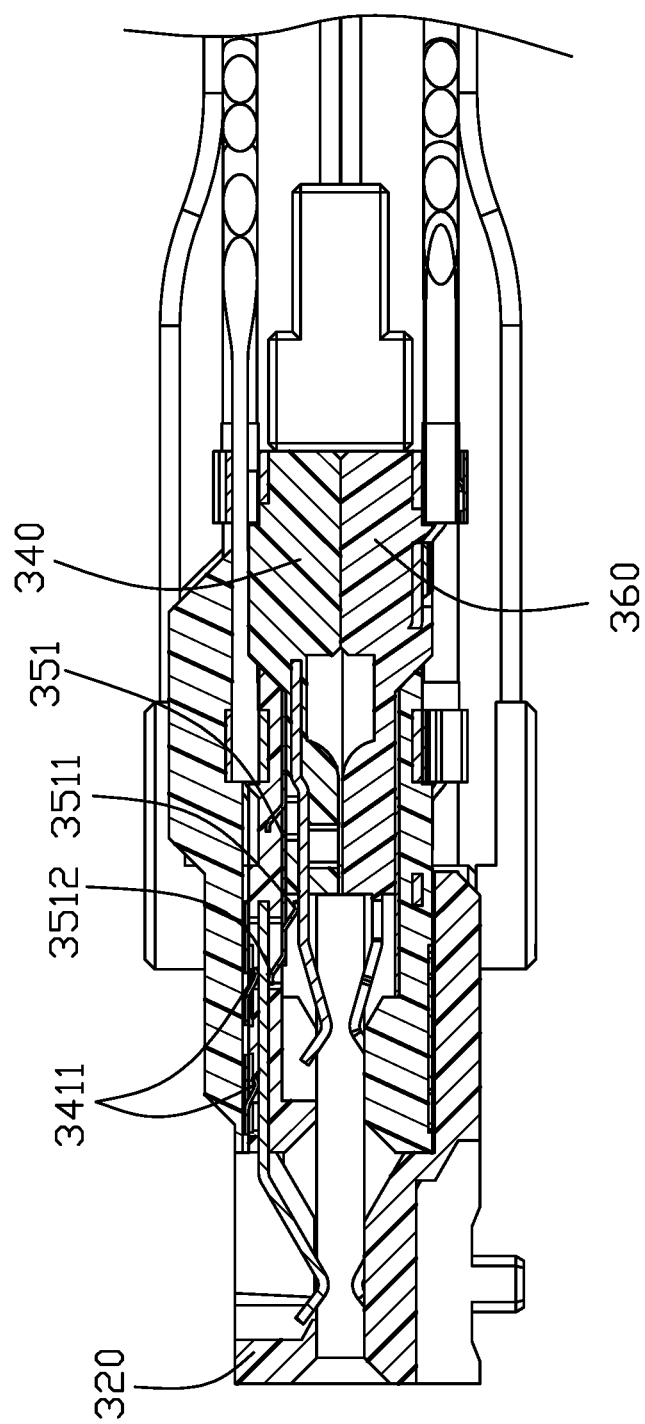
FIG. 16(A) is a cross-sectional view of the receptacle connector with the associated wires taken along line 16(A)-16(A) in FIG. 7(A) to show how the grounding plate works with the corresponding grounding contacts.
Figure 16B:
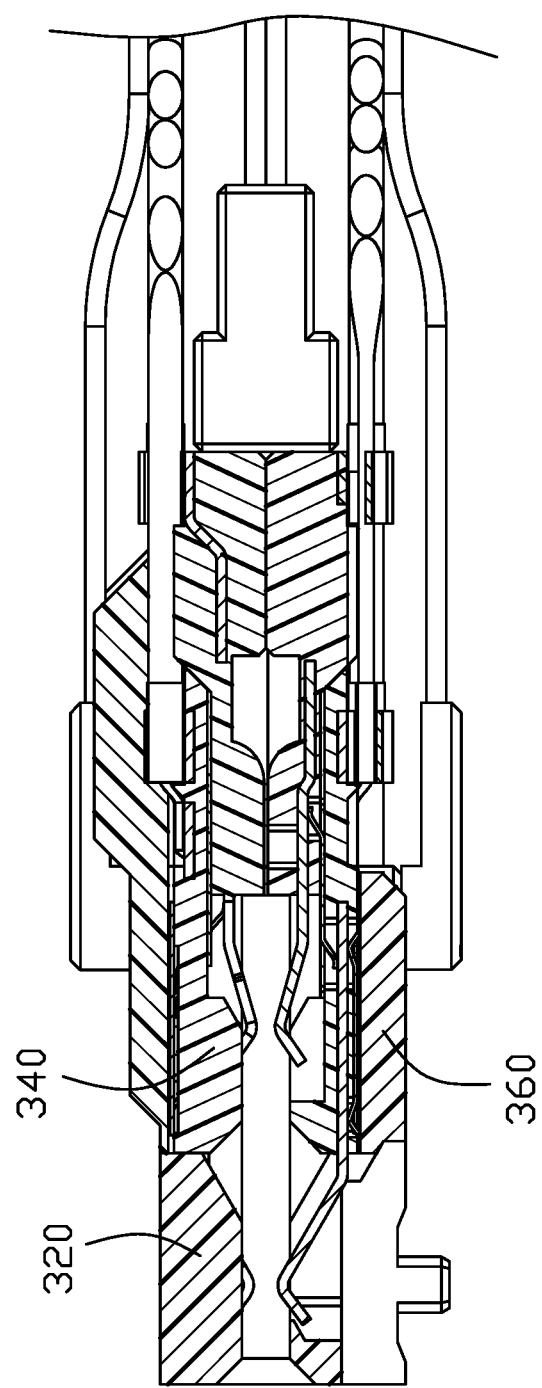
FIG. 16(B) is another cross-sectional view of the receptacle connector with the associated wires taken along line 16(B)-16(B) in FIG. 7(A) to show how the grounding plate works with other grounding contacts.
Figure 17A:
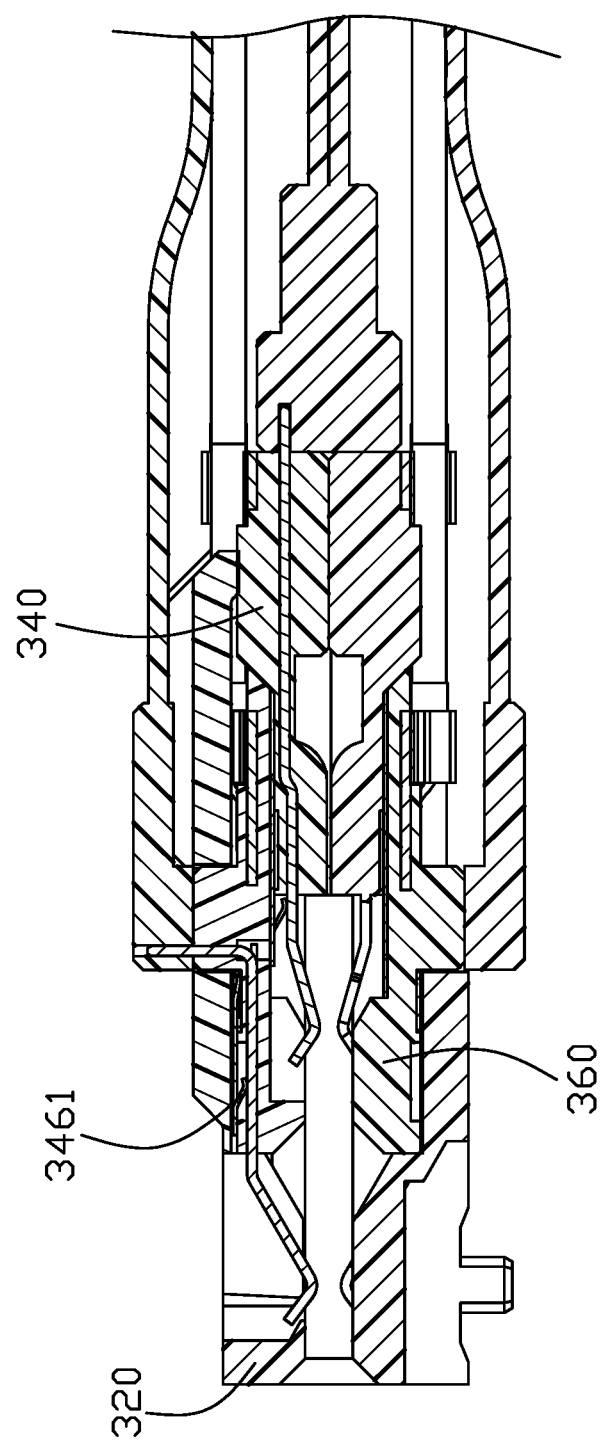
FIG. 17(A) is a cross-sectional view of the receptacle connector with the associated wires taken along line 17(A)-17(A) in FIG. 7(A) to show how the connecting sections of the upper subassembly of the contact module are disposed in the housing.
Figure 17B:
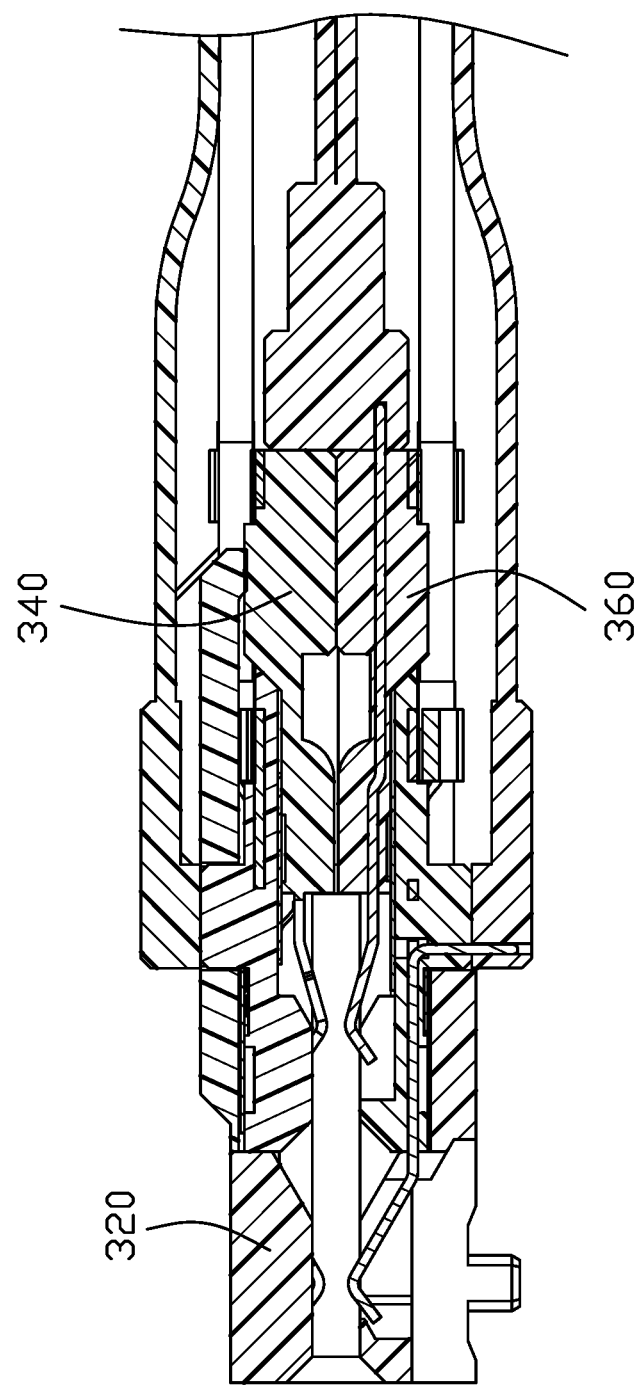
FIG. 17(B) is another cross-sectional view of the receptacle connector with the associated wires taken along line 17(B)-17(B) in FIG. 7(A) to show how the connecting sections of the lower subassembly of the contact module is disposed in the housing.
Figure 17C:
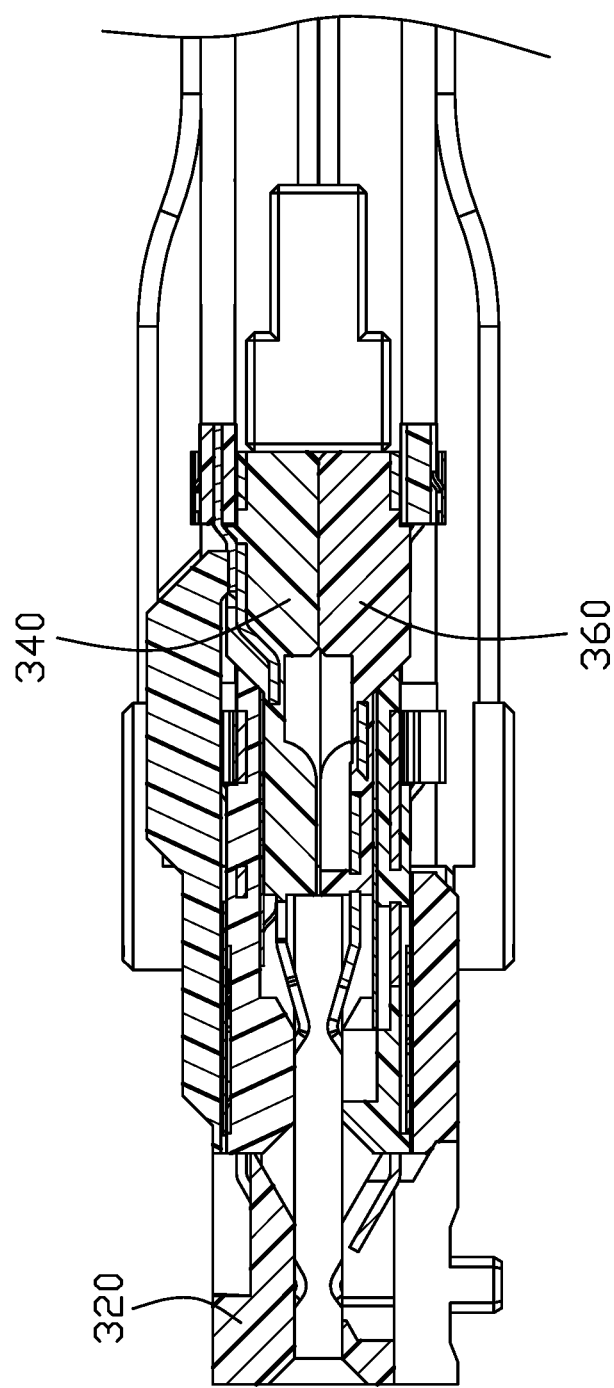
FIG. 17(C) is another cross-sectional view of the receptacle connector with the associated wires taken along line 17(C)-17(C) in FIG. 7(A) to show how the connecting section of the inner contact is soldered with the corresponding wire.
Figure 17D:
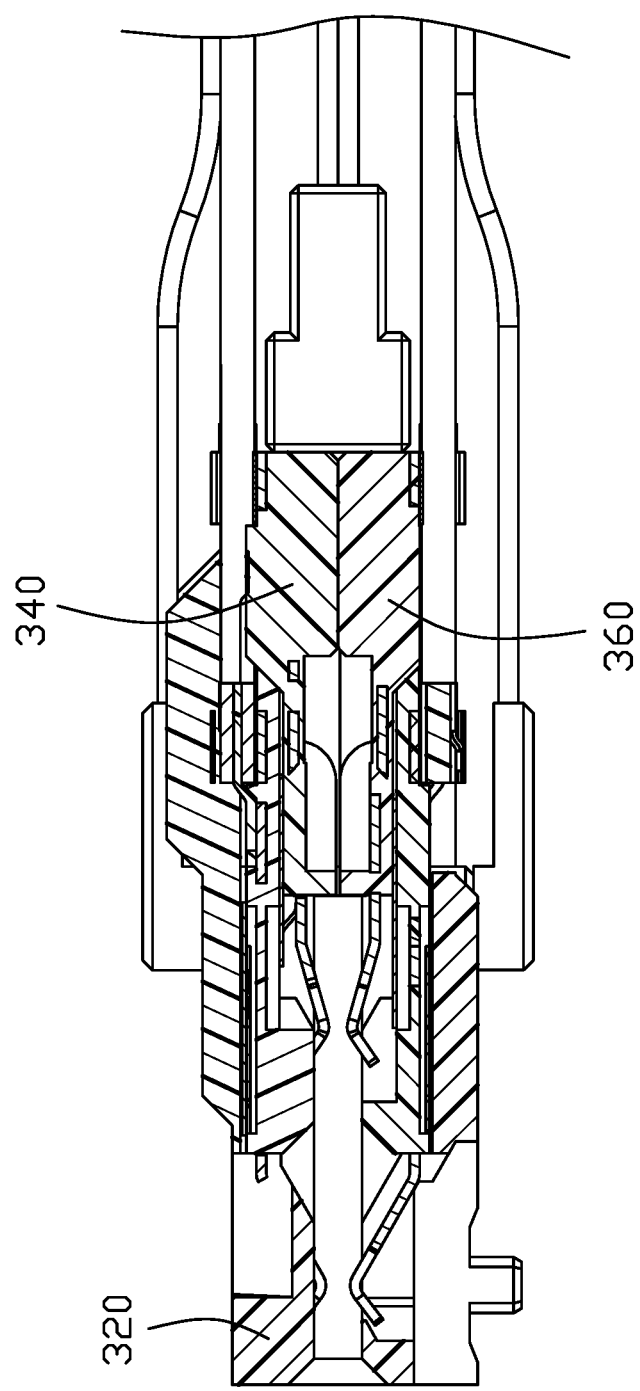
FIG. 17(D) is another cross-sectional view of the receptacle connector with the associate wires taken along line 17(D)-17(D) in FIG. 7(A) to show how the connecting section of the outer contact is soldered with the corresponding wire.
Figure 18A:
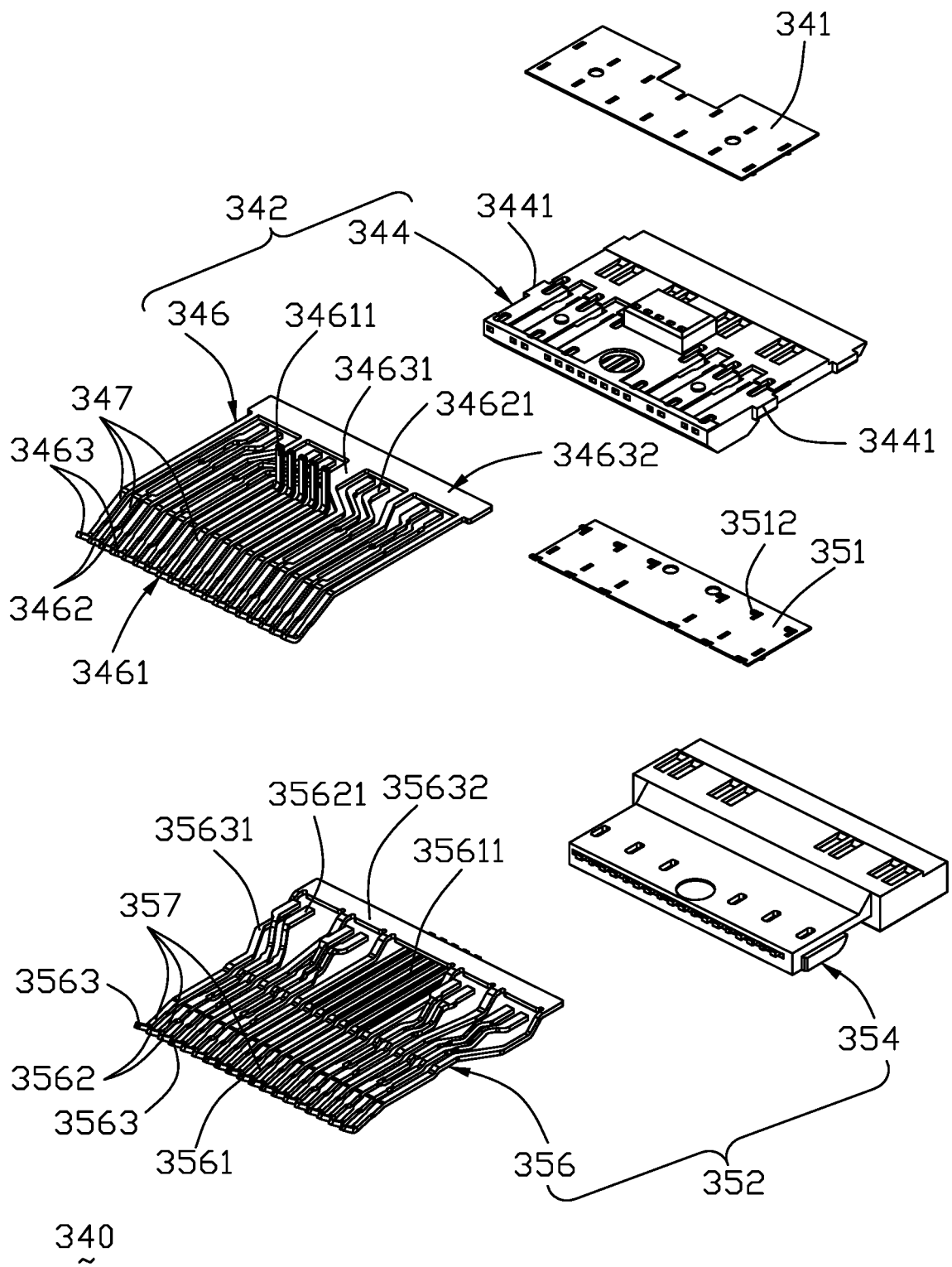
FIG. 18(A) is an exploded perspective view of the upper subassembly of the contact module of the receptacle connector of FIG. 14(A)
Figure 18B:
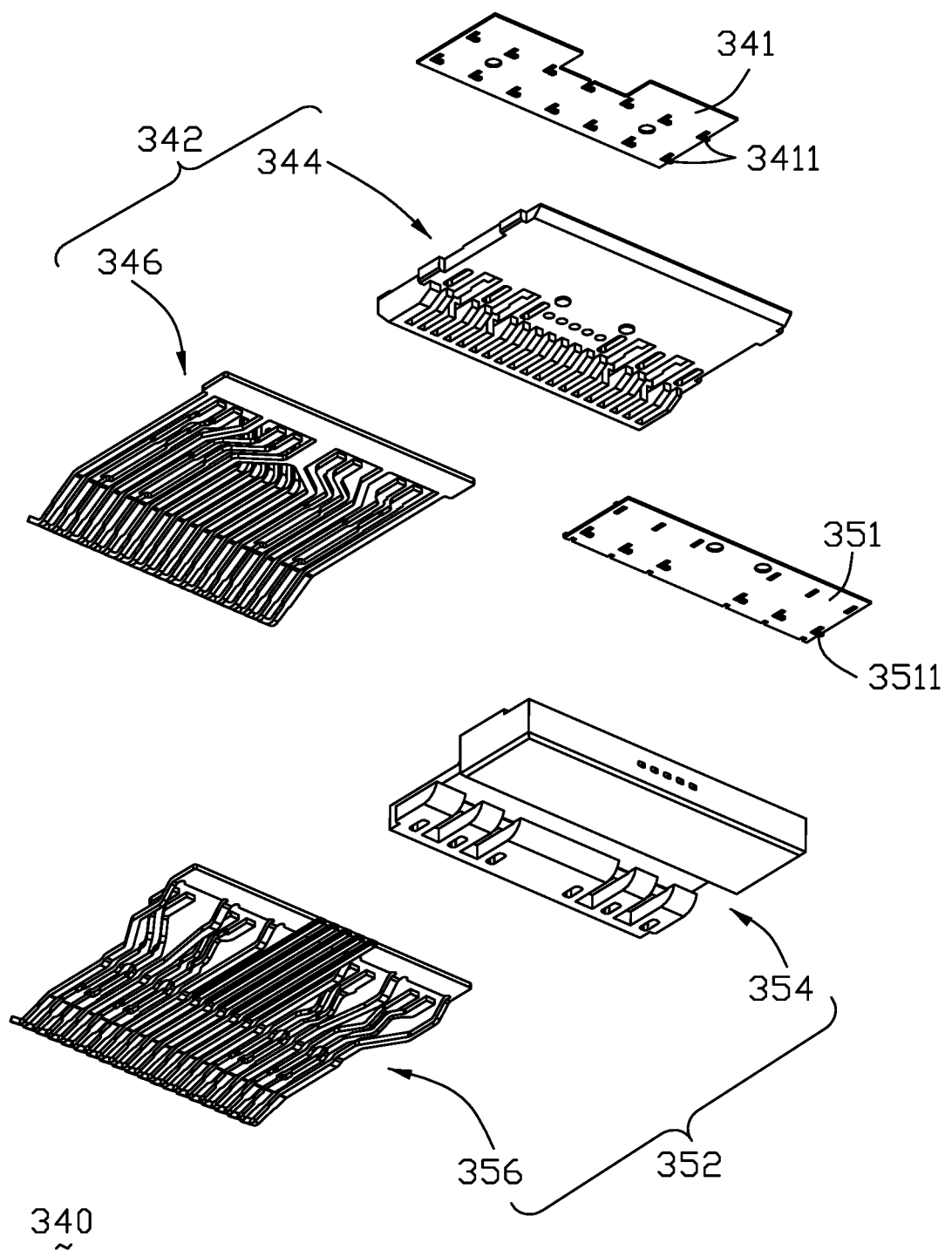
FIG. 18(B) is another exploded perspective view of the upper subassembly of the contact module of the receptacle connector of FIG. 14(B)
Figure 19A:
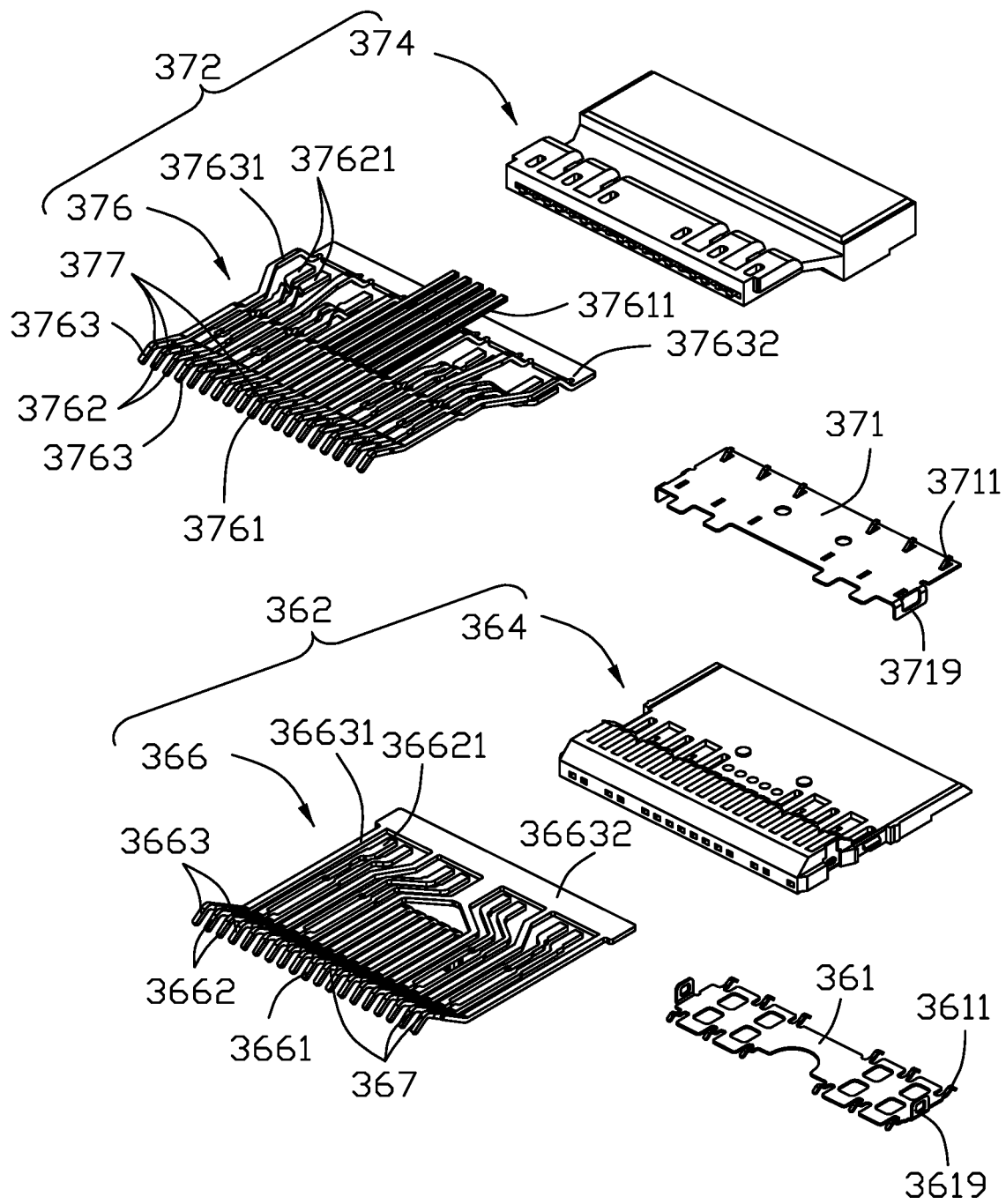
FIG. 19(A) is an exploded perspective view of the lower subassembly of the contact module of the receptacle connector of FIG. 14(A)
Figure 19B:
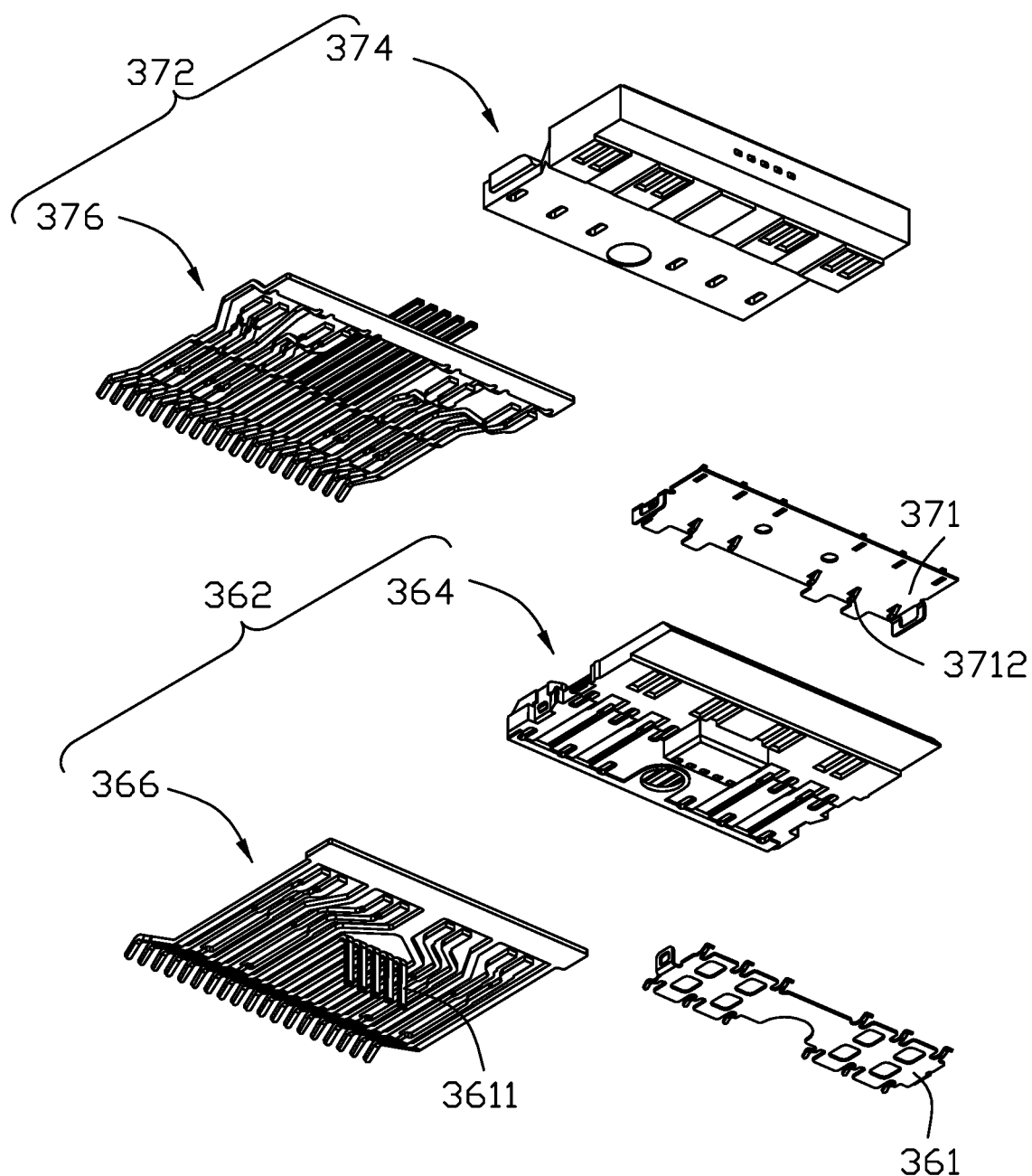
FIG. 19(B) is another exploded perspective view of the lower subassembly of the contact module of the receptacle connector of FIG. 14(B)
Figure 20A:
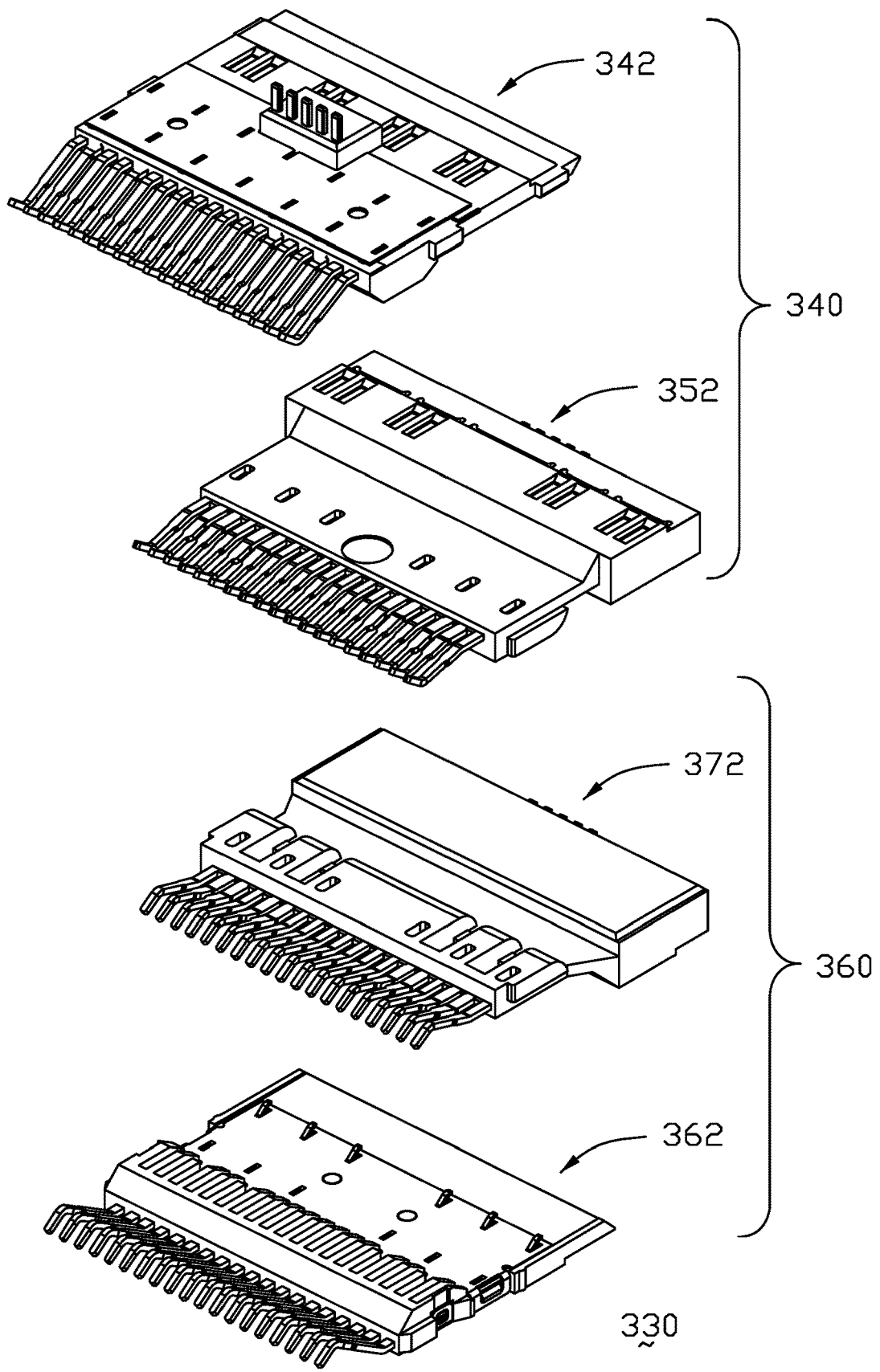
FIG. 20(A) is an exploded perspective view of the contact module of the receptacle connector of FIG. 12(A)
Figure 20B:
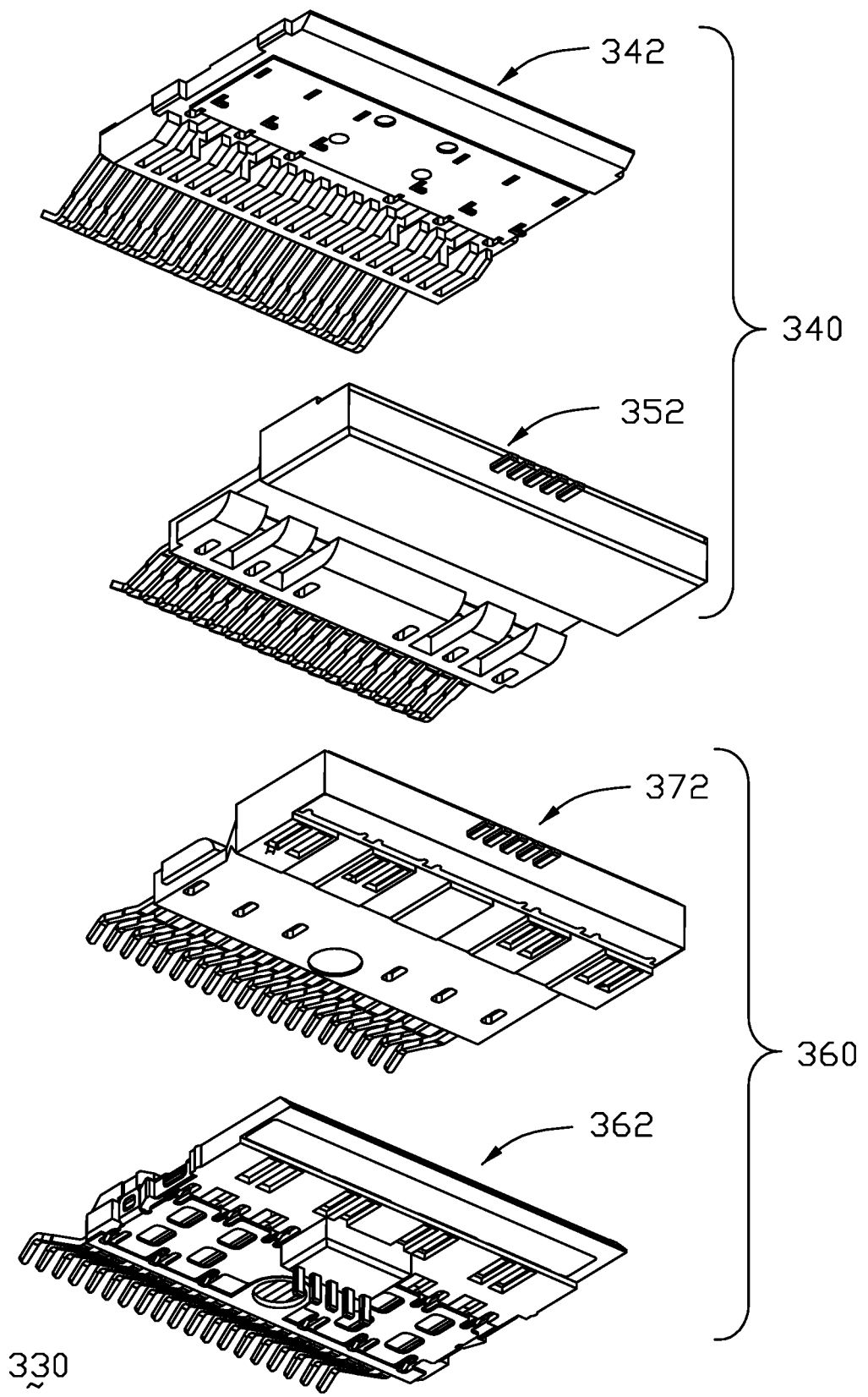
FIG. 20(B) is another exploded perspective view of the contact module of the receptacle connector of FIG. 12(B)
Figure 20C:
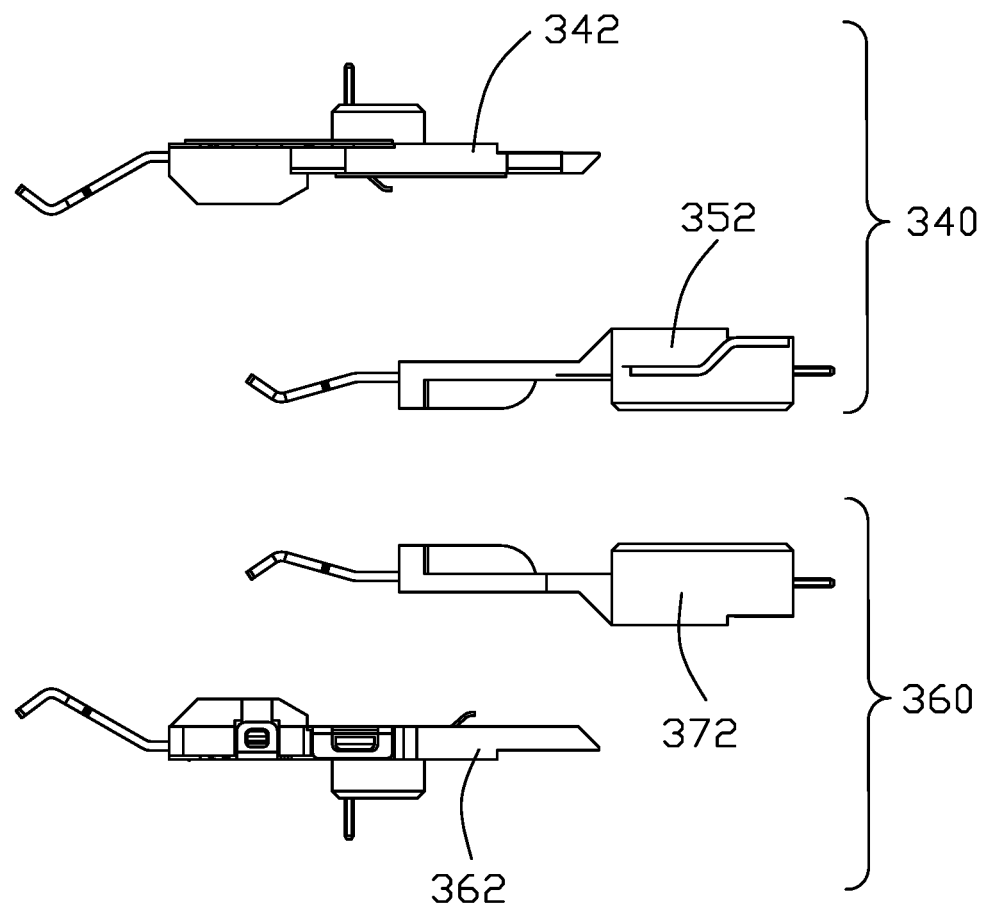
FIG. 20(C) is a side view of the contact module of the receptacle connector of FIG. 12(A)
Figure 21A:
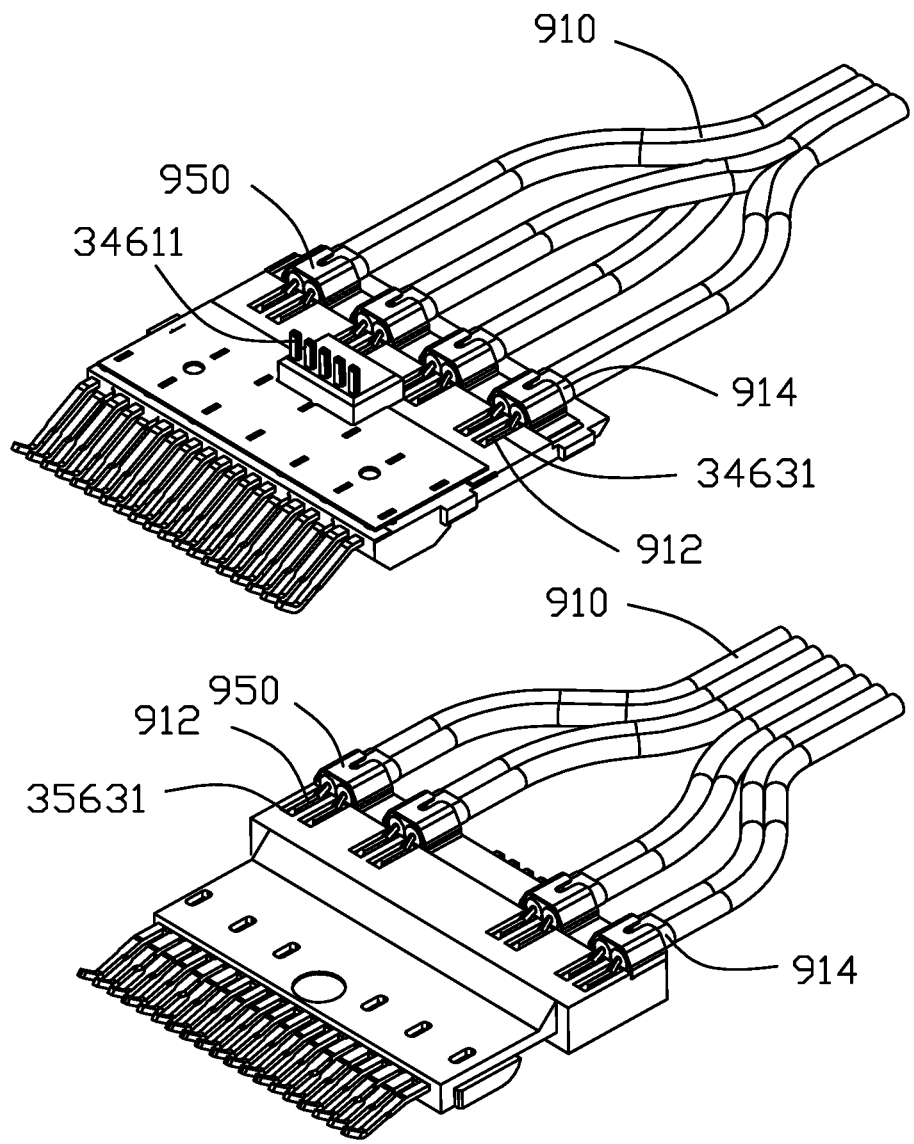
FIG. 21(A) is an exploded perspective view of the upper subassembly of the contact module with the associated wires of FIG. 7(A)
Figure 21B:
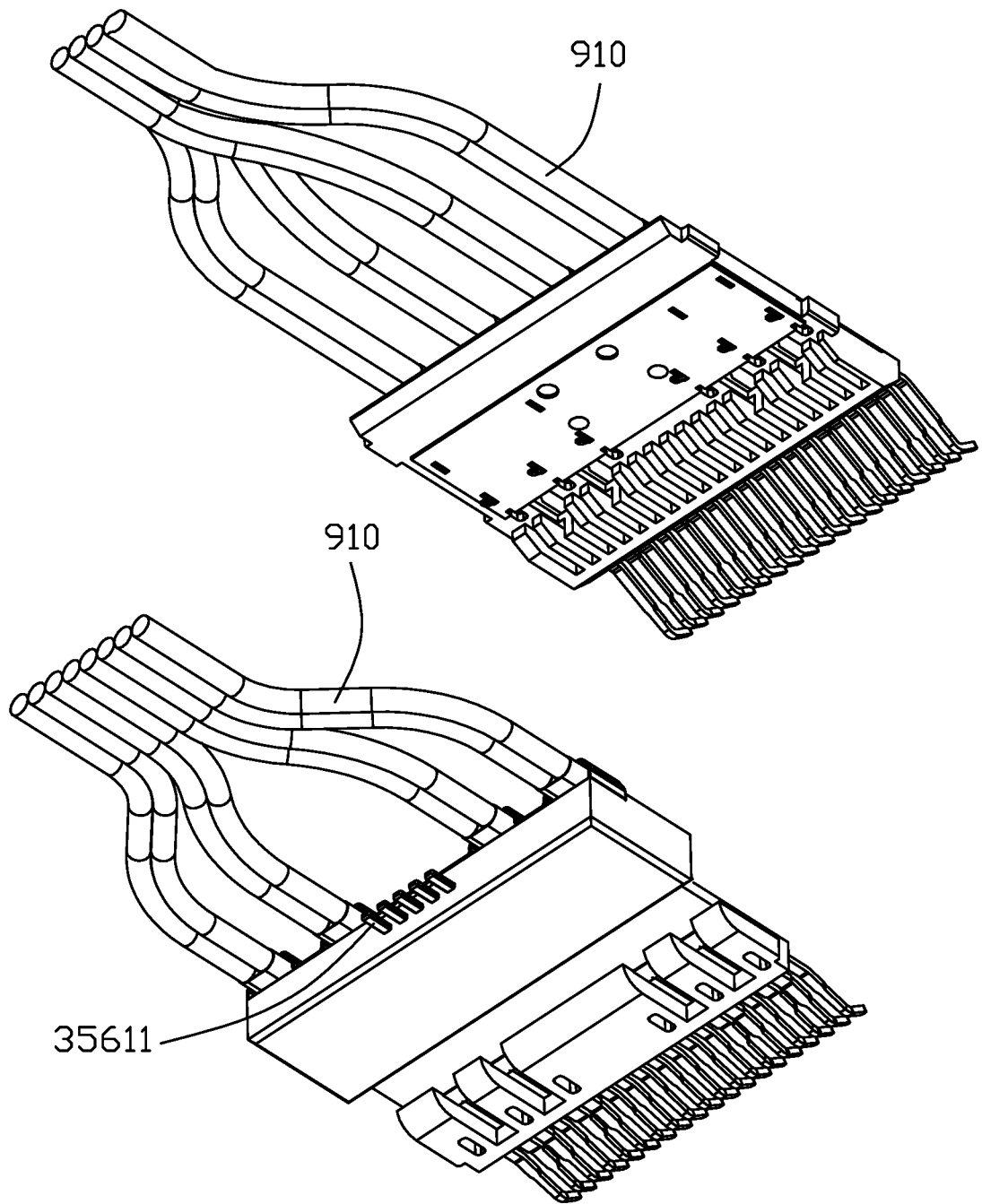
FIG. 21(B) is another exploded perspective view of the upper subassembly of the contact module with the associated wires of FIG. 7(B)
Figure 22A:
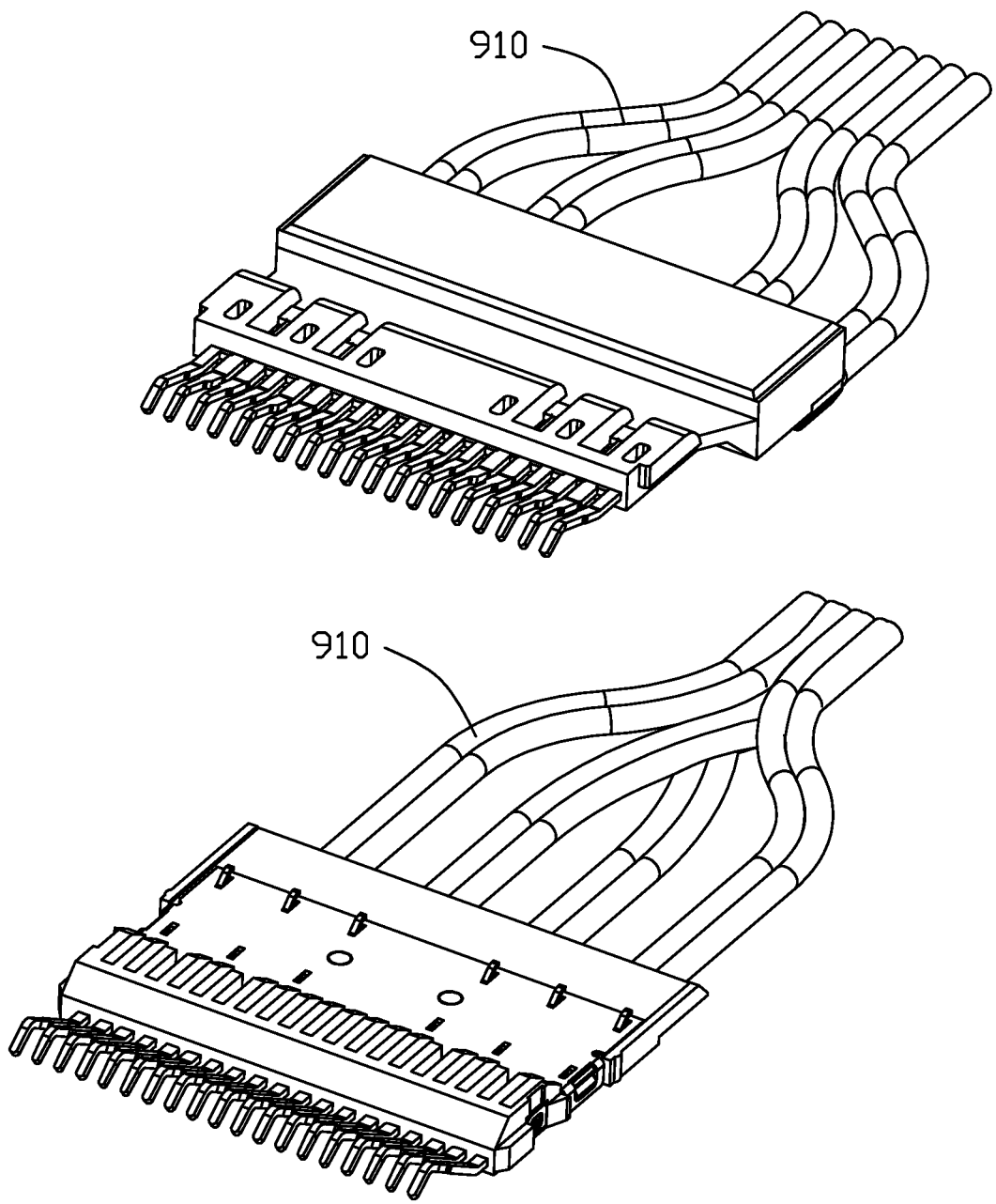
FIG. 22(A) is an exploded perspective view of the lower subassembly of the contact module with the associated wires of FIG. 7(A)
Figure 22B:
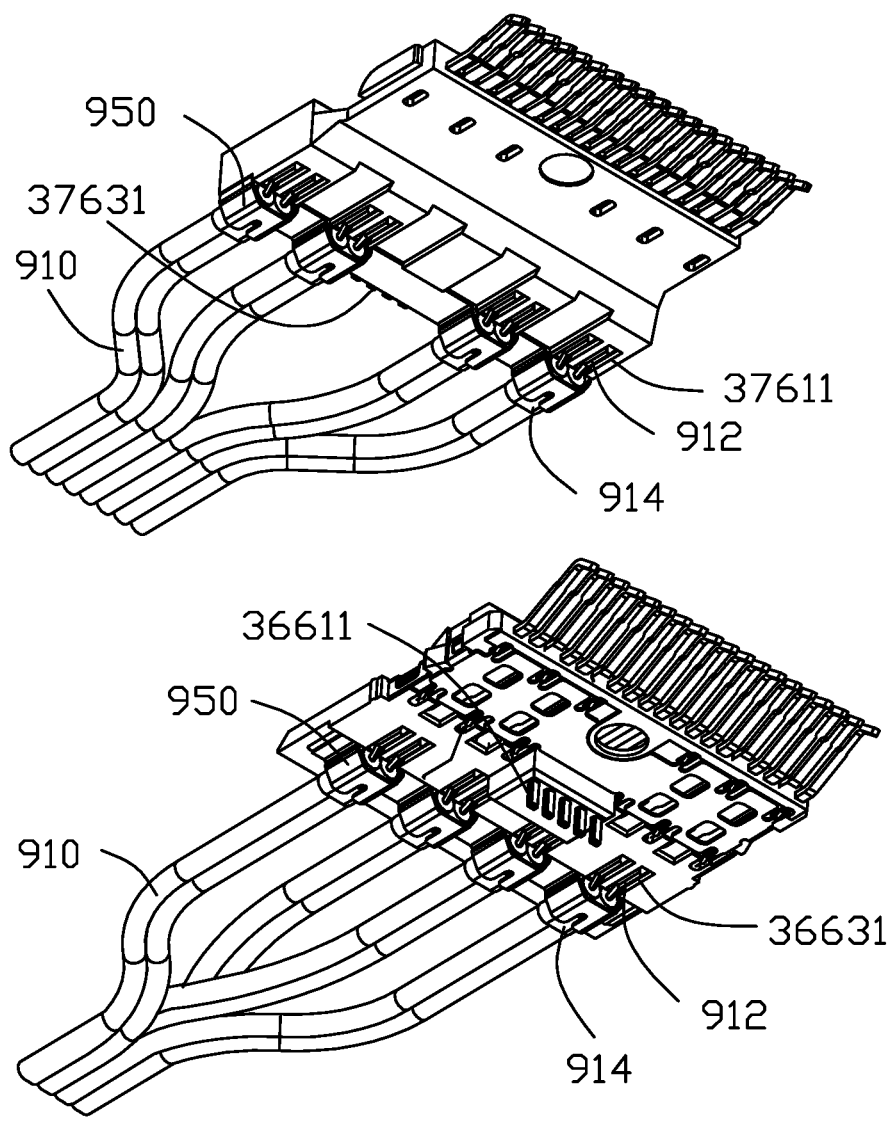
FIG. 22(B) is another exploded perspective view of the lower subassembly of the contact module with the associated wires of FIG. 7(B)
Figure 23A:
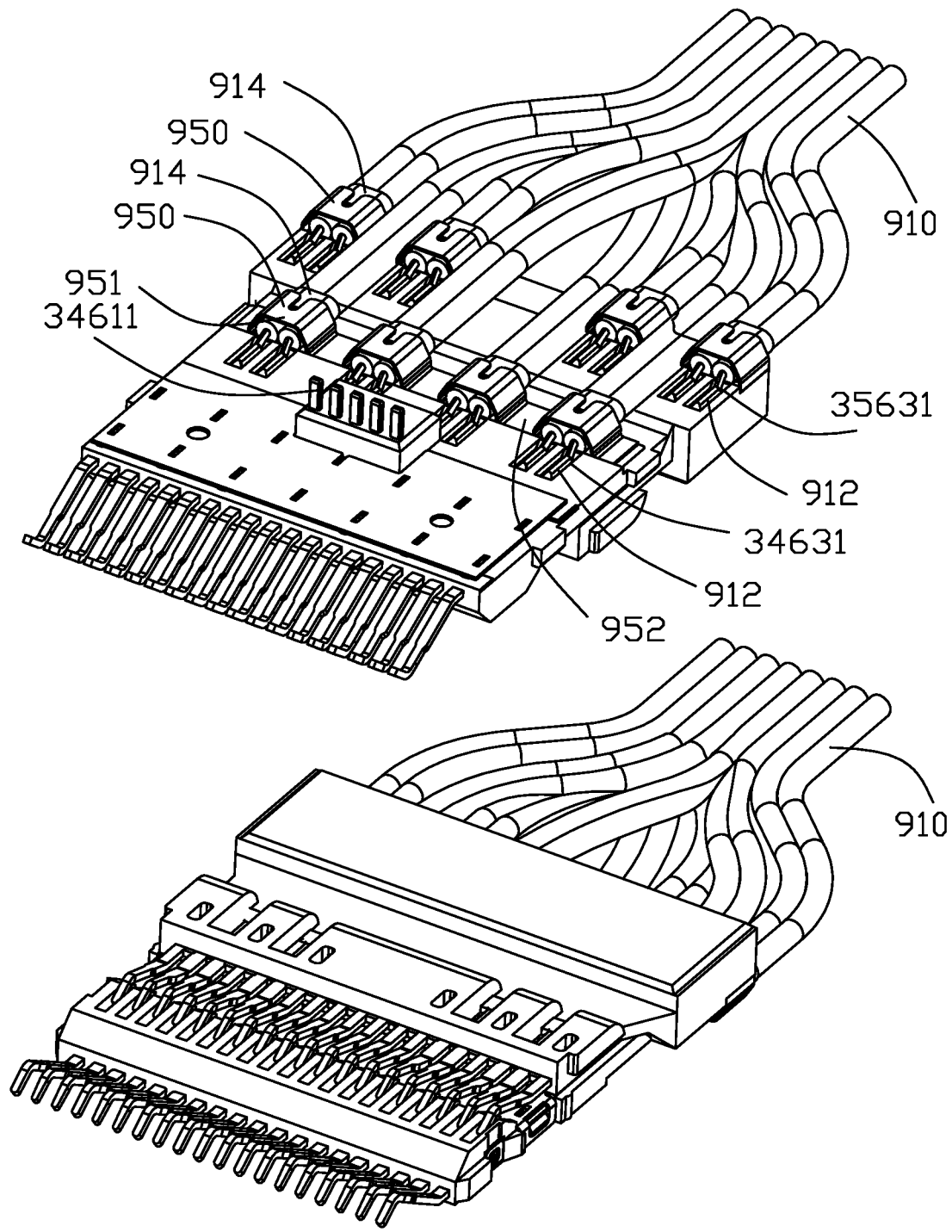
FIG. 23(A) is a partially assembled perspective view of the upper subassembly and the lower subassembly of the contact module with the associated wires of FIGS. 21(A) and 22(A)
Figure 23B:
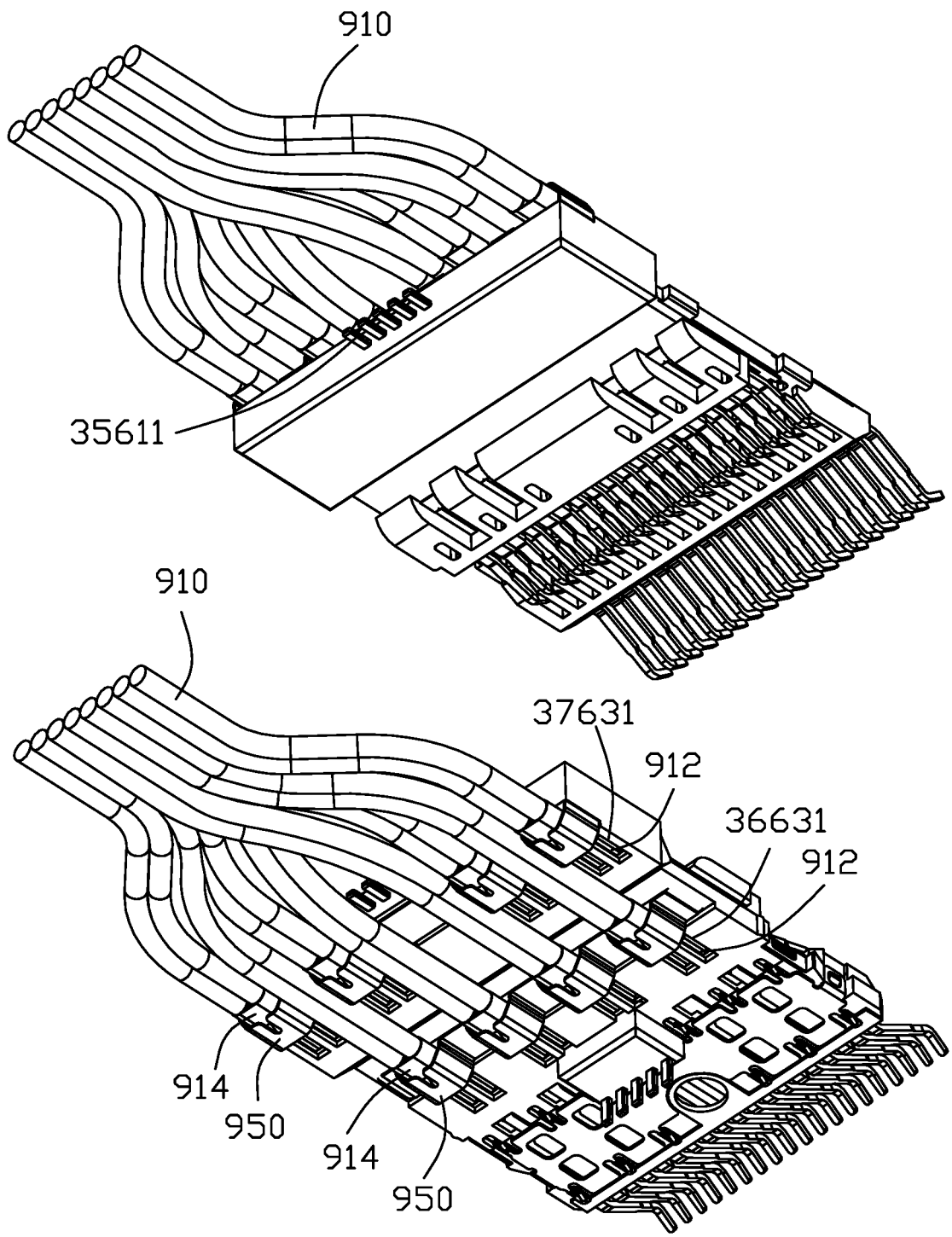
FIG. 23(B) is another partially assembled perspective view of the upper subassembly and the lower subassembly of the contact module with the associated wires of FIGS. 21(B) and 22(B)
Figure 24:
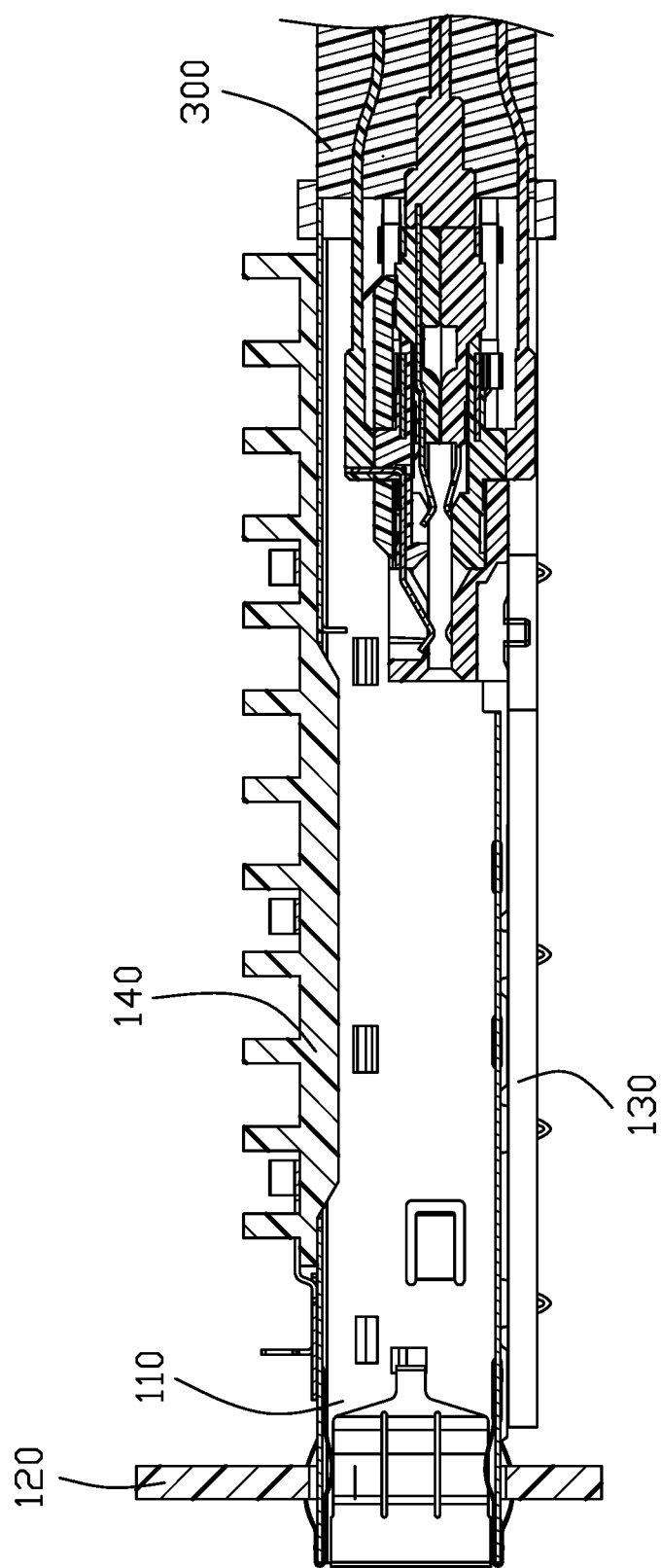
FIG. 24 is a cross-sectional view of the electrical system taken along line 25-25 in FIG. 1.
Figure 25:
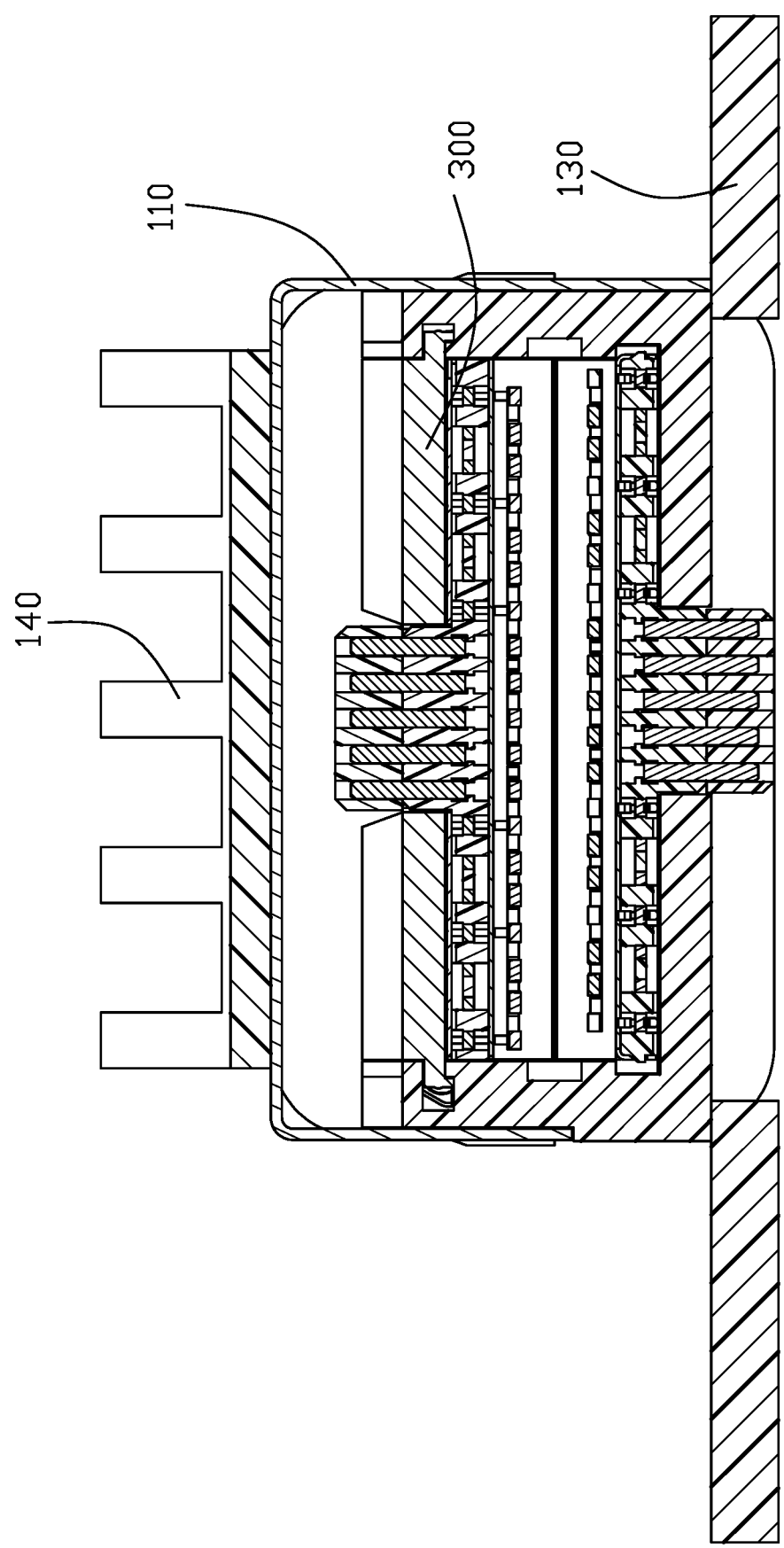
FIG. 25 is another cross-sectional view of the electrical system of FIG. 1.
Figure 26A:
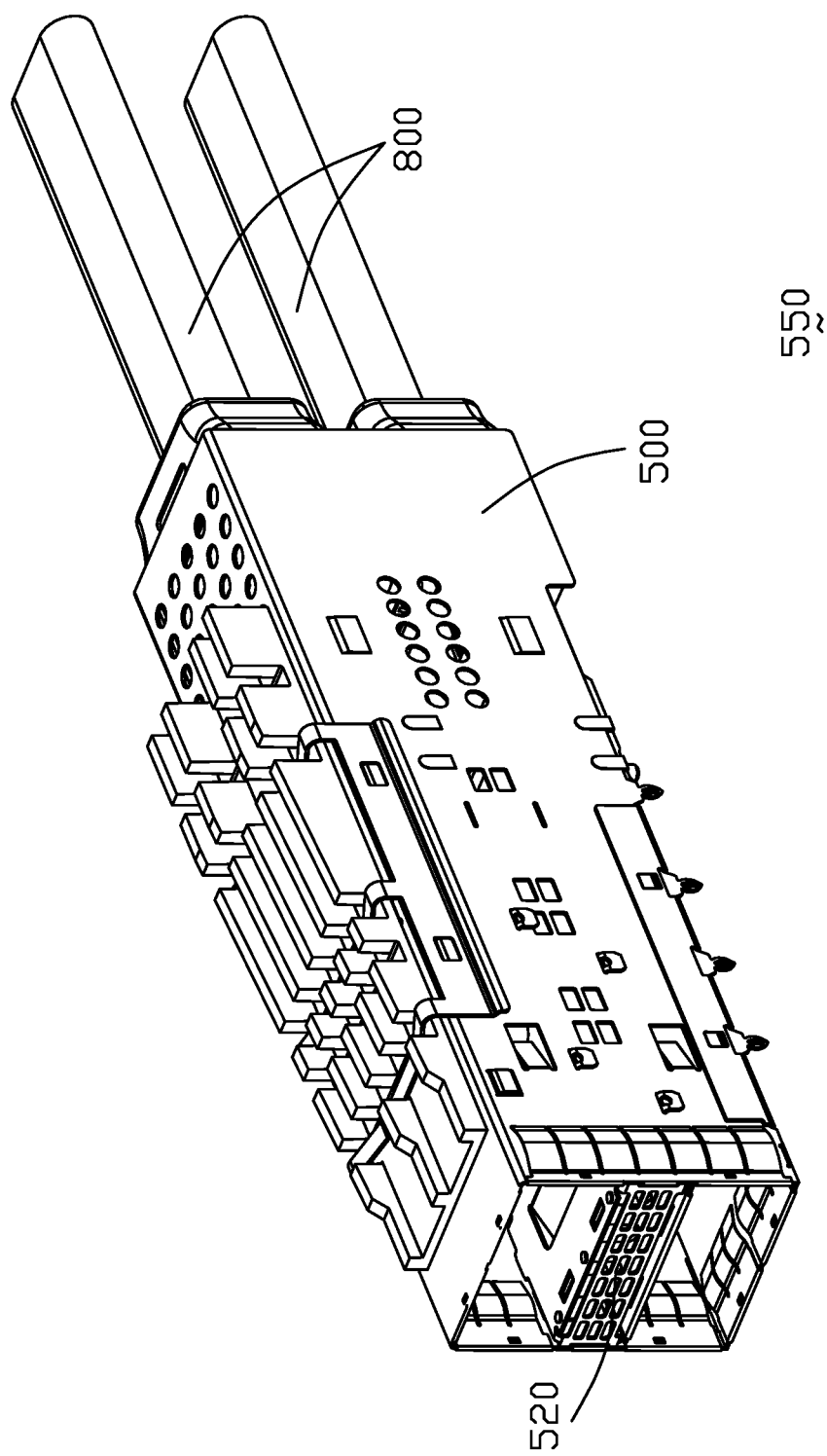
FIG. 26(A) is a perspective view of the dual-port electrical system associate with two cables thereof according to the invention.
Figure 26B:
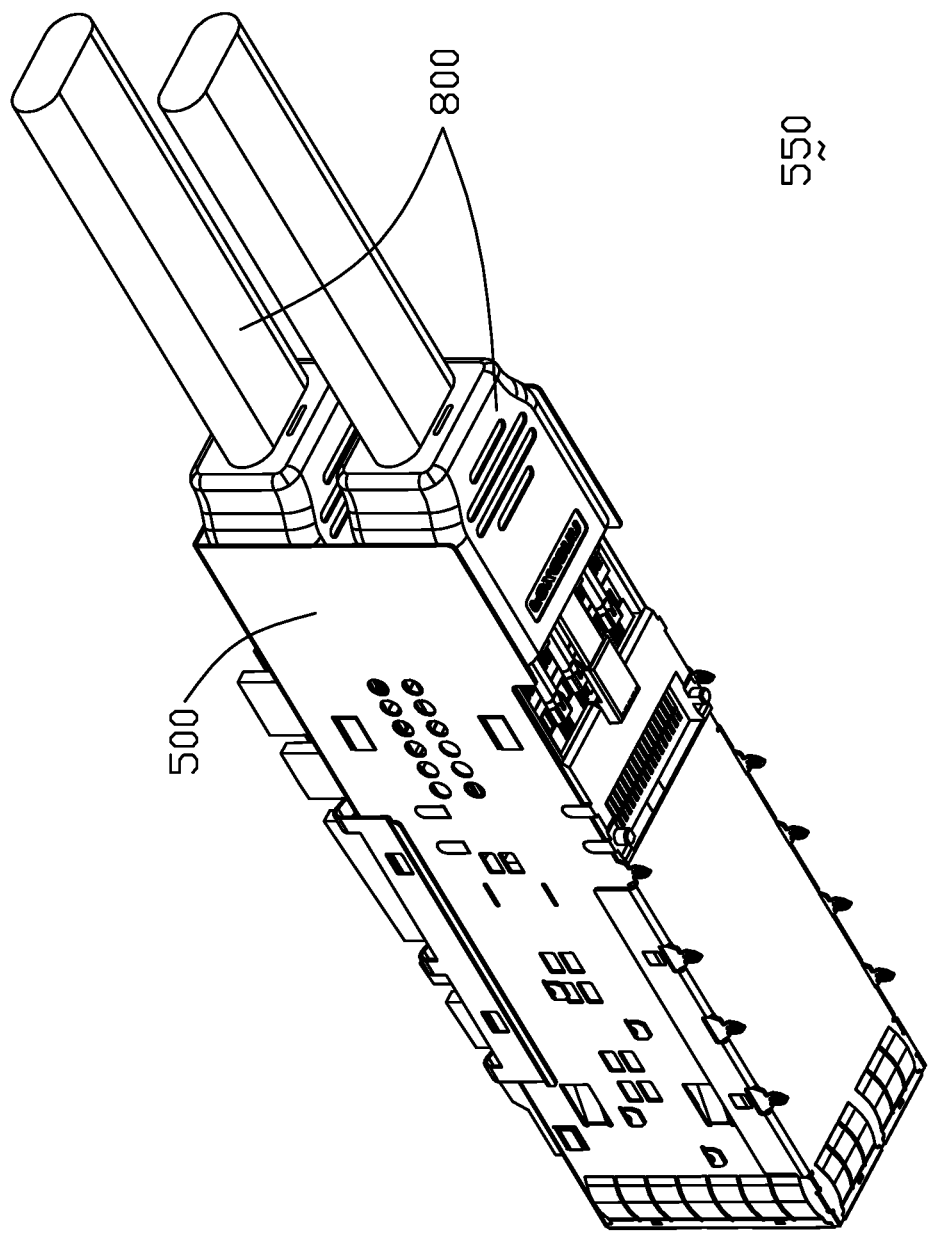
FIG. 26(B) is another perspective view of the dual-port electrical system associated with the two cables of FIG. 26(A)
Figure 27:
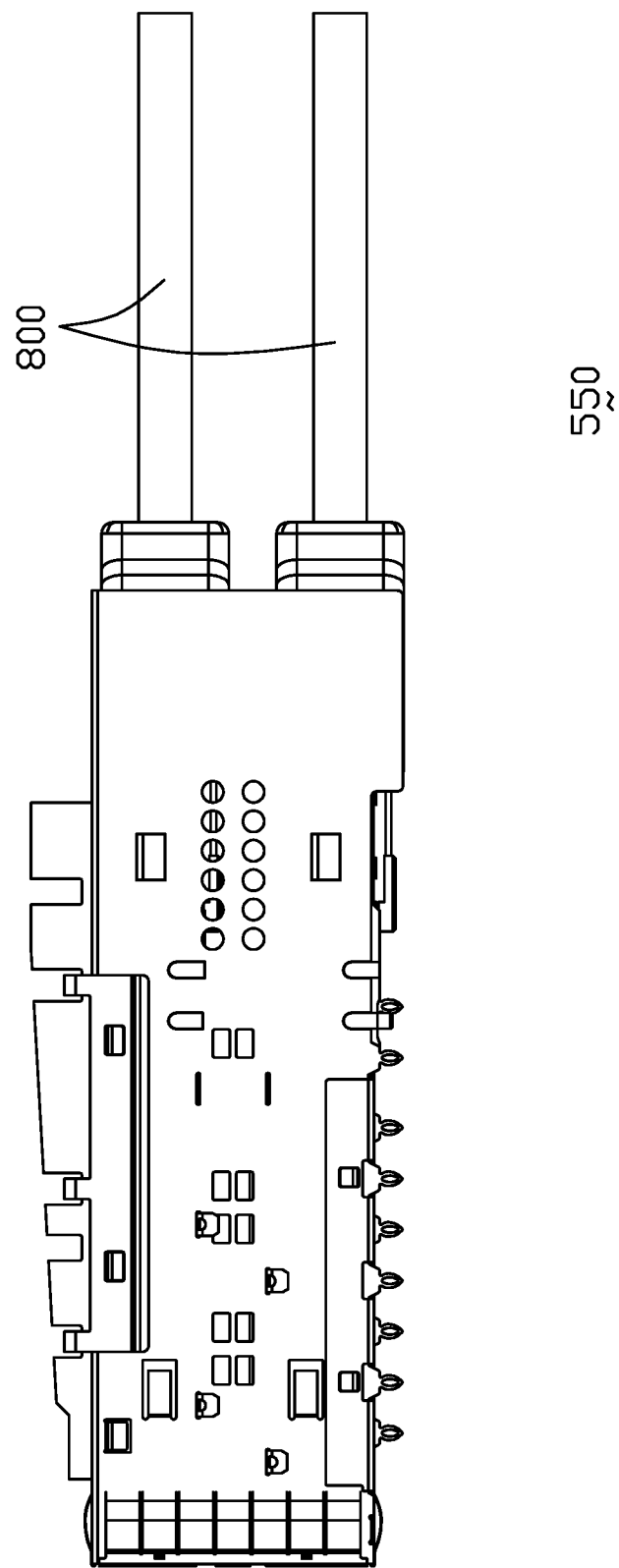
FIG. 27 is a side view of the dual-port electrical system of FIG. 26(A)
Figure 28A:
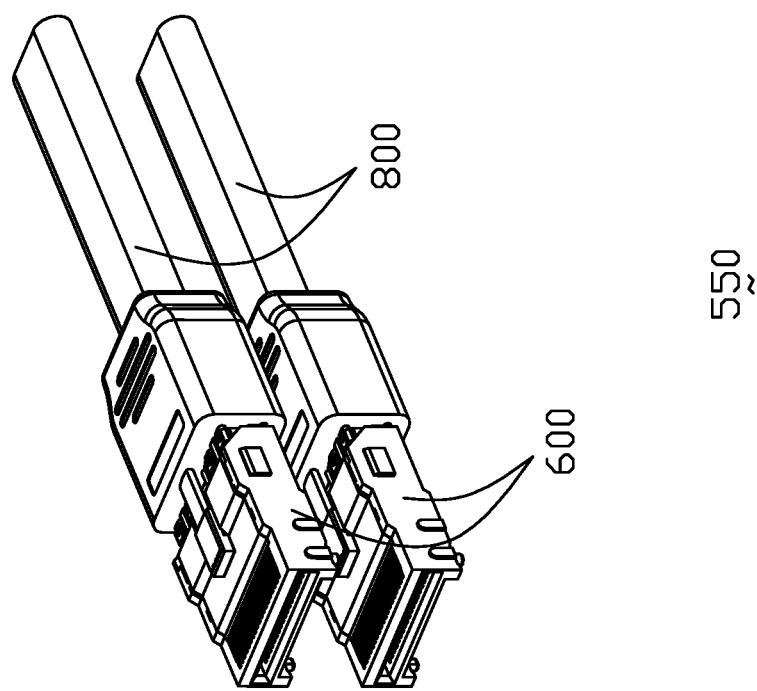
FIG. 28(A) is an exploded perspective view of the dual-port electrical system associated with the two cables of FIG. 26(A)
Figure 28A:
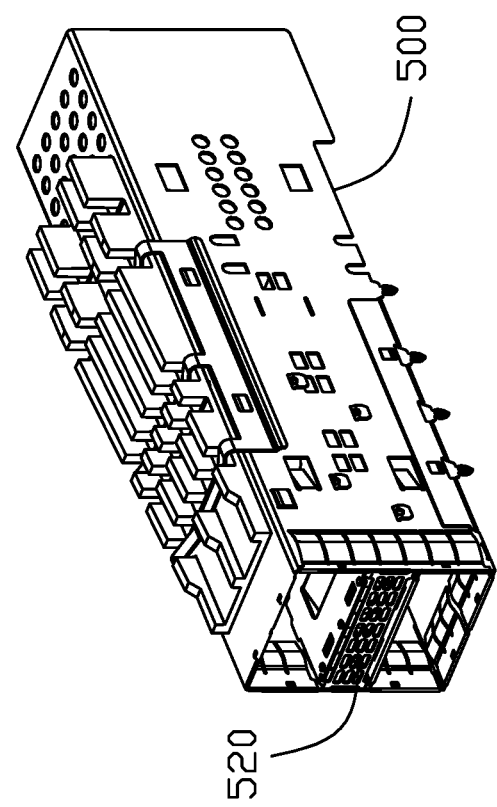
Figure 28B:
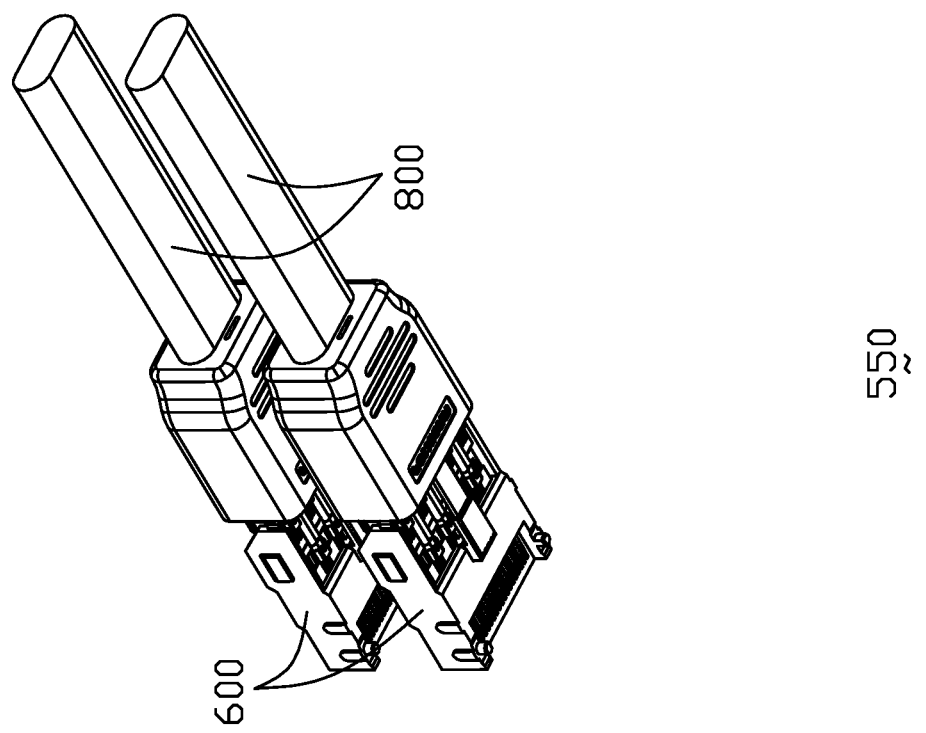
FIG. 28(B) is another exploded perspective view of the dual-port electrical system associated with the two cables of FIG. 28(A)
Figure 28B:
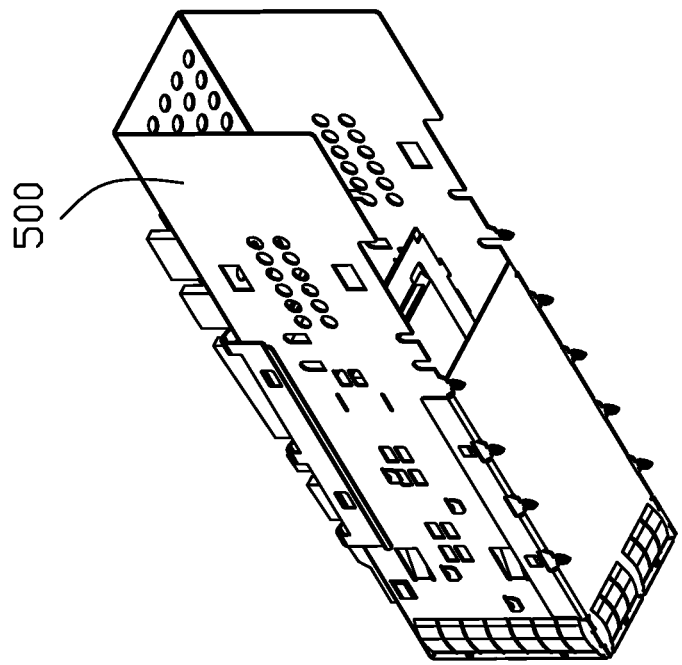
Figure 29:
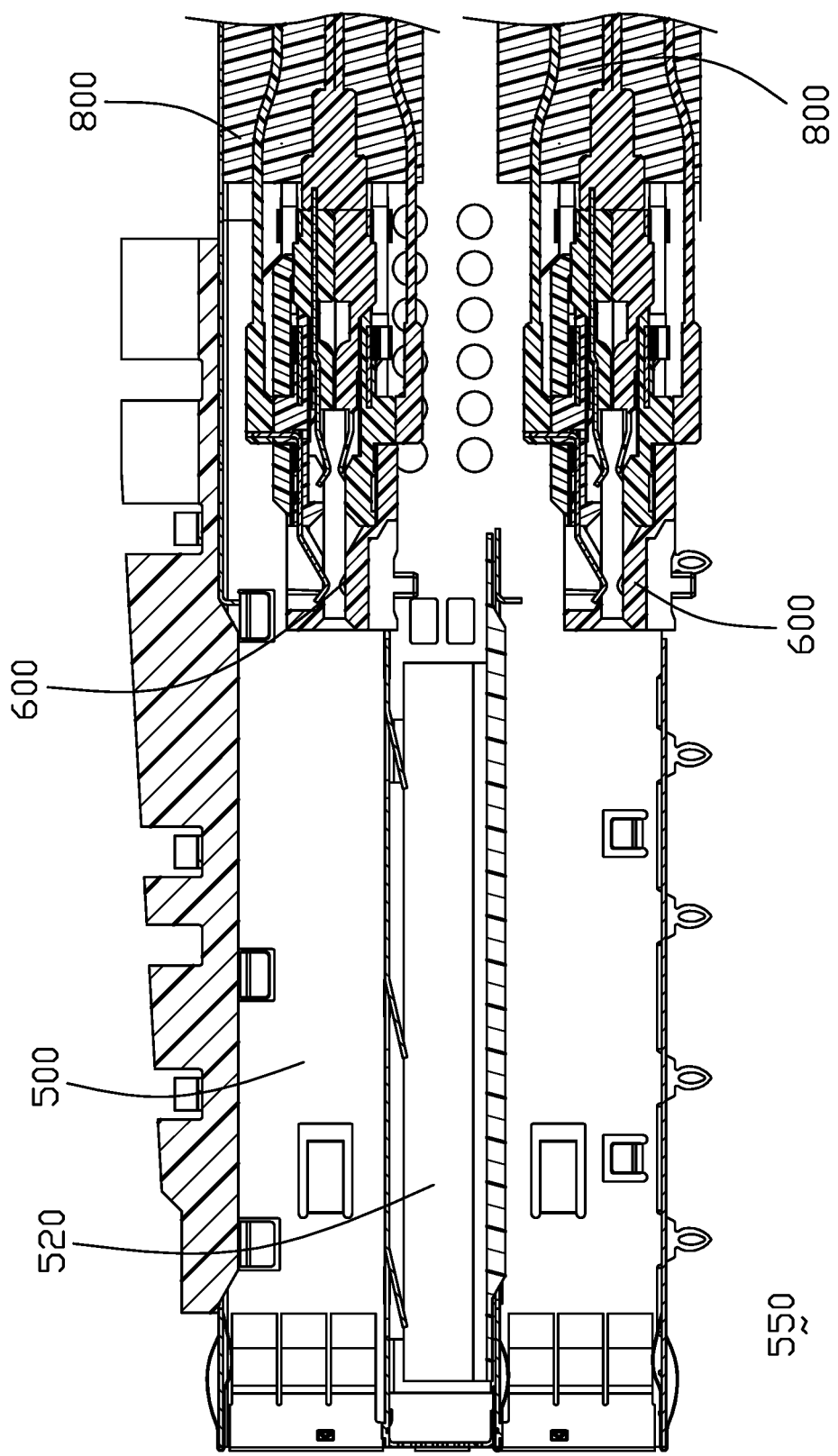
FIG. 29 is a cross-sectional view of the dual-port electrical system associated with the two cables of FIG. 26(A)
Figure 30B:
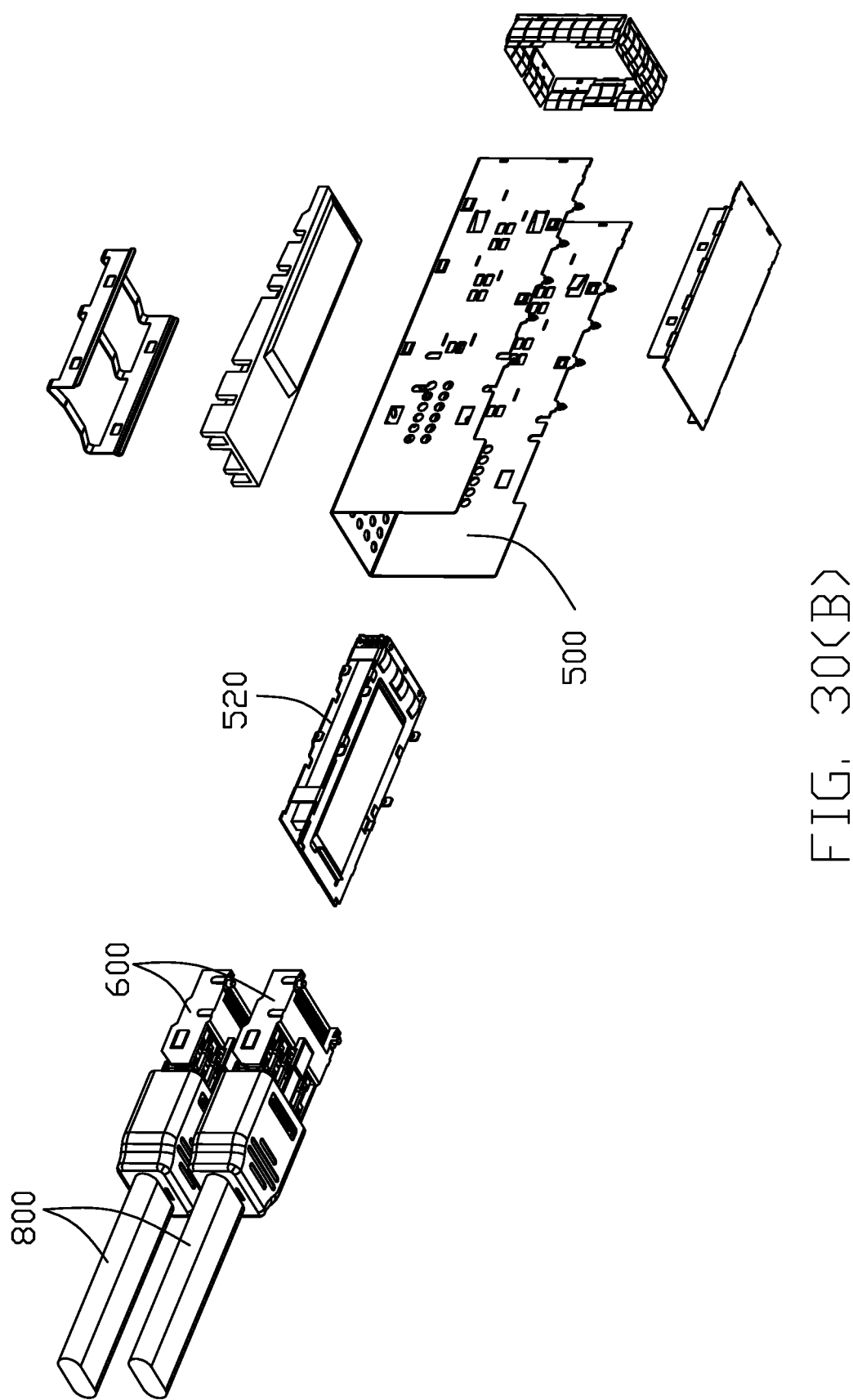
FIG. 30(B) is another exploded perspective view of the dual-port electrical system associated with the two cables of FIG. 30(A).

Notably, both the front/outer wafer 342 and the rear/inner wafer 352 of the upper subassembly 340 are assembled to the housing 320 downwardly via the protrusions 3441 of the front/outer insulator 344 (FIG. 18(A)) engaged within the notches 323 of the housing 320 (FIGS. 11(A) and 12(A)).

Similar to the upper subassembly 340, the lower subassembly 360 includes a front/outer wafer 362 and a rear/inner wafer 372 wherein the front/outer wafer 362 includes an lower front/outer insulator 364 and a plurality of lower front/outer contacts 366 integrally formed within the lower front/outer insulator 364, and the rear/inner wafer 372 includes an lower rear/inner insulator 374 and a plurality of lower rear/inner contacts 376 integrally formed within the lower rear/inner insulator 374. An outer grounding plate 361 and an inner grounding plate 371 are respectively assembled/located on two opposite bottom and top surfaces of the front/outer insulator 364 via locks 3619 and 3719. The front/outer contacts 366 include the low speed signal contacts 3661 at the center region and the high speed differential pair signal contact 3662 and the grounding contacts 3663 alternately arranged with each other on two side regions in the transverse direction wherein the tails/connecting sections 36611 of the low speed signal contacts 3661 extends vertically outwardly while the tails/connecting sections 36621 of the high speed differential pair signal contacts 3662 extend horizontally for surface mounting and the tails/connecting sections 36631 of the grounding contacts 3663 are as well. Notably, all connecting sections 36631 of the grounding contacts 3663 are joined with a common grounding bar 36632 which will be welded or soldered with a corresponding common grounding bracket (illustrated later).

Correspondingly, in the lower subassembly 360, the rear/inner contacts 376 include the low speed signal contacts 3761 at the center region and the high speed differential pair signal contact 3762 and the grounding contacts 3763 alternately arranged with each other on two side regions in the transverse direction wherein the tails/connecting sections 37611 of the low speed signal contacts 3761 extends horizontally outwardly while the tails/connecting sections 37621 of the high speed differential pair signal contacts 3762 extend horizontally for surface mounting and the tails/connecting sections 37631 of the grounding contacts 3763 are as well. Notably, all connecting sections 37631 of the grounding contacts 3763 are joined with a common grounding bar 37632 which will be welded or soldered with a corresponding common grounding bracket (illustrated later).

Understandably, the contacting sections 367 of all the front/outer contacts 366 extending into the receiving cavity 322, are arranged in a front row in the transverse direction, and the contacting sections 377 of all the rear/inner contacts 376 extending into the receiving cavity 322, are arranged in a rear row in the transverse direction behind said front row. Notably, the outer grounding plate 361 located upon the top surface of the front/outer insulator 364, forms a plurality of upwardly extending spring fingers 3611 connecting the corresponding grounding contacts 3663 of the front/outer contacts 366, and the inner grounding plate 371 located between the front/outer insulator 364 and the rear/inner insulator 374, forms a plurality of upwardly extending spring fingers 3711 connecting the corresponding grounding contacts 3763 of the rear/inner contacts 376, and a plurality of downwardly extending spring fingers 3712 connecting the corresponding grounding contacts 3663 of the front/outer contacts 366.

In this embodiment, both the front/outer wafer 362 and rear/inner wafer 372 of the lower subassembly 360 are assembled into the housing 320 forwardly. It should be understood that the contacting sections 367 and 377 of the lower subassembly 360 are not aligned with the corresponding contacting sections 347 and 357 in the vertical direction but being offset transversely, as regulated by QSFP-DD specification.

Further referring to FIGS. 7(A)-11(C) and 21(A)-23(B), the cable 900 includes a plurality of high speed differential pair wires 910 and a plurality of low speed wires 920. The low speed wires 920 are connected to the connecting sections 34611, 35611, 36611 and 37611 of the corresponding low speed signal contacts 3461, 3561, 3661 and 3761 through inner connectors 921. The high speed differential pair wire 910 includes an inner conductor 912 connected to the connecting sections 34631, 35631, 36631, 37631 of the corresponding grounding contacts 3463, 356, 3663 and 3763, and an outer braiding 914 connected to the common grounding bar 34632, 35632, 36632 and 37632 with corresponding common grounding bracket or ground bar 950 which forms a plurality of raised portions 951, and a plurality of recesses or hollow portions 952 between adjacent two raised portions 951 for receiving the corresponding differential pair wires 910 therein.

Referring to FIG. 26(A)-30(B), the same concept can be applied to the dual-port QSFP-DD application wherein in an electrical system 550 an a large sized cage 500 is further equipped with a divider 520 to separate the interior room into two receiving spaces and a pair of receptacle connectors 600 are respectively secured to the cage 500 with the associated cables 800. Understandably, the divider 520 is to provide heat dissipation function for removing heat from the inserted QSFP module plugs (not shown).

The advantages of the invention are as follows:
(1) The "Direct Attach" wire to contact connector will accommodate 4 rows of "Equally Designed" lead-frames in true symmetrical shape and length for better Signal Integrity.
(2) The QSFP-DD "Direct Attach" wire to contact connector system incorporates straight "Horizontal" contact design making it easy to fine tune for Signal Integrity.
(3) The signals pass from the "Direct Attach" wire to contact connector through a "Flyover Cable" to the main board inside the box.
(4) The "Direct Attach" wire to contact connector design uses no PCB, thus eliminating "Trace Loss" in the Board and saves on PCB fabrication costs.
(5) The "Direct Attach" wire offers a large advantage for a 2×1 Stacked Connector, whereas the current industry is having difficulties getting the existing 2×1 design to perform according to Spec.
(6) "Direct Attach" wire to contact connector design offers a large advantage for Thermal Performance especially in a 2×1 solution. The Direct attach connector can be stacked in the cage 2 high and allows for better air "pass thru".
(7) The "Direct Attach" wire to contact connector design can also be used easily in a "belly to belly" solution thus eliminating any challenges in board layout.

The main feature of the invention is to have the QSFP-DD receptacle connector equipped/associated with the cables instead of mounting upon the printed circuit board. The second feature is that the receptacle connector is secured to the chassis rather than to the printed circuit board. The third feature is that the stacked wafers 342 and 352 have the corresponding connecting sections of the high speed differential pair signal contacts are arranged in an offset manner in a transverse direction and in two rows in the front-to-back direction. The fourth feature is that the cables are of the hybrid type including the low speed and the high speed. The fifth feature is that the low speed cable and the high speed cable extend from the same corresponding wafer at different levels. The sixth feature is that all the grounding contacts are unitarily formed with a metallic piece having a common grounding bar on which a common grounding bracket with the regulated/associated braiding of the corresponding wires are welded or soldered. The seventh feature of the invention is that the bottom plate of the cage 110 can extend from the front edge to the rear edge in a complete shielding manner rather than being terminated around the middle region, because no opening is required at the bottom wall around the rear edge to allow the receptacle connector to be mounted upon the printed circuit board. The eighth feature is that the common grounding bar forms not only the recesses to hold the corresponding wires of which the braiding are to be welded or soldered thereon but also the grooves through which the corresponding wires held by another common grounding bar extend, respectively.

What is claimed is:

1. An interconnection system comprising:
   a metallic cage attached to a chassis and forming a receiving space therein; and
   a receptacle connector assembly secured to the cage and received in a rear portion of the receiving space, said receptacle connector comprising:
   an insulative housing;
   a contact module disposed in the housing and including opposite upper subassembly and lower subassembly assemble stacked with each other in a vertical direction, each of said upper subassembly and said lower subassembly including an upper wafer and a lower wafer, each of the upper wafer and the lower wafer including a plurality of contacts including grounding contacts, high speed differential pair contacts and low speed contacts, each of said contacts including a rear connecting section; and
   a plurality of cables comprising high speed cables and low speed cables connected with the connecting sections of the high speed contacts and low speed contacts, respectively.

2. The interconnection system as claimed in claim 1, wherein each of the upper wafer and the lower wafer comprises a front/outer wafer and a rear/inner wafer stacked with each other in the vertical direction.

3. The interconnection system as claimed in claim 2, wherein the rear connecting sections of the front/outer wafer are located in front of those of the rear/inner wafer in a front-to-back direction perpendicular to said vertical direction, and are respectively offset from those of the rear/inner wafer in a transverse direction perpendicular to both said vertical direction and said front-to-back direction.

4. The interconnection system as claimed in claim 2, wherein each of the front/outer wafer and the rear/inner wafer, the grounding contacts are unitarily formed with a commonly grounding bar extending in the transverse direction, and a common grounding bracket grasping outer braiding of the corresponding cables are electrically connected with the grounding bar.

5. An electrical connector comprising:
   an insulative housing;
   a contact module disposed in the housing and including opposite upper subassembly and lower subassembly stacked with each other in a vertical direction, each of said upper subassembly and said lower subassembly including a front/outer wafer and a rear/inner wafer stacked with each other in the vertical direction, each of said front/outer wafer and said rear/inner wafer including a plurality of contacts including grounding contacts, high speed differential pair contacts and low speed contacts, each of said contacts including a rear connecting section, wherein
   the rear connecting sections of the front/outer wafer are located in front of those of the rear/inner wafer in a front-to-back direction perpendicular to said vertical direction, and are respectively offset from those of the rear/inner wafer in a transverse direction perpendicular to both said vertical direction and said front-to-back direction.

6. The electrical connector as claimed in claim 5, further including a plurality of cables having corresponding inner conductors soldered upon the connecting sections of the corresponding electrical contacts, respectively.

7. The electrical connector as claimed in claim 6, wherein in each of the front/outer wafer and the rear/inner wafer, the grounding contacts are unitarily formed with a commonly grounding bar extending in the transverse direction, and a common grounding bracket grasping outer braiding of the corresponding cables are soldered upon the grounding bar.

8. The electrical connector as claimed in claim 6, wherein said cables include high speed cables and low speed cables connected to the connecting sections of the corresponding high speed contacts and low speed contacts at different levels.

9. The electrical connector as claimed in claim 8, wherein in each of the upper subassembly and the lower subassembly, the connecting sections of the corresponding low speed contacts of the front/outer wafer and those of rear/inner wafer are located by two sides of those of both the front/outer wafer and the rear/inner wafer in the vertical direction.

10. The electrical connector as claimed in claim 9, wherein the connecting sections of the corresponding low speed contacts of the front/outer wafer extend in the vertical direction while those of the rear/inner wafer extend in the front-to-back direction.

11. The electrical connector as claimed in claim 8, wherein in each of the upper subassembly and the lower sub assembly, the corresponding high speed cables of the front/outer wafer are alternately arranged with those of the rear/inner wafer in the transverse direction.

12. The electrical connector as claimed in claim 5, wherein the front/outer wafer is equipped with a grounding plate attached upon an outer side thereof to common the corresponding grounding contacts thereof, and the rear/inner wafer is equipped with another grounding plate sandwiched between the front/outer wafer and the rear/inner wafer in the vertical direction to common the corresponding grounding contacts.

13. The electrical connector as claimed in claim 5, wherein in each of said front/outer wafer and said rear/inner wafer, the corresponding high speed differential pair contacts are located by two sides of the corresponding low speed contacts along the transverse direction.

14. The electrical connector as claimed in claim 5, wherein the connecting sections of the low speed contacts protrude outside of the corresponding wafers of the contact module while those of the high speed contacts are not.

15. The electrical connector as claimed in claim 5, wherein the upper subassembly and the lower subassembly are essentially symmetrically arranged with each other in the vertical direction.

16. An electrical connector comprising:
    an insulative housing;
    a contact module disposed in the housing and including opposite upper subassembly and lower subassembly stacked with each other in a vertical direction, each of said upper subassembly and said lower subassembly including a front/outer wafer and a rear/inner wafer stacked with each other in the vertical direction, each of said front/outer wafer and said rear/inner wafer including a plurality of contacts including grounding contacts, high speed differential pair contacts and low speed contacts, each of said contacts including a rear connecting section, wherein a plurality of cables including a plurality of high speed cables and a plurality of cables respectively mechanically and electrically connected to the connecting sections of the corresponding high speed differential pair contacts and those of the low speed contacts; wherein the connecting sections of the low speed contacts of the front/outer wafer of the lower subassembly extend downwardly in the vertical direction while those of the upper subassembly extend upwardly in the vertical direction.

17. The electrical connector as claimed in claim 16, wherein the connecting sections of all contacts, except those of the front/outer wafers, extend rearwardly in a front-to-back direction perpendicular to the vertical direction.

18. The electrical connector as claimed in claim 17, wherein a bottom side of the housing includes mounting posts extending downwardly in the vertical direction.

19. The electrical connector as claimed in claim 18, wherein a cap is mounted upon a top side of the housing to shield the contact module in the vertical direction.

20. The electrical connector as claimed in claim 16, wherein the connecting sections of the low speed contacts protrude outside of the corresponding wafers of the contact module while those of the high speed contacts are not.

* * * * *